United States Patent [19]

Takigawa et al.

[11] Patent Number: 5,659,004

[45] Date of Patent: Aug. 19, 1997

[54] EPOXY RESIN COMPOSITION

[75] Inventors: Yukio Takigawa; Yoshihiro Nakata; Shigeaki Yagi; Norio Sawatari; Nobuo Kamehara, all of Kawasaki, Japan

[73] Assignee: Fujitsu Limited, Kawasaki, Japan

[21] Appl. No.: 389,784

[22] Filed: Feb. 16, 1995

Related U.S. Application Data

[63] Continuation of Ser. No. 227,318, Apr. 13, 1994, abandoned, which is a continuation-in-part of Ser. No. 849,055, Apr. 27, 1992, abandoned, Ser. No. 972,811, Nov. 6, 1992, abandoned, Ser. No. 194,623, Feb. 7, 1994, abandoned, and Ser. No. 115,570, Sep. 3, 1993, abandoned, said Ser. No. 194,623, is a continuation of Ser. No. 64,667, May 21, 1993, abandoned.

[30] Foreign Application Priority Data

| Aug. 27, 1990 | [JP] | Japan | 2-222407 |
| Jul. 10, 1991 | [JP] | Japan | 3-170161 |
| Aug. 27, 1991 | [WO] | WIPO | PCT/JP91/01134 |
| Nov. 11, 1991 | [JP] | Japan | 3-294278 |
| May 21, 1992 | [JP] | Japan | 4-128883 |
| Sep. 8, 1992 | [JP] | Japan | 4-239638 |
| Jun. 4, 1993 | [JP] | Japan | 5-134683 |

[51] Int. Cl.[6] .................. C08G 8/28; C08L 63/00
[52] U.S. Cl. .................. 528/101; 523/443; 523/466; 525/109; 525/476; 525/481; 525/482; 525/484; 525/502
[58] Field of Search .................. 523/443, 466; 525/481, 482, 484, 502, 109, 476; 528/101

[56] References Cited

U.S. PATENT DOCUMENTS

| 4,131,632 | 12/1978 | Suzuki | 260/834 |
| 4,390,664 | 6/1983 | Kanayama | 525/117 |
| 4,687,832 | 8/1987 | Ehara et al. | 528/97 |
| 4,978,810 | 12/1990 | Kanayama et al. | 568/720 |
| 5,001,174 | 3/1991 | Yanagisawa et al. | 523/443 |
| 5,077,375 | 12/1991 | Saito et al. | 525/507 |
| 5,087,766 | 2/1992 | Kanayama et al. | 568/718 |

FOREIGN PATENT DOCUMENTS 63-251419  10/1988  Japan .

*Primary Examiner*—Frederick Krass
*Attorney, Agent, or Firm*—Staas & Halsey

[57] ABSTRACT

An epoxy resin composition contains an epoxy resin as a substratal resin and incorporates therein a polyallylphenol curing agent. The composition may also contain a polyphenol compound. The epoxy resin may have a naphthalene skeleton. The epoxy resin composition may also include a blend of two or more epoxy resins.

19 Claims, 28 Drawing Sheets

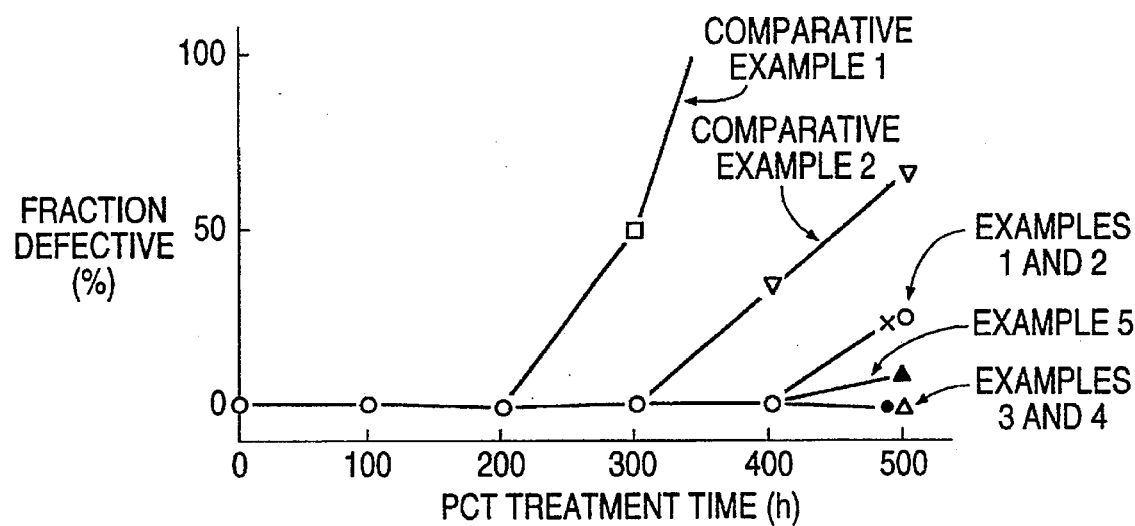
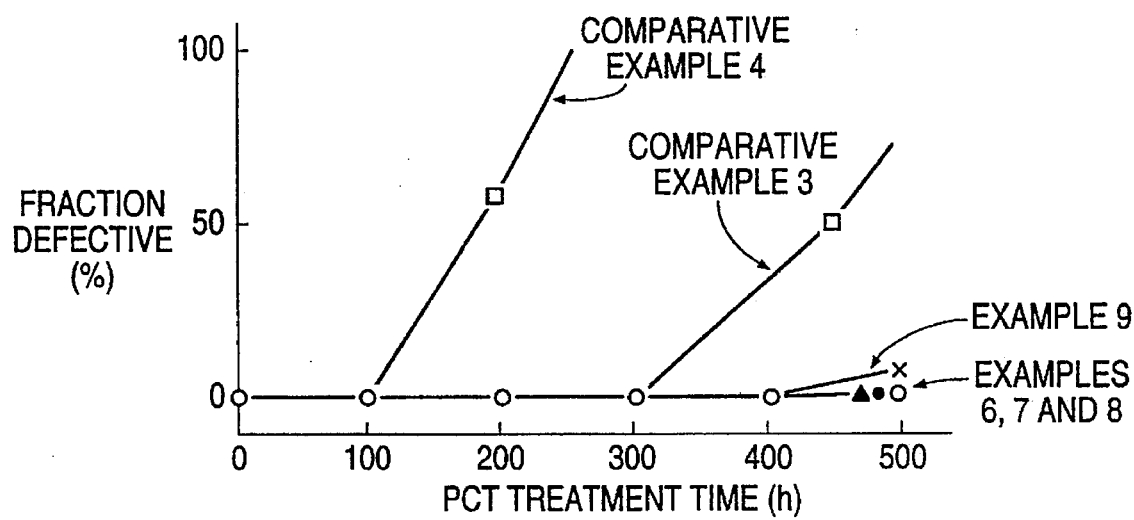

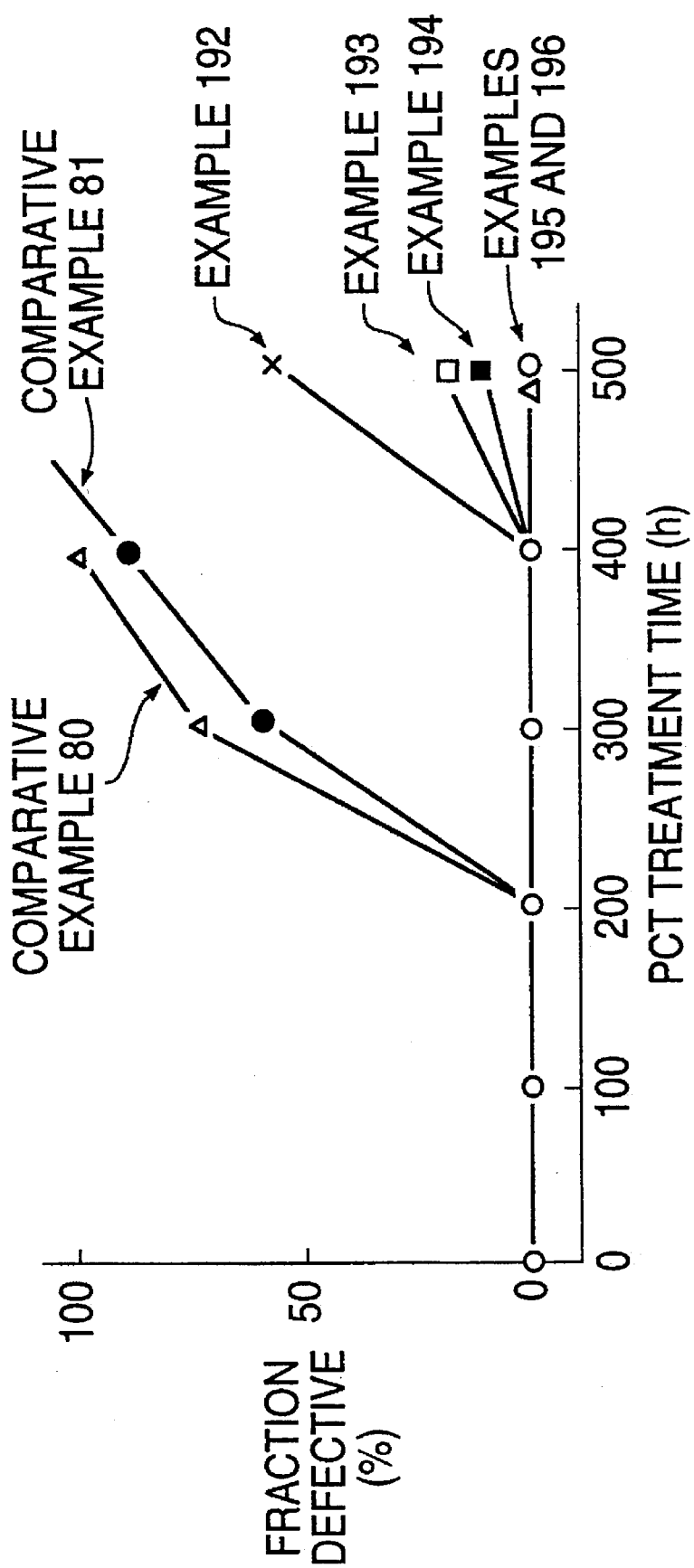

EPOXY RESIN COMPOSITION

CROSS-REFERENCES TO RELATED APPLICATIONS

This application is a continuation of application Ser. No. 08/227,318, filed Apr. 13, 1994, now abandoned, which is a continuation-in-part of prior applications Ser. No. 07/849,055, filed Apr. 27, 1992, Ser. No. 07/972,811, filed Nov. 6, 1992, Ser. No. 08/194,623, filed Feb. 7, 1994 and Ser. No. 08/115,570, filed Sep. 3, 1993, all abandoned. Application Ser. No. 08/194,623 is a file wrapper continuation of prior application Ser. No. 08/064,667, filed May 21, 1993, now abandoned. The present applications and the identified prior applications are commonly owned. The entirety of the subject matter of each of said prior applications is hereby specifically incorporated herein by reference.

TECHNICAL FIELD

This invention relates to epoxy resin compositions. More particularly, this invention relates to epoxy resin compositions containing an epoxy resin as a substratal resin (main component). Further, this invention relates to epoxy resin compositions having excellent heat resistance, toughness, flexibility, resistance to cracking, mold releasability, hydrophobicity and curability. Since the epoxy resin compositions of this invention possesses the outstanding properties as described above, such compositions can be utilized advantageously in various fields, particularly in the fields of multilayer laminates, electroconductive pastes, protective films for electronic devices, adhesive agents, paints, coating materials, sealing materials, and molding materials.

BACKGROUND ART

Recently electronic and electric devices and transportation devices are becoming smaller and lighter in weight and have an increased performance, and this trend has emphasized the need for materials having an excellent heat resistance and moisture resistance.

Polyimide resins are universally known, as heat resistant resins, but since such resins are produced by a dehydration-condensation type reaction, the produced cured resin is liable to contain voids due to the water of condensation that occurs as a consequence of the reaction. These voids impair the reliability of the cured resin product. The polyimide itself is insoluble and unmeltable, and therefore, is not easily molded.

As polyimides having an improved moldability, such maleimide resins as bismaleimide and polymaleimide are known in the art. Bismaleimide, however, has a high melting point and therefore, has the disadvantage of a poor workability because the curing during the process of molding requires a protracted application of a high temperature generally exceeding 200° C. (180° to 350° C. and 15 to 16 minutes). Bismaleimide is further disadvantageous in that it has a poor hydrophobicity and consequently, has a conspicuously poor reliability of the cured resin product. Polymaleimide has a curing temperature about 70° to 80° C. lower than that of bismaleimide, but the cured product of the polymaleimide has a disadvantage in that it is easily cracked and embrittled because of a high cross-link density and large residual strain.

The practice of using an epoxy resin having an excellent moldability, in the place of the maleimide resin, is also known in the art. Where the epoxy resin is used as a substratal resin, an amine, an acid anhydride, or a phenol is generally used in combination with the epoxy resin as a curing agent therefore, but the cured product obtained has an unsatisfactory heatproofing. The epoxy/phenol cure system, for example, has a glass transition point generally of from 140° to 170° C., and this glass transition point should be raised to a level above 190° C., preferably above 200° C.

SUMMARY OF THE INVENTION

A major object of this invention is to overcome the drawbacks of the prior art described above, and for this purpose, to provide an epoxy resin composition having an excellent heatproofing, toughness, flexibility, cracking resistance, mold releasability, and hydrophobicity, and consequently, advantageously usable in various fields.

The objects described above may be accomplished by using an epoxy resin composition containing an epoxy resin as a substratal resin, characterized by incorporating therein as a curing agent in an amount of from 30 to 120 parts by weight based on 100 parts by weight of the epoxy resin, a polyallyl phenol possessing in the molecular unit thereof a plurality of component units represented by the following formula I:

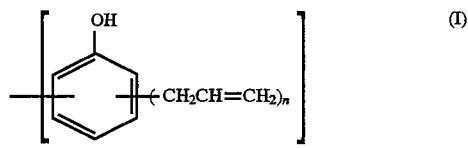

(wherein a is an integer of from 1 to 4 inclusive).

For accomplishing the above-mentioned objects, the present invention also provides an epoxy resin composition comprising an epoxy resin as a substratal resin, 5 to 200 parts by weight, based on 100 parts by weight of the epoxy resin, of a polyallylphenol having a plurality of constitutive units represented by the following formula II:

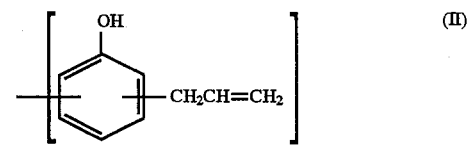

and 5 to 200 parts by weight, based on 100 parts by weight of the epoxy resin, of a polyphenol represented by the following formula III:

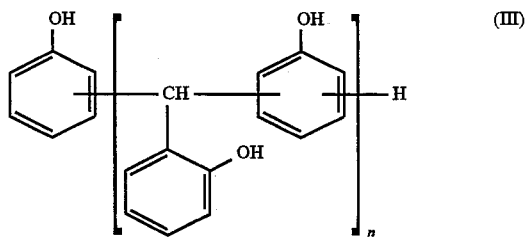

wherein n is an integer of 1 to 6.

The epoxy resin composition according to a further aspect of the present invention, may comprise 100 parts of an epoxy resin having a naphthalene skeleton and 30 to 120 parts of a polyallylphenol having in its repeating unit a plurality of constitutive units represented by the following formula IV:

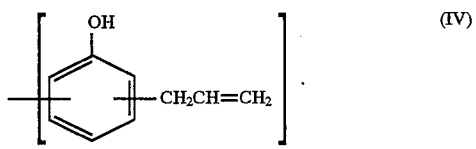

The epoxy resin composition according to, yet another aspect of the present invention, may comprise 100 parts of an epoxy resin having a naphthalene skeleton, 30 to 120 parts of polyallylphenol having in its repeating unit a plurality of constitutive units represented by the following formula V and 5 to 80 parts of a flexibilizer:

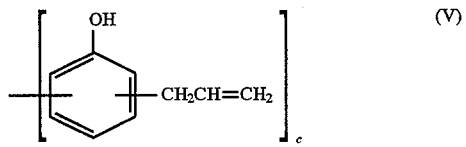

That is, the above-described objects of the present invention can be attained by providing an epoxy resin composition comprising an epoxy resin having a naphthalene skeleton and, incorporated therein, a predetermined amount of polyallylphenol as a curing agent, or an epoxy resin composition comprising the above-described composition and, further incorporated therein as a third component, a predetermined amount of a flexibilizer.

According to the present invention, the objects described above may also be accomplished by using an epoxy resin having a biphenyl structure as a base resin and a polyallylphenol represented by the following general formula VI as a curing agent, the resin containing a specific epoxy resin represented by the following general formula VII:

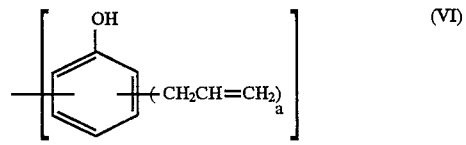

wherein a is an integer of 1 to 4;

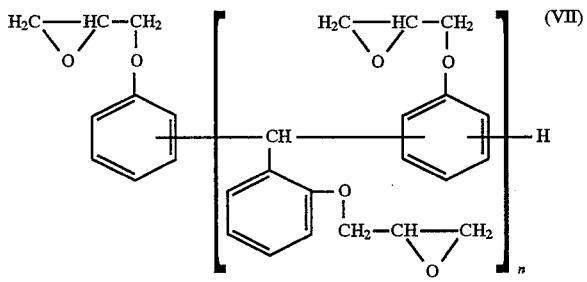

wherein n is an integer of 0 to 4.

BRIEF DESCRIPTION OF THE DRAWINGS

FIGS. 1 to 8 are graphs showing the relationship between the time of PCT treatment (h) and the fraction defective (%) obtained in a relevant working example;

FIG. 40 is a graph showing the relationship between the PCT time (hr) and the fraction defective (%).

DESCRIPTION OF PREFERRED EMBODIMENTS

Figure 3:
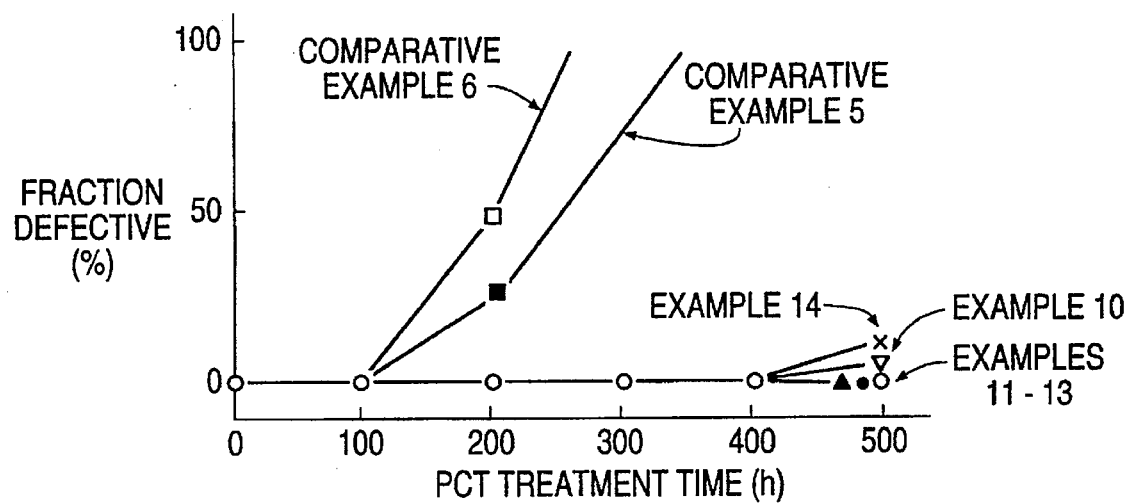

The epoxy resin to be used as the substratal resin in epoxy resin composition of this invention is not particularly limited. According to the knowledge acquired by the inventors, the epoxy resins advantageously usable herein include bisphenol A type epoxy resins, cresol novolak type epoxy resins, phenol novolak type epoxy resins, and tetramethyl biphenyl type epoxy resins such as glycidyl ether type epoxy resins, glycidyl amine type epoxy resins, halogenated epoxy resins, and naphthalene type epoxy resins, for example, which have at least two epoxy groups in the molecular unit thereof. These epoxy resins may be used either independently or in the form of a mixture of two or more members.

Biphenyl type epoxy resins are also advantageously usable as the epoxy resins composition. Desirable concrete examples of such epoxy resins include those disclosed in Japanese Unexamined Patent Publication No. 251,419/1988, i.e., the polymers of 4,4'-bis(2,3-epoxypropoxy)biphenyl; 4,4'-bis(2,3-epoxypropoxy)-3,3',5,5'-tetramethyl biphenyl; 4,4'-bis(2,3-epoxypropoxy)-3,3',5,5'-tetramethyl-2-chlorobiphenyl; 4,4'-bis(2,3-epoxypropoxy)-3,3',5,5-tetramethyl-2-bromobiphenyl; 4,4'-bis(2,3-epoxypropoxy-3,3',5,5'-tetraetnylbiphenyl; and 4,4'-bis(2,3-epoxypropoxy)-3,3',5,5'-tetrabutylbiphenyl. These epoxy resins are available commercially. The product of Yuka-Shell Epoxy K.K. marketed under the product name "YX-4000H" is one example.

The polyallyl phenols advantageously usable as the curing agent in the epoxy resin composition of this invention are represented by the following formulas VIII, IX, X, and XI:

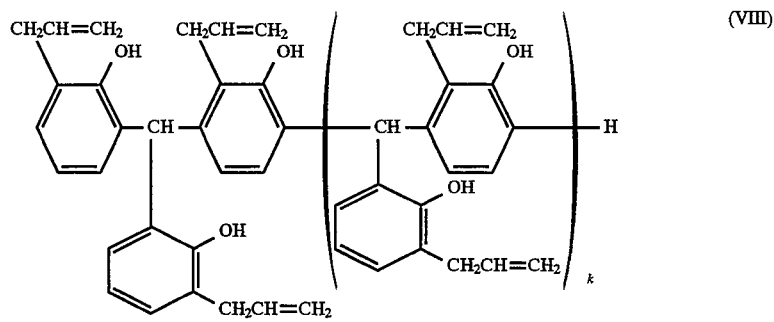

(VIII)

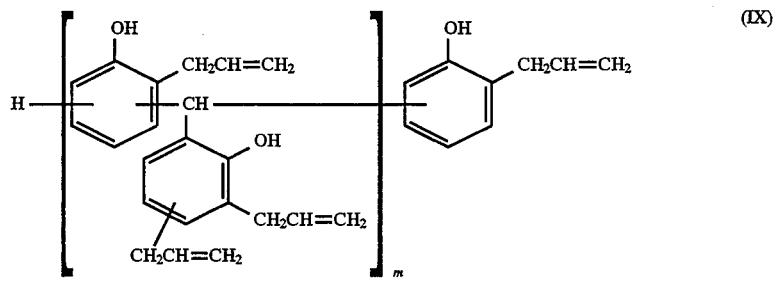

(IX)

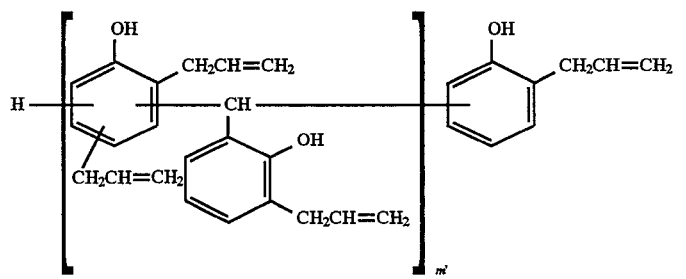

(X)

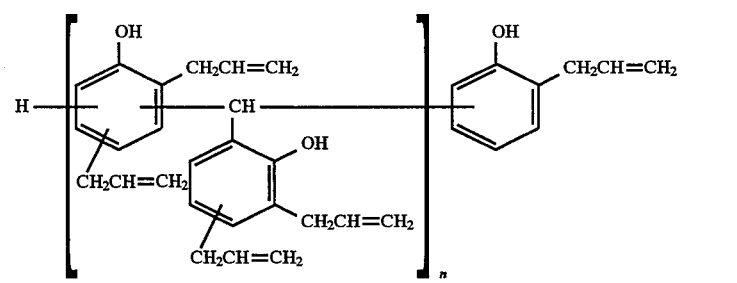

(XI)

(wherein k is 0 or an integer of 1 to 4 inclusive, m and m' each are an integer of 1 to 4 inclusive, and n is an integer of 1 to 4 inclusive). Here, it is understood that these polyallyl phenols have a better viscosity, workability, and improved heatproofing in proportion to an increase in the numerical values of l, m, and n in the formulas. These polyallyl phenols may be synthesized by a known method, or may be produced commercially. The product of Mitsubishi Petro-Chemical Co., Ltd. marketed under product name of "SH-150AR" is one example.

By the use of a polyallyl phenol as the curing agent, the epoxy resin composition enables the cured resin product thereof to acquire an elected glass transition point of from 180° to 220° C., an improved heatproofing, and an augmented hydrophobicity. The merits are ascribable to the effects of the allyl group possessed by the polyallyl phenol. The amount of the polyallyl phenol to be incorporated in the epoxy resin composition is preferably from about 30 to about 120 parts by weight, based on 100 parts by weight of the epoxy resin. If the amount of the polyallyl phenol to be incorporated is less than 30 parts by weight, the curing reaction of the epoxy resin composition does not proceed sufficiently. If this amount exceeds 120 parts by weight, the cured resin product has a poor heatproofing.

In this invention, for the purpose of conferring flexibility on the cured resin product of the epoxy resin composition, it is desirable for the epoxy resin composition to be used in combination with a flexible-imparting agent which is selected from the group consisting of butadiene/acrylonitrile copolymer, polystyrene/polybutadiene/polystyrene terminal block copolymer, ethylene/propylene type terpolymers, ethylene/α-olefin copolymers, and epoxy group-containing silicone rubber powder.

It has been found that the addition of-the silicon-modified epoxy resin to the substratal resin is effective in improving the cured resin product simultaneously in the properties of a resistance to against cracking, flexibility, and mold releasability, and in improving the epoxy resin composition itself from the new point of heatproofing and waterproofing, compared with the ordinary epoxy resin composition. Silicon-modified epoxy resins of varying forms are usable for this purpose. A resin available from Dai-Nippon Ink &

Chemicals, Inc. marketed under product code of "SIN-620" can be advantageously used, for example. This silicon-modified epoxy resin can be used in a varying amount in the epoxy resin composition, depending on the effect desired from the addition thereof. Although this amount is variable in a wide range, it is generally approximately from 5 to 80 parts by weight, based on 100 parts by weight of the epoxy resin. The reason for this particular range, as specifically demonstrated in the working examples to be cited hereinbelow, is that the effect of the addition is not manifested if this amount is less than 5 parts by weight and the heatproofing of the resin composition is impaired by a layer separation if the amount exceeds 80 parts by weight.

Imparting a satisfactory flexibility to the cured resin product can be attained by the addition of the silicon-modified epoxy resin. When the flexibility so imparted by the added silicon-modified epoxy resin is not sufficient, it can be improved by the additional use of a butadiene/acrylonitrile copolymer. The butadiene/acrylonitrile copolymer useful for this purpose is represented by the following formula:

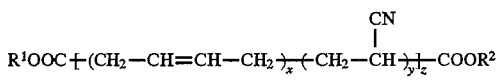

(wherein $R^1$ and $R^2$ each stand for a hydrogen atom or a hydrocarbon group such as alkyl group or aryl group, x and y stand for numerical values satisfying the expression $1 \leq x/y \leq 20$, and z stands for an integer of from 5 to 20 inclusive).

Although the amount of the butadiene/acrylonitrile copolymer to be added is variable over a wide range, it is generally approximately from 5 to 80 parts by weight, based on 100 parts by weight of the epoxy resin in the epoxy resin composition. The reason for this particular range is that the effect of the addition is not manifested if the amount is less than 5 parts by weight and the epoxy resin composition has a poor heatproofing if the amount exceeds 80 parts by weight.

A polystyrene/polybutadiene/polystyrene terminal block copolymer, an ethylene/propylene type terpolymer, an ethylene/α-olefin copolymer, or a silicone rubber powder containing an epoxy group as a functional group may be added, when necessary for an improvement of the flexibility.

These flexibility-imparting agents may possess various structures, and are marketed in various forms. The product of Shell Chemical K.K. marketed under the trademark of "Kraton® G-1652" is available as a polystyrene/polybutadiene/polystyrene terminal block copolymer, the product of Japan Synthetic Rubber Co., Ltd. marketed under a product name of "JSR57P" as an ethylene/propylene type terpolmyer, the product of Mitsui Petrochemical Industries, Ltd. marketed under the trademark of "Tafmer®-P P-0280" as an ethylene/α-olefin copolymer, and the product of Toray-Dow Corning K.K. marketed under the trademark of "Torayfil E-601" as a silicone-rubber powder containing an epoxy group as a functional group, for example. These copolymers are effective in improving the toughness and flexibility of the cured resin product, and thus the resistance to cracking.

In the epoxy resin composition, the copolymer can be used in a varying amount depending on the effect desired to be derived from its addition. Although this amount is variable in a wide range, it is generally desired to be approximately from 5 to 80 parts by weight, based on 100 parts by weight of the epoxy resin. The reason for this particular range, as demonstrated in the working examples to be cited hereinbelow, is that the effect of the addition is not manifested if the amount is less than 5 parts by weight and the cured resin product has a poor heat-proofing if the amount exceeds 80 parts by weight.

The epoxy resin composition of this invention may contain therein a powdery inorganic component (such as, for example, fused silica, crystalline silica, alumina, and calcium carbonate) as a filler in an amount of approximately from 30 to 80% by weight, based on the total amount of the composition. This inorganic filler fails to manifest the effect of its addition if this amount is less than 30% by weight. Conversely, if this amount exceeds 85% by weight, the epoxy resin composition has a poor flowability, and consequently, workability.

Further, the epoxy resin composition according to this invention may incorporate therein the following components when necessary.

(1) A catalyst for promoting the curing reaction of epoxy resin with polyallyl phenol. The agents usable effectively herein include imidazole type compounds represented by 2-methyl imidazole, phosphine type compounds represented by triphenyl phosphine, and DBU (diazabicycloundecene) type compounds represented by phenol salts of DBU, for example.

(2) A coupling agent for enhancing the compatibility of the inorganic filler with the resin during the addition of the filler to the resin. The fillers effectively usable herein include silane type coupling agents represented by 3-aminopropyltriethoxy silane and titanium type coupling agents represented by tetraoctyl bis(phosphite) titanate, for example. Although the amount of the coupling agent is variable with the kind, amount, and specific surface area of the inorganic filler to be used and the minimum covering area of the coupling agent, it is desired to be approximately from 0.1 to 15 parts by weight in this invention.

(3) A mold release auxiliary agent selected from carnauba wax, stearic acid and metal salts thereof, montan wax, etc., a flame-retarding agent selected from among epoxy bromide resin, antimony trioxide, etc., and pigment such as carbon may be added.

(4) A coloring agent, a pigment, and a flame-retarding agent represented respectively by titanium dioxide, carbon black, and antimony trioxide may be incorporated.

The epoxy resin composition of this invention can be prepared by having the components mentioned above kneaded at a temperature of approximately from 60° to 120° C. by the use of a roll kneader or an extruder, for example. Further in this invention, the shaped article obtained by molding and curing the epoxy resin composition is desired to be given an aftercuring treatment for completing the curing reaction of the epoxy resin still proceeding in the cured resin product. The aftercuring treatment subsequent to the step of molding can be carried out by heat-treating the cured resin product for a prescribed time in a constant temperature bath kept at a temperature substantially equaling the temperature used in the molding treatment.

In the epoxy resin composition of this invention, the polyallyl phenol used as a curing agent acts on the epoxy resin used as a substratal resin effectively improving the heatproofing and hydrophobicity of the cured resin product, and in the presence of the specific silicon-modified resin, one member selected from among silicon-modified epoxy resin, butadiene-acrylonitrile copolymer, polystyrene/polybutadiene/polystyrene terminal block copolymer, ethylene/propylene type rubber, ethylene/α-olefin copolymers, and silicone rubber powder containing an epoxy group as a functional group and intended as a flexibility-imparting agent effectively functions as an agent for enhancing the cracking resistance and mold releasability. Thus, these additives simultaneously improve the flame-retarding property, flexibility, mold releasability, and cracking resistance. Further, the addition of the inorganic filler enhances the mechanical strength.

Now, this invention will be described more specifically with reference to working examples and comparative examples. Wherever "parts" is mentioned in the following examples, it will be construed as referring to "parts by weight" unless otherwise specified.

Examples 1 to 9 and Comparative Examples 1 to 4

The experiments covered herein represent cases using an epoxy resin composition comprising an epoxy resin, a polyallyl phenol, and a silicon-modified epoxy resin.

The following raw materials were used in these experiments:

Epoxy resin: A cresol novolak type epoxy resin (produced by Nippon Kayaku Co., Ltd. and marketed under product code of "EOCN-1025")

Polyallyl phenol: A product of Mitsubishi Petro-Chemical Co., Ltd. marketed under product code of "SH-150AR"

Silicon-modified epoxy resin: A product of Dai-Nippon Ink & Chemicals, Inc. marketed under product code of "SIN-620"

Moistureproofness: This property was determined by subjecting a given sample to a PCT (pressure cooker test) treatment at 125° C. under 2.3 atmospheres by the use of an aluminum-wired model device illustrated in FIG. 9 and testing the wire for electric resistance.

Figure 9:
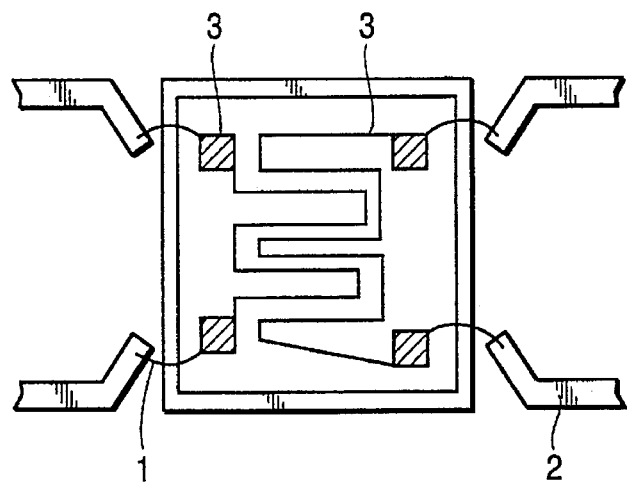
FIG. 9 is a schematic diagram of an aluminum-wired model device used for evaluation of moistureproofing.

In FIG. 9, 1 stands for a gold wire, 2 for a lead, and 3 for an aluminum electrode. In the test, the circuit width and the circuit interval were respectively 10 μm and 10 μm.

The results are shown in Table 1 and FIG. 1 and FIG. 2. It is clearly noted from these results, particularly the results of Examples 1 to 5 and Comparative Examples 1 and 2 that the addition of a silicon-modified epoxy resin improved the toughness, mold releasability, and flexibility of a cured resin product, that the desirable amounts of addition were from 5 to 80 parts by weight, and that the use of a polyallyl phenol as a curing agent allowed the production of a resin composition having an excellent hydrophobicity.

TABLE 1

| | | Ex. 1 | Ex. 2 | Ex. 3 | Ex. 4 | Ex. 5 | Ex. 6 | Ex. 7 | Ex. 8 | Ex. 9 | CE 1 | CE 2 | CE 3 | CE 4 |
|---|---|---|---|---|---|---|---|---|---|---|---|---|---|---|
| Composition (parts) | Epoxy resin | 100 | 100 | 100 | 100 | 100 | 100 | 100 | 100 | 100 | 100 | 100 | 100 | 100 |
| | Polyallyl phenol | 70 | 70 | 70 | 70 | 70 | 30 | 50 | 90 | 120 | 70 | 70 | 20 | 130 |
| | Silicon-modified epoxy resin | 5 | 20 | 40 | 60 | 80 | 20 | 20 | 20 | 20 | 2 | 90 | 30 | 30 |
| Glass transition point (°C.) | | 200 | 218 | 215 | 192 | 189 | 182 | 216 | 221 | 198 | 211 | 160 | 170 | 182 |
| Flexural strength (kg/mm$^2$) | 25° C. | 6 | 6 | 5 | 5 | 4 | 4 | 5 | 5 | 4 | 4 | 4 | 3 | 4 |
| | 250° C. | 4 | 5 | 4 | 4 | 3 | 3 | 4 | 4 | 3 | 3 | 1 | 0 | 1 |
| Crack | | o | o | o | o | o | o | o | o | o | x | x | x | x |
| Absorbing ratio (%) | | 0.4 | 0.4 | 0.4 | 0.3 | 0.3 | 0.4 | 0.3 | 0.3 | 0.3 | 0.4 | 0.3 | 0.7 | 0.3 |
| Mold releasability (kg/cm$^2$) | 1 cycle | 6 | 6 | 5 | 4 | 4 | 5 | 5 | 5 | 6 | 8 | 4 | 6 | 6 |
| | 5 cycles | 3 | 1 | 0 | 0 | 0 | 2 | 2 | 2 | 3 | 7 | 0 | 4 | 5 |

Ex. = Example
CE = Comparative Example

A pertinent composition was prepared by placing these raw materials in a varying ratio indicated in Table 1 in a pressure kneader and kneading them simultaneously therein. A test piece of the composition was produced as follows.

First, the composition resulting from the kneading was comminuted into a 8-mesh pass powder. This powder was placed in a press mold and compression molded therein at 200° C. under 80 kg/cm$^2$ for 20 minutes. The shaped mass thus obtained was subjected to an after-curing treatment at 200° C. for eight hours.

The composition produced as described above was tested for various properties as follows:

Glass transition point: This property was determined with a thermomechanical analyzer (produced by Shinku Riko K.K.)

Flexural strength: This property was determined in accordance with the method specified in Japanese Industrial Standard (JIS) K-6911.

Crack: The occurrence of this phenomenon in a given test piece and the extent of the phenomenon were determined by observing a cross section of a given test piece (10×5× mm) under a microscope.

Absorbing ratio: This property was determined by the method (absorption of boiling water) specified in JIS K-6911.

Mold releasability: This property was determined by repeating the molding of a given composition on a chromium-plated plate, taking into count the cycles of the molding, and measuring the adhesive force.

Examples 10 to 14 and Comparative Examples 5 and 6

The experiments covered herein represent cases using an epoxy resin composition comprising an epoxy resin, a polyallyl phenol, a silicon-modified epoxy resin, and a butadiene/acrylonitrile copolymer.

The following raw materials were used in these experiments.

Epoxy resin: A cresol novolak type epoxy resin (produced by Nippon Kayaku Co., Ltd. and marketed under product code of "EOCN-1025")

Polyallyl phenol: A product of Mitsubishi Petro-Chemical Co., Ltd. marketed under product code of "SH-150AR"

Silicone-modified epoxy resin: A product of Dai-Nippon Ink & Chemicals, Inc. marketed under product code of "SIN-620"

Butadiene/acrylonitrile copolymer: A product of Ube Industries, Ltd. marketed under trademark designation of "Hycar CTBN1300"

A pertinent composition was prepared by placing the raw materials in a varying ratio indicated in Table 2 in a pressure kneader and kneading them simultaneously therein. Test pieces of these compositions and the test thereof for varying properties were carried out in the same manner as in Examples 1 to 9. The compositions were also tested for bleedout and package crack as follows.

Bleedout: The occurrence of this phenomenon on a given test piece (10×5×30 mm) and the extent of the phenomenon were determined by visually observing the surface of the test piece.

Package crack: The test for this phenomenon was performed by allowing a produced package to absorb moisture under the conditions of 85° C. and 85% RH for 96 hours, immersing this package in a solder bath at 260° C. for 20 seconds, and then visually examining the package.

The results are shown in Table 2 and in FIG. 3. It is clearly noted from these results, particularly the results of Examples 10 to 14 and Comparative Examples 5 and 6 that the addition of the butadiene/acrylonitrile copolymer improved the flexibility and toughness of a cured resin product, that the desirable amounts of addition were from 5 to 80 parts by weight, and that the use of the polyallyl phenol as a curing agent allowed production of a resin composition having an excellent hydrophobicity.

Polyallyl phenol: A product of Mitsubishi Petro-Chemical Co., Ltd. marketed under product Code of "SH-150AR"

Silicone-modified epoxy resin: A product of Dai-Nippon Ink & Chemicals, Inc. marketed under product code of "SIN-620"

Polystyrene/polybutadiene/polystyrene terminal block copolymer: A product of Shell Chemical K.K. marketed under the trademark of "Kraton G-1652"

A pertinent composition was prepared by placing these raw materials in a varying ratio indicated in Table 3 in a pressure kneader and kneading them simultaneously therein. Test pieces of these compositions and the test thereof for varying properties were carried out in the same manner as in Examples 1 to 9. The compositions were also tested for bleedout and package crack as follows:

Bleedout: In the same manner as in Examples 10 to 14.

TABLE 2

|  |  | Ex. 10 | Ex. 11 | Ex. 12 | Ex. 13 | Ex. 14 | CE 5 | CE 6 |
|---|---|---|---|---|---|---|---|---|
| Composition | Epoxy resin | 100 | 100 | 100 | 100 | 100 | 100 | 100 |
| (parts) | Polyallyl phenol | 70 | 70 | 70 | 70 | 70 | 70 | 30 |
|  | Silicon-modified epoxy resin | 30 | 30 | 30 | 30 | 30 | 30 | 30 |
|  | CTBN | 5 | 20 | 40 | 60 | 80 | 2 | 90 |
| Glass transition point (°C.) | | 188 | 185 | 180 | 177 | 173 | 200 | 150 |
| Flexural strength (kg/mm$^2$) | 25° C. | 8 | 8 | 9 | 7 | 6 | 6 | 4 |
|  | 250° C. | 6 | 6 | 5 | 4 | 3 | 4 | 1 |
| Crack | | o | o | o | o | o | o | o |
| Absorbing ratio (%) | | 0.5 | 0.5 | 0.5 | 0.6 | 0.6 | 0.4 | 0.8 |
| Mold releasability (kg/cm$^2$) | 1 cycle | 7 | 7 | 6 | 6 | 7 | 7 | 9 |
|  | 5 cycles | 2 | 2 | 2 | 1 | 3 | 2 | 5 |
| Bleedout | | o | o | o | o | o | o | x |
| Package crack | | o | o | o | o | o | x | x |

Ex. = Example
CE = Comparative Example

Examples 15 to 19 and Comparative Examples 7 and 8

The experiments covered herein represent cases using an epoxy resin composition comprising an epoxy resin, a polyallyl phenol, a silicon-modified epoxy resin, and a polystyrene/polybutadiene/polystyrene terminal block copolymer.

The following raw materials were used in these experiments.

Epoxy resin: A cresol novolak type epoxy resin (produced by Nippon Kayaku Co., Ltd. and marketed under produce code of "COCN-1025")

Package crack: The test for this phenomenon was performed by molding a 84 bottle QFP, allowing the bottle to absorb moisture at 121° C. for 24 hours, immersing the bottle in a solder bath at 260° C. for 20 seconds, and examining the bottle to detect cracks, if any.

Figure 4:
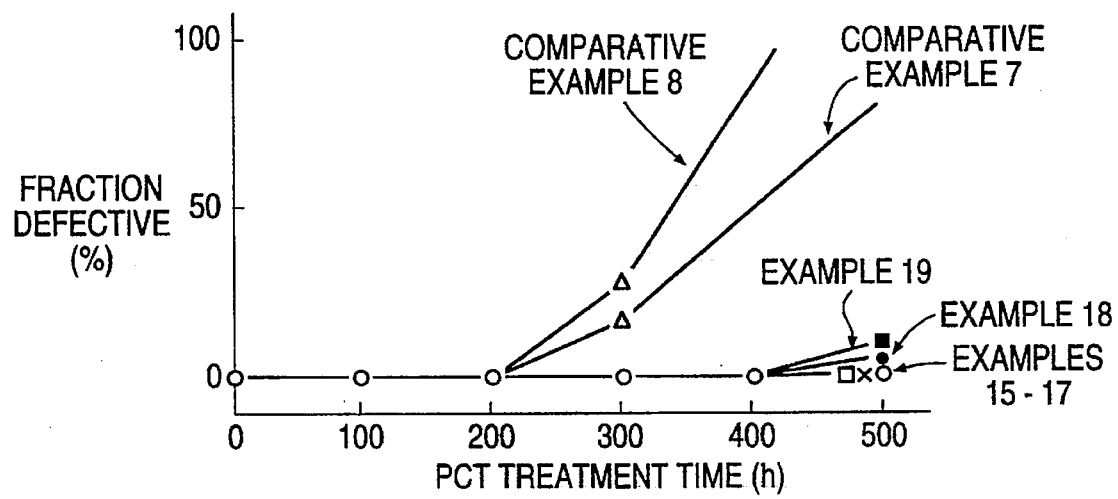

The results are shown in Table 3 and in FIG. 4. It is clearly noted from these results, particularly the results of Examples 15 to 19 and Comparative Examples 7 and 8 that the addition of the polystyrene/polybutadiene/polyester terminal block copolymer improved the flexibility of a cured resin product, that the desirable amounts of addition were from 5 to 80 parts by weight, and that the use of the polyallyl phenol as a curing agent allowed the production of a resin composition having an excellent hydrophobicity.

TABLE 3

|  |  |  | Ex. 15 | Ex. 16 | Ex. 17 | Ex. 18 | Ex. 19 | CE 7 | CE 8 |
|---|---|---|---|---|---|---|---|---|---|
| Composition | Epoxy resin | | 100 | 100 | 100 | 100 | 100 | 100 | 100 |
| (parts) | Polyallyl phenol | | 70 | 70 | 70 | 70 | 70 | 70 | 30 |
|  | Silicon-modified epoxy resin | | 30 | 30 | 30 | 30 | 30 | 30 | 30 |
|  | Terminal block copolymer | | 5 | 20 | 40 | 60 | 80 | 2 | 90 |
| Glass transition point (°C.) | | | 190 | 185 | 183 | 177 | 175 | 210 | 150 |
| Flexural strength (kg/mm$^2$) | | 25° C. | 7 | 7 | 6 | 5 | 5 | 7 | 4 |
|  | | 250° C. | 5 | 5 | 4 | 3 | 3 | 5 | 2 |
| Crack | | | o | o | o | o | o | o | o |
| Absorbing ratio (%) | | | 0.5 | 0.5 | 0.5 | 0.6 | 0.6 | 0.4 | 0.7 |

TABLE 3-continued

|  |  | Ex. 15 | Ex. 16 | Ex. 17 | Ex. 18 | Ex. 19 | CE 7 | CE 8 |
|---|---|---|---|---|---|---|---|---|
| Mold releasability (kg/cm$^2$) | 1 cycle | 7 | 7 | 7 | 8 | 8 | 7 | 9 |
|  | 5 cycles | 2 | 2 | 3 | 3 | 3 | 2 | 5 |
| Bleedout |  | o | o | o | o | o | o | x |
| Package crack |  | o | o | o | o | o | x | x |

Ex. = Example
CE = Comparative Example

Examples 20 and 24 and Comparative Examples 9 and 10

The experiments covered herein represent cases using an epoxy resin composition comprising an epoxy resin, a polyallyl phenol, a silicon-modified epoxy resin, and an ethylene/propylene type terpolymer.

The following raw materials were used in these experiments.

Epoxy resin: A cresol novolak type epoxy resin (produced by Nippon Kayaku Co., Ltd. and marketed under product code "EOCN-1025")

Polyallyl phenol: A product of Mitsubishi Petro-Chemical Co., Ltd. marketed under product code of "SH-150AR"

Silicone-modified epoxy resin: A product of Dai-Nippon Ink & Chemicals, Inc. marketed under product code of "SIN-620"

Ethylene/propylene type terpolymer: A product of Japan Synthetic Rubber Co., Ltd. marketed under product code "JSR57P"

A pertinent composition was prepared by placing these raw materials in a varying ratio indicated in Table 4 in a pressure kneader and kneading them simultaneously therein. The test pieces of these compositions and the test thereof for varying properties were carried out in the manner as in Examples 15 to 19.

Figure 5:
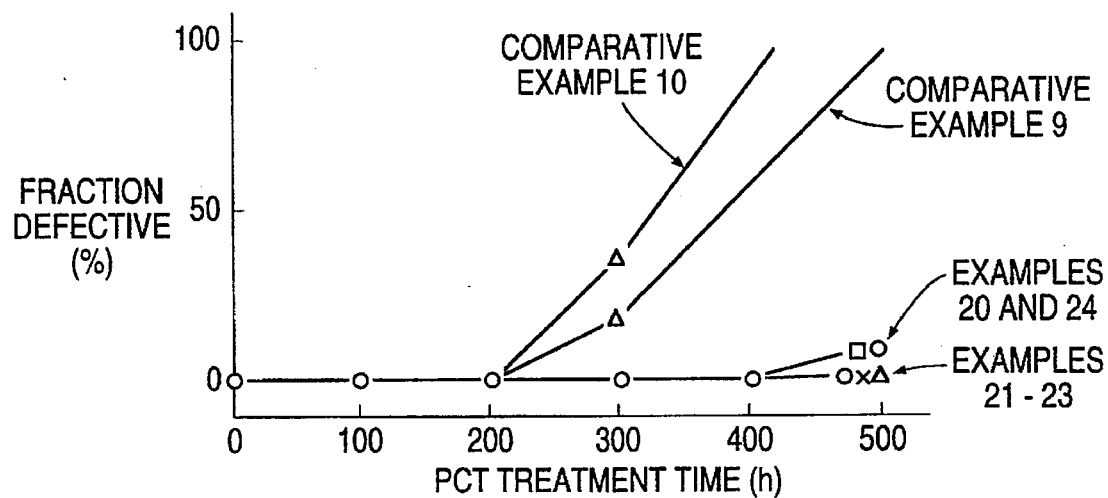

The results are shown in Table 4 and in FIG. 5. It is clearly noted from the results, particularly the results of Examples 20 to 24 and Comparative Examples 9 and 10 that the addition of the ethylene/propylene type terpolymer improved the flexibility of a cured resin product, that the desirable amounts of addition were from 5 to 80 parts by weight, and that the use of the polyallyl phenol as a curing agent allowed the production of a resin composition having an excellent hydrophobicity.

Examples 25 to 29 are Comparative Examples 11 and 12

The experiments covered herein represent cases using an epoxy resin composition comprising an epoxy resin, a polyallyl phenol, a silicon-modified epoxy resin, and an ethylene/α-olefin copolymer.

The following raw materials were used in these experiments.

Epoxy resin: A cresol novolak type epoxy resin (produced by Nippon Kayaku Co., Ltd. and marketed under product code of "EOCN-1025")

Polyallyl phenol: A product of Mitsubishi Petro-Chemical Co., Ltd. marketed under product code of "SH-150AR"

Silicon-modified epoxy resin: A product of Dai-Nippon Ink & Chemicals, Inc. marketed under product code of "SIN-620"

Ethylene/α-olefin copolymer: A product of Mitsui Petro-chemcial Industries, Ltd. marketed under the trademark "Tafmer-P P-0280:

A pertinent composition was prepared by placing these raw materials in a varying ratio indicated in Table 5 in a pressure kneader and kneading them simultaneously therein.

The test pieces of these compositions and the test thereof for varying properties were carried out in the same manner as in Examples 15 to 19.

Figure 6:
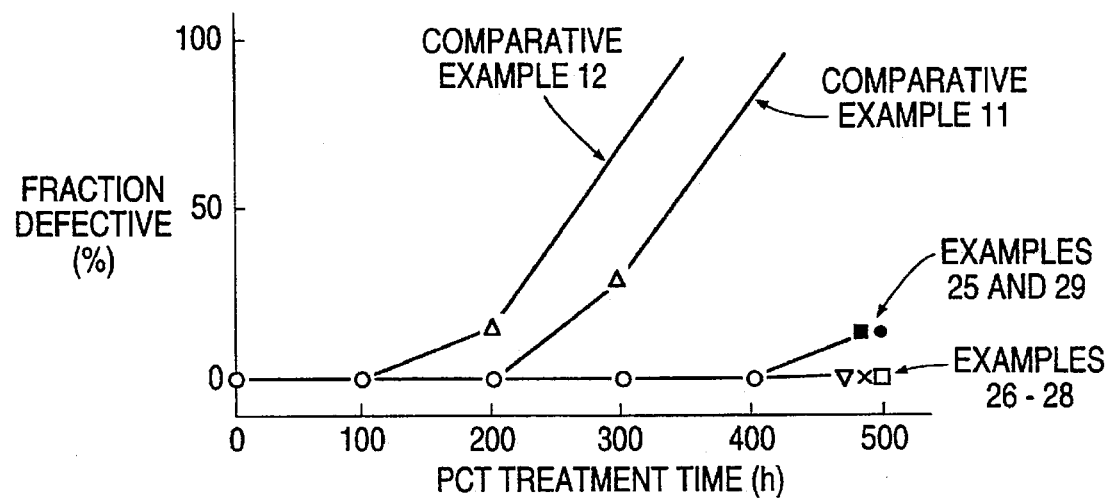

The results are shown in Table 5 and FIG. 6. It is clearly noted from these results, particularly the results of Examples 25 to 29 and Comparative Examples 11 and 12 that the addition of the ethylene/α-olefin copolymer improved the flexibility of a cured resin product, that the desirable amounts of addition were from 5 to 80 parts by weight, and that the use of the polyallyl phenol as a curing agent allowed the production of a resin composition having an excellent hydrophobicity.

TABLE 4

|  |  |  | Ex. 20 | Ex. 21 | Ex. 22 | Ex. 23 | Ex. 24 | CE 9 | CE 10 |
|---|---|---|---|---|---|---|---|---|---|
| Composition (parts) | Epoxy resin |  | 100 | 100 | 100 | 100 | 100 | 100 | 100 |
|  | Polyallyl phenol |  | 70 | 70 | 70 | 70 | 70 | 70 | 30 |
|  | Silicon-modified epoxy resin |  | 30 | 30 | 30 | 30 | 30 | 30 | 30 |
|  | Terpolymer |  | 5 | 20 | 40 | 60 | 80 | 2 | 90 |
| Glass transition point (°C.) |  |  | 192 | 186 | 185 | 179 | 177 | 212 | 149 |
| Flexural strength (kg/mm$^2$) |  | 25° C. | 7 | 8 | 7 | 6 | 5 | 6 | 5 |
|  |  | 250° C. | 5 | 5 | 4 | 4 | 3 | 3 | 2 |
| Crack |  |  | o | o | o | o | o | o | o |
| Absorbing ratio (%) |  |  | 0.5 | 0.5 | 0.5 | 0.6 | 0.6 | 0.4 | 0.7 |
| Mold releasability (kg/cm$^2$) |  | 1 cycle | 8 | 8 | 9 | 9 | 9 | 7 | 10 |
|  |  | 5 cycles | 2 | 3 | 3 | 3 | 4 | 1 | 6 |
| Bleedout |  |  | o | o | o | o | o | o | x |
| Package crack |  |  | o | o | o | o | o | x | x |

Ex. = Example
CE = Comparative Example

TABLE 5

|  |  | Ex. 25 | Ex. 26 | Ex. 27 | Ex. 28 | Ex. 29 | CE 11 | CE 12 |
|---|---|---|---|---|---|---|---|---|
| Composition | Epoxy resin | 100 | 100 | 100 | 100 | 100 | 100 | 100 |
| (parts) | Polyallyl phenol | 70 | 70 | 70 | 70 | 70 | 70 | 30 |
|  | Silicon-modified epoxy resin | 30 | 30 | 30 | 30 | 30 | 30 | 30 |
|  | Ethylene/α-olefin copolymer | 5 | 20 | 40 | 60 | 80 | 2 | 90 |
| Glass transition point (°C.) | | 187 | 181 | 180 | 175 | 173 | 200 | 139 |
| Flexural strength (kg/mm$^2$) | 25° C. | 7 | 7 | 7 | 6 | 5 | 7 | 5 |
|  | 250° C. | 5 | 4 | 4 | 3 | 3 | 4 | 2 |
| Crack | | o | o | o | o | o | o | o |
| Absorbing ratio (%) | | 0.6 | 0.6 | 0.5 | 0.6 | 0.6 | 0.4 | 0.8 |
| Mold releasability (kg/cm$^2$) | 1 cycle | 7 | 7 | 8 | 8 | 8 | 7 | 10 |
|  | 5 cycles | 2 | 2 | 2 | 3 | 3 | 1 | 6 |
| Bleedout | | o | o | o | o | o | o | x |
| Package crack | | o | o | o | o | o | x | x |

Ex. = Example
CE = Comparative Example

Examples 30 to 34 and Comparative Examples 13 and 14

The experiments covered herein represent cases using an epoxy resin composition comprising an epoxy resin, a polyallyl phenol, a silicon-modified epoxy resin, and a silicone powder containing an epoxy group.

The following raw materials were used in these experiments.

Figure 7:
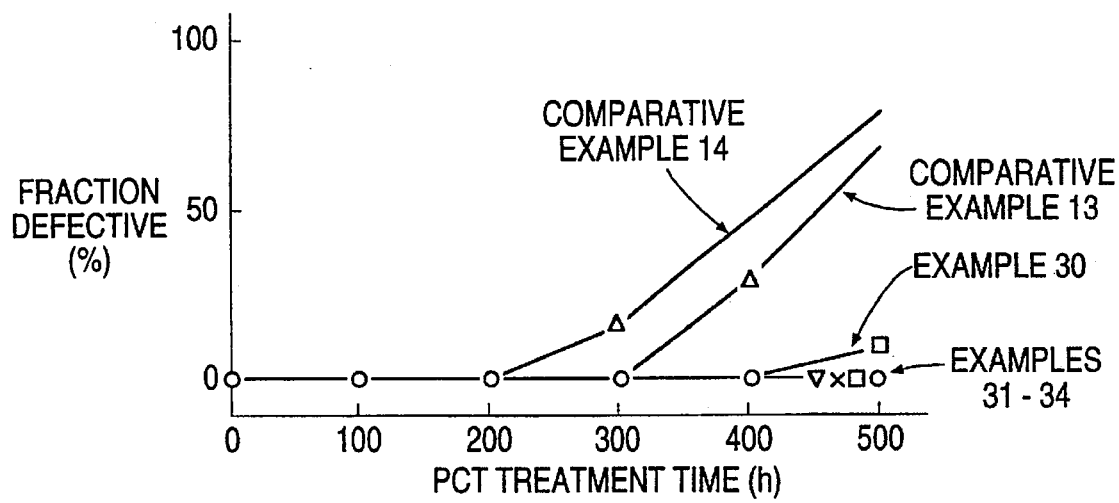

The results are shown in Table 6 and in FIG. 7. It is clearly noted from these results, particularly the results of Examples 30 to 34 and Comparative Examples 13 and 14 that the addition of the silicone powder containing an epoxy group improved the flexibility of a cured resin product, that the desirable amounts of addition were from 5 to 80 parts by weight, and that the use of the polyallyl phenol as a curing agent allowed the production of a resin composition having an excellent hydrophobicity.

TABLE 6

|  |  | Ex. 30 | Ex. 31 | Ex. 32 | Ex. 33 | Ex. 34 | CE 13 | CE 14 |
|---|---|---|---|---|---|---|---|---|
| Composition | Epoxy resin | 100 | 100 | 100 | 100 | 100 | 100 | 100 |
| (parts) | Polyallyl phenol | 70 | 70 | 70 | 70 | 70 | 70 | 30 |
|  | Silicon-modified epoxy resin | 30 | 30 | 30 | 30 | 30 | 30 | 30 |
|  | Silicon powder | 5 | 20 | 40 | 60 | 80 | 2 | 90 |
| Glass transition point (°C.) | | 193 | 191 | 190 | 187 | 185 | 210 | 165 |
| Flexural strength (kg/mm$^2$) | 25° C. | 8 | 9 | 9 | 8 | 8 | 7 | 6 |
|  | 250° C. | 6 | 7 | 8 | 7 | 6 | 4 | 3 |
| Crack | | o | o | o | o | o | o | o |
| Absorbing ratio (%) | | 0.4 | 0.4 | 0.3 | 0.3 | 0.4 | 0.4 | 0.5 |
| Mold releasability (kg/cm$^2$) | 1 cycle | 6 | 6 | 6 | 7 | 7 | 6 | 8 |
|  | 5 cycles | 1 | 1 | 2 | 2 | 2 | 1 | 4 |
| Bleedout | | o | o | o | o | o | o | x |
| Package crack | | o | o | o | o | o | x | x |

Ex. = Example
CE = Comparative Example

Epoxy resin: A cresol novolak type epoxy resin (produced by Nippon Kayaku Co., Ltd. and marketed under product code of "EOCN-1025")

Polyallyl phenol: A product of Mitsubishi Petro-Chemical Co., Ltd. marketed under product code of "SH-150AR"

Silicon-modified epoxy resin: A product of Dai-Nippon Ink & Chemicals, Inc. marketed under product code of "SIN-620"

Silicone powder containing epoxy group: A product of Toray-Dow Corning K.K. marketed under the trademark "Torayfil E-601"

A pertinent composition was prepared by placing these raw materials in a varying ratio indicated in Table 6 in a pressure kneader and kneading them simultaneously therein. The test pieces of these compositions and the test thereof for varying properties were carried out in the same manner as in Examples 15 to 19.

Examples 35 to 39 and Comparative Examples 15 and 16

The experiments covered herein represent cases using an epoxy resin composition comprising an epoxy resin, a polyallyl phenol, a silicon-modified epoxy resin, and silica.

The following raw materials were used in these experiments.

Epoxy resin: A cresol novolak type epoxy resin(produced by Nippon Kayaku Co., Ltd. and marketed under product code of "EOCN-1025")

Polyallyl phenol: A product of Mitsubishi Petro-Chemical Co., Ltd. marketed under product code of "SH-150AR"

Silicon-modified epoxy resin: A product of Dai-Nippon Ink & Chemicals, Inc. marketed under product code of "SIN-620"

Silica: A product of Tatsumori K.K. marketed under product code "RD-8"

A pertinent composition was prepared by placing these raw materials in a varying ratio indicated in Table 7 in a pressure kneader and kneading them simultaneously therein. The test pieces of these compositions and the test thereof for varying properties were carried out in the same manner as in Examples 15 to 19. The compositions were tested further for viscosity by the flow tester method.

Figure 8:
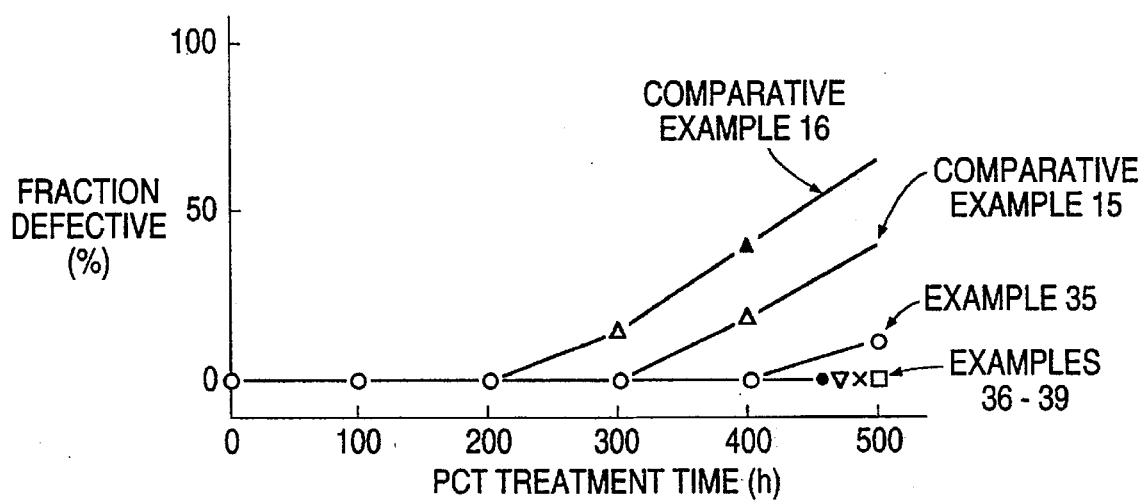

The results are shown in Table 7 and in FIG. 8. It is clearly noted from these results, particularly the results of Examples 35 to 39 and Comparative Examples 15 and 16 that the addition of silica improved the mechanical strength of a cured resin product, that the desirable amounts of addition were from 30 to 85% by weight, and that the use of the polyallyl phenol as a curing agent allowed the production of a resin composition having an excellent hydrophobicity.

It is clearly noted from these results, particularly the results of Examples 40 to 44 and Comparative Examples 17 and 18 that the addition of the silicon-modified epoxy resin improved the toughness, mold releasability, and flexibility of a cured resin product, that the desirable amounts of addition were from 5 to 80 parts by weight, and that the use of the polyallyl phenol as a curing agent allowed the production of a resin composition having an excellent hydrophobicity.

The biphenyl type epoxy resin used in these experiments was of the type disclosed in Japanese Unexamined Patent Publication No. 251,419/1988. The resin represented by the following general formula:

TABLE 7

|  |  | Ex. 35 | Ex. 36 | Ex. 37 | Ex. 38 | Ex. 39 | CE 15 | CE 16 |
|---|---|---|---|---|---|---|---|---|
| Composition | Epoxy resin | 100 | 100 | 100 | 100 | 100 | 100 | 100 |
| (parts) | Polyallyl phenol | 70 | 70 | 70 | 70 | 70 | 70 | 30 |
|  | Silicon-modified epoxy resin | 30 | 30 | 30 | 30 | 30 | 30 | 30 |
|  | Silica (%) | 30 | 40 | 60 | 70 | 85 | 10 | 90 |
| Glass transition point (°C.) |  | 190 | 191 | 190 | 190 | 192 | 190 | 190 |
| Flexural strength (kg/mm$^2$) | 25° C. | 13 | 14 | 16 | 17 | 17 | 9 | 13 |
|  | 250° C. | 10 | 10 | 11 | 12 | 13 | 4 | 9 |
| Crack |  | o | o | o | o | o | o | x |
| Absorbing ratio (%) |  | 0.3 | 0.2 | 0.2 | 0.1 | 0.1 | 0.5 | 0.1 |
| Mold releasability (kg/cm$^2$) | 1 cycle | 6 | 6 | 5 | 5 | 5 | 6 | 5 |
|  | 5 cycles | 1 | 1 | 1 | 0 | 0 | 2 | 0 |
| Package crack |  | o | o | o | o | o | x | x |
| Viscosity (P) |  | 153 | 300 | 350 | 420 | 500 | 110 | 1000 |

Ex. = Example
CE = Comparative Example

Examples 40 to 48 and Comparative Examples 17 to 20

Figure 10:
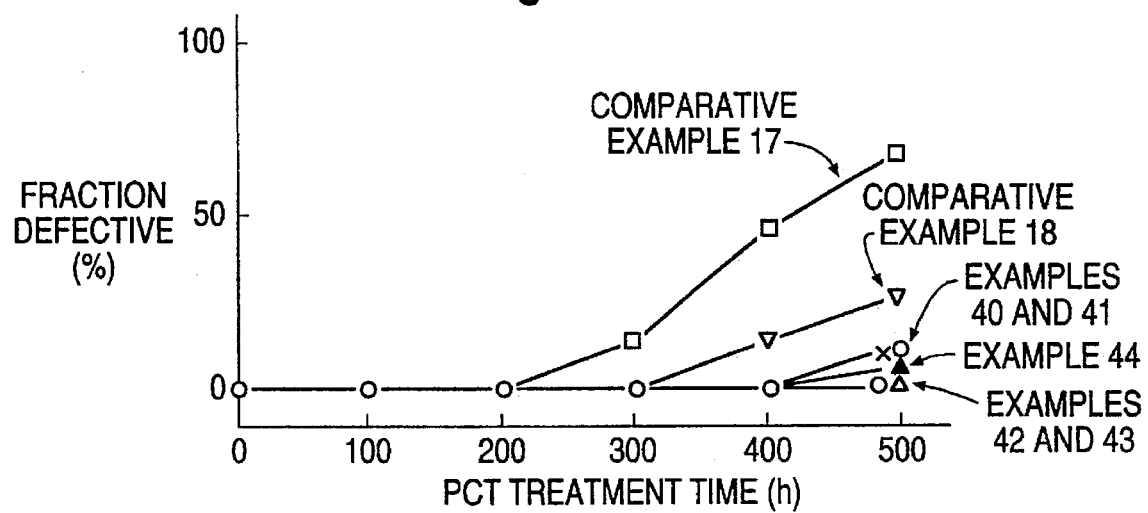
FIGS. 10 to 17 are graphs each showing the relationship between the time of PCT treatment (h) and the fraction defective (%) obtained in a relevant working example.
Figure 11:
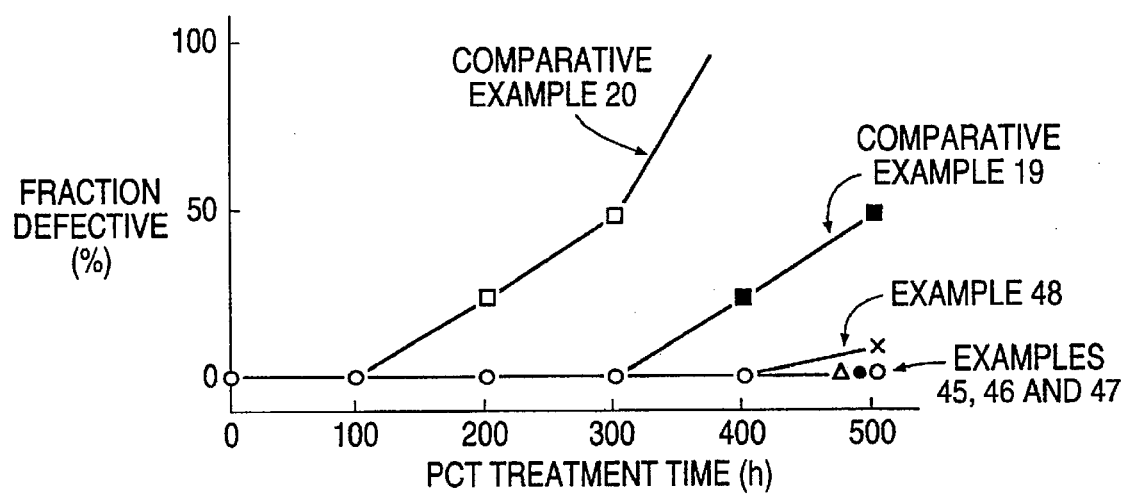

The procedure of Examples 1 to 9 and Comparative Examples 1 to 4 was repeated, excepting a biphenyl type epoxy resin (produced by Yuka-Shell Epoxy K.K. and marketed under product code "YX-4000H") was used as an epoxy resin and the raw materials were kneaded in a varying ratio indicated in Table 8. The results are shown in Table 8 and in FIGS. 10 and 11.

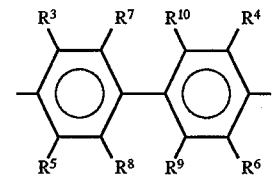

TABLE 8

|  | Ex. 40 | Ex. 41 | Ex. 42 | Ex. 43 | Ex. 44 | Ex. 45 | Ex. 46 | Ex. 47 | Ex. 48 | CE 17 | CE 18 | CE 19 | CE 20 |
|---|---|---|---|---|---|---|---|---|---|---|---|---|---|
| Composition (parts) |  |  |  |  |  |  |  |  |  |  |  |  |  |
| Epoxy resin | 100 | 100 | 100 | 100 | 100 | 100 | 100 | 100 | 100 | 100 | 100 | 100 | 100 |
| Polyallyl phenol | 70 | 70 | 70 | 70 | 70 | 30 | 50 | 90 | 120 | 70 | 70 | 20 | 130 |
| Silicon-modified epoxy resin | 5 | 20 | 40 | 60 | 80 | 20 | 20 | 20 | 20 | 2 | 90 | 30 | 30 |
| Glass transition point (°C.) | 210 | 227 | 225 | 200 | 198 | 190 | 226 | 230 | 202 | 220 | 165 | 173 | 185 |
| Flexural strength (kg/mm$^2$) |  |  |  |  |  |  |  |  |  |  |  |  |  |
| 25° C. | 7 | 7 | 6 | 6 | 5 | 5 | 6 | 6 | 5 | 4 | 5 | 4 | 4 |
| 250° C. | 5 | 6 | 5 | 5 | 4 | 4 | 4 | 4 | 4 | 3 | 2 | 1 | 0 |
| Crack | o | o | o | o | o | o | o | o | o | x | o | x | x |
| Absorbing ratio (%) | 0.3 | 0.3 | 0.3 | 0.2 | 0.2 | 0.3 | 0.2 | 0.2 | 0.2 | 0.3 | 0.3 | 0.7 | 0.4 |
| Mold releasability (kg/cm$^2$) |  |  |  |  |  |  |  |  |  |  |  |  |  |
| 1 cycle | 7 | 8 | 7 | 6 | 5 | 6 | 6 | 6 | 7 | 9 | 4 | 8 | 9 |
| 5 cycles | 3 | 1 | 0 | 0 | 0 | 2 | 2 | 2 | 3 | 7 | 0 | 6 | 7 |

Ex. = Example
CE = Comparative Example (wherein $R^3$ to $R^{10}$ each stand for a hydrogen, a lower alkyl group of one to four carbon atoms, or a halogen atom). Desirable examples of $R^3$ to $R^{10}$ are hydrogen atom, methyl group, ethyl group, propyl group, butyl group, chlorine atom, and bromine atom.

Examples 49 to 53 and Comparative Examples 21 and 22

Figure 12:
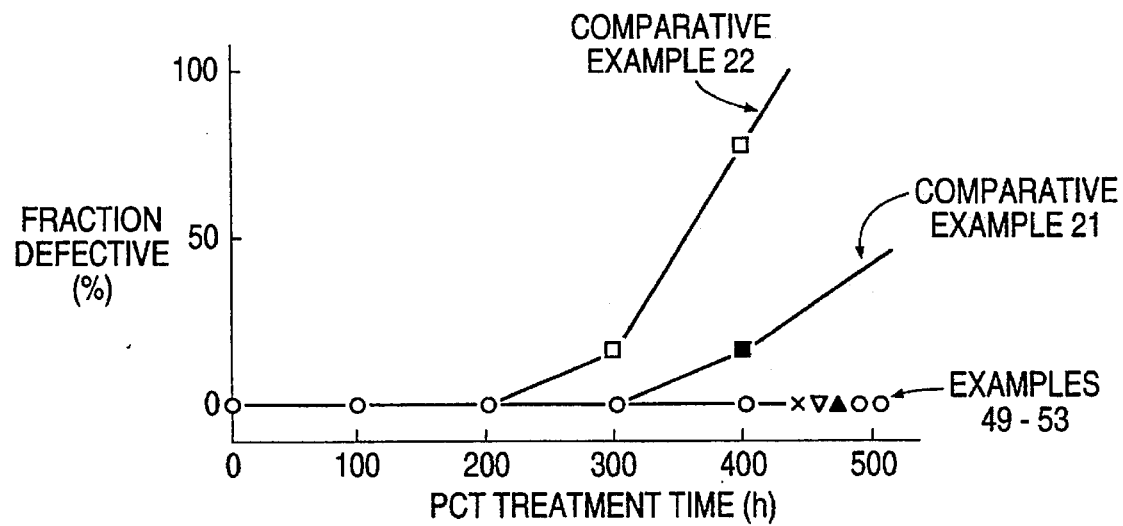

The procedure of Examples 10 to 14 and Comparative Examples 5 and 5 was repeated, excepting a biphenyl type epoxy resin (produced by Yuka-Shell Epoxy K.K. and marketed under product code "YX-4000H") was used as an epoxy resin and the raw materials were kneaded at a varying ratio indicated in Table 9. The results are shown in Table 9 and in FIG. 12.

Examples 54 to 58 and Comparative Examples 23 and 24

Figure 13:
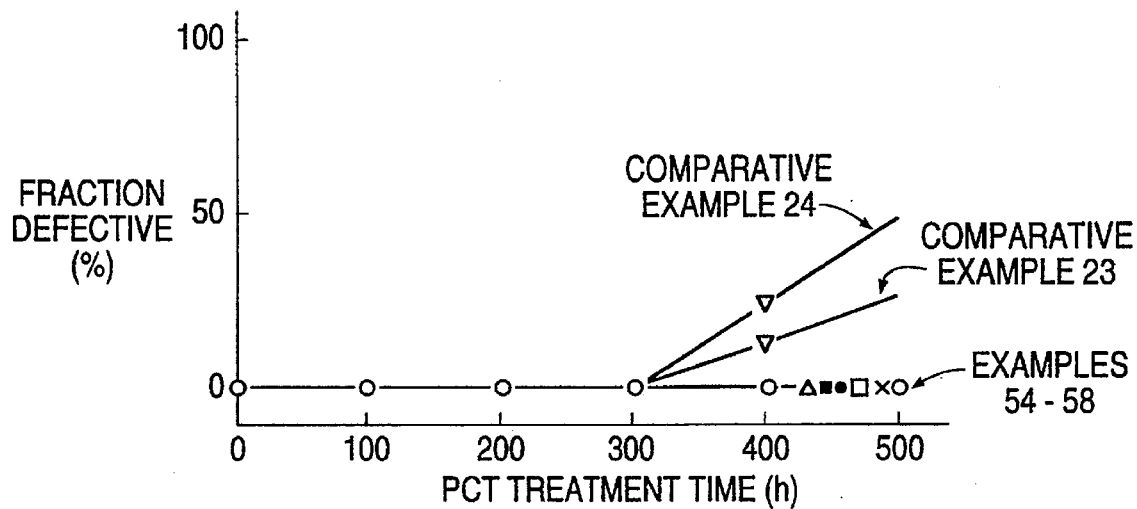

The procedure of Examples 15 to 19 and Comparative Examples 7 and 8, excepting a biphenyl type epoxy resin (produced by Yuka-Shell Epoxy K.K. and marketed under product code "YX-4000H") was used as an epoxy resin and the raw materials were used in a varying ratio indicated in Table 10. The results are shown in Table 10 and in FIG. 13.

TABLE 9

|  |  | Ex. 49 | Ex. 50 | Ex. 51 | Ex. 52 | Ex. 53 | CE 21 | CE 22 |
|---|---|---|---|---|---|---|---|---|
| Composition (parts) | Biphenyl type epoxy resin | 100 | 100 | 100 | 100 | 100 | 100 | 100 |
|  | Polyallyl phenol | 70 | 70 | 70 | 70 | 70 | 70 | 30 |
|  | Silicon-modified epoxy resin | 30 | 30 | 30 | 30 | 30 | 30 | 30 |
|  | CTBN | 5 | 20 | 40 | 60 | 80 | 2 | 90 |
| Glass transition point (°C.) |  | 202 | 200 | 193 | 188 | 180 | 205 | 150 |
| Flexural strength (kg/mm$^2$) | 25° C. | 9 | 9 | 10 | 10 | 8 | 6 | 4 |
|  | 250° C. | 7 | 8 | 8 | 7 | 4 | 4 | 1 |
| Crack |  | o | o | o | o | o | o | o |
| Absorbing ratio (%) |  | 0.4 | 0.4 | 0.5 | 0.5 | 0.6 | 0.4 | 0.8 |
| Mold releasability (kg/cm$^2$) | 1 cycle | 9 | 9 | 7 | 6 | 7 | 7 | 9 |
|  | 5 cycles | 4 | 3 | 2 | 1 | 3 | 2 | 5 |
| Bleedout |  | o | o | o | o | o | o | x |
| Package crack |  | o | o | o | o | o | x | x |

Ex. = Example
CE = Comparative Example

TABLE 10

|  |  | Ex. 54 | Ex. 55 | Ex. 56 | Ex. 57 | Ex. 58 | CE 23 | CE 24 |
|---|---|---|---|---|---|---|---|---|
| Composition (parts) | Biphenyl type epoxy resin | 100 | 100 | 100 | 100 | 100 | 100 | 100 |
|  | Polyallyl phenol | 70 | 70 | 70 | 70 | 70 | 70 | 30 |
|  | Silicon-modified epoxy resin | 30 | 30 | 30 | 30 | 30 | 30 | 30 |
|  | Terminal block copolymer | 5 | 20 | 40 | 60 | 80 | 2 | 90 |
| Glass transition point (°C.) |  | 200 | 198 | 195 | 188 | 186 | 220 | 162 |
| Flexural strength (kg/mm$^2$) | 25° C. | 8 | 8 | 7 | 6 | 6 | 8 | 4 |
|  | 250° C. | 6 | 6 | 5 | 4 | 3 | 5 | 2 |
| Crack |  | o | o | o | o | o | o | o |
| Absorbing ratio (%) |  | 0.4 | 0.4 | 0.5 | 0.5 | 0.6 | 0.4 | 0.7 |
| Mold releasability (kg/cm$^2$) | 1 cycle | 8 | 8 | 8 | 9 | 9 | 7 | 11 |
|  | 5 cycles | 1 | 3 | 4 | 4 | 4 | 2 | 8 |
| Bleedout |  | o | o | o | o | o | o | x |
| Package crack |  | o | o | o | o | o | x | x |

Ex. = Example
CE = Comparative Example

It is clearly noted from these results, particularly the results of Examples 49 to 51 and Comparative Examples 21 and 22, that the use of the butadiene/acrylonitrile copolymer improved the flexibility and toughness of a cured resin product, that the desirable amounts of addition were from 5 to 80 parts by weight, and that the use of the polyallyl phenol as a curing agent allowed the production of a resin composition having an excellent hydrophobicity.

It is clearly noted from these results, particularly the results of Examples 54 to 58 and Comparative Examples 23 and 24 that the addition of the polystyrene/polybutadiene/polystyrene terminal block copolymer improved the flexibility of a cured resin product, that the desirable amounts of addition were from 5 to 80 parts by weight, and that the use of the polyallyl phenol as a curing agent allowed the production of a resin composition having an excellent hydrophobicity.

Examples 59 to 63 and Comparative Examples 25 and 26

Figure 14:
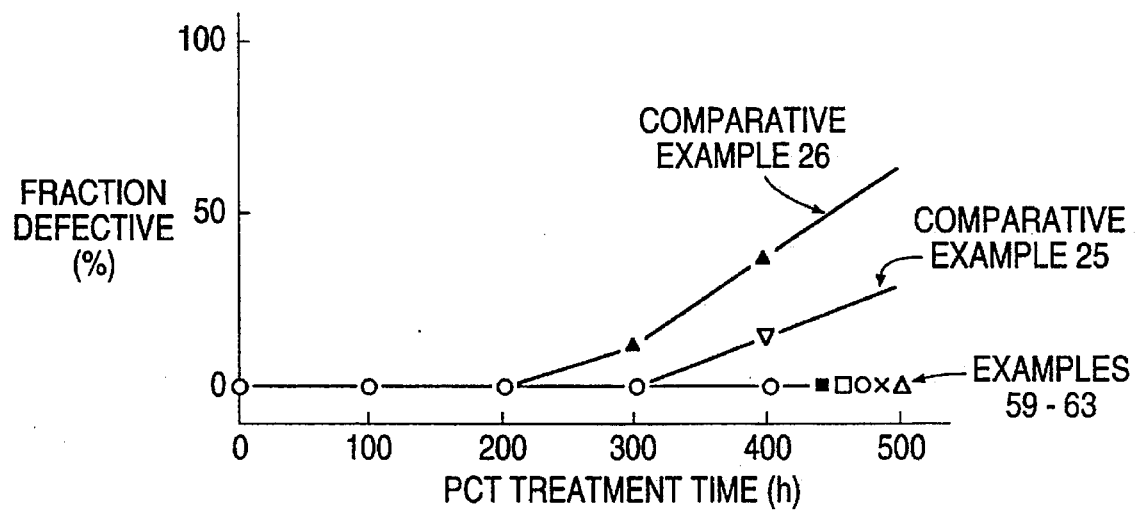

The procedure of Examples 20 to 24 and Comparative Examples 9 to 10 was repeated, excepting a biphenyl type-epoxy resin (produced by Yuka-Shell Epoxy K.K. and marketed under produce code "YX-4000H") and the raw materials were kneaded at a varying ratio indicated in Table 11. The results are shown in Table 11 and in FIG. 14.

TABLE 11

|  | Ex. 59 | Ex. 60 | Ex. 61 | Ex. 62 | Ex. 63 | CE 25 | CE 26 |
|---|---|---|---|---|---|---|---|
| Composition (parts) | | | | | | | |
| Biphenyl type epoxy resin | 100 | 100 | 100 | 100 | 100 | 100 | 100 |
| Polyallyl phenol | 70 | 70 | 70 | 70 | 70 | 70 | 30 |
| Silicon-modified epoxy resin | 30 | 30 | 30 | 30 | 30 | 30 | 30 |
| Terpolymer | 5 | 20 | 40 | 60 | 80 | 2 | 90 |
| Glass transition point (°C.) | 205 | 200 | 198 | 195 | 185 | 220 | 150 |
| Flexural strength (kg/mm$^2$) | | | | | | | |
| 25° C. | 8 | 9 | 8 | 7 | 6 | 7 | 5 |
| 250° C. | 6 | 6 | 5 | 5 | 3 | 3 | 2 |
| Crack | o | o | o | o | o | o | o |
| Absorbing ratio (%) | 0.4 | 0.5 | 0.5 | 0.5 | 0.6 | 0.4 | 0.7 |
| Mold releasability (kg/cm$^2$) | | | | | | | |
| 1 cycle | 9 | 10 | 10 | 11 | 10 | 8 | 12 |
| 5 cycles | 3 | 4 | 3 | 4 | 4 | 3 | 7 |
| Bleedout | o | o | o | o | o | o | x |
| Package crack | o | o | o | o | o | x | x |

Ex. = Example
CE = Comparative Example

It is clearly noted from these results, particularly the results of Examples 59 to 63 and Comparative Examples 25 and 26 that the addition of the ethylene/propylene type terpolymer improved the flexibility of a cured resin product, that the desirable amounts of addition were from 5 to 80 parts by weight, and that the use of the polyallyl phenol as a curing agent allowed the production of a resin composition having an excellent hydrophobicity.

Examples 64 to 68 and Comparative Examples 27 and 28

Figure 15:
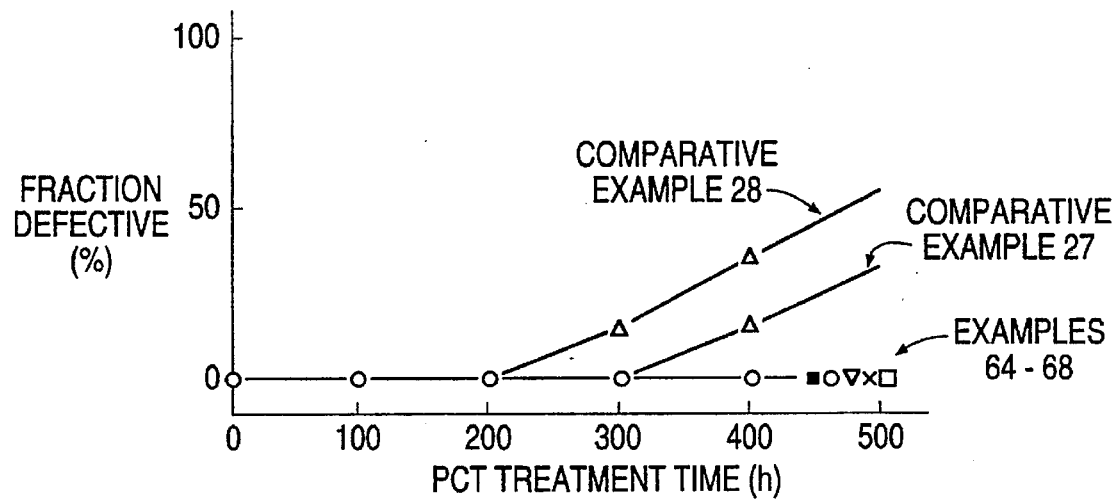

The procedure of Examples 25 to 29 and Comparative Examples 11 and 12 was repeated, excepting a biphenyl type epoxy resin (produced by Yuka-Shell Epoxy K.K. and marketed under product code "YX-4000H" was used as an epoxy resin and the raw materials were kneaded at a varying ratio indicated in Table 12. The results are shown in Table 12 and in FIG. 15.

TABLE 12

|  | Ex. 64 | Ex. 65 | Ex. 66 | Ex. 67 | Ex. 68 | CE 27 | CE 28 |
|---|---|---|---|---|---|---|---|
| Composition (parts) | | | | | | | |
| Biphenyl type epoxy resin | 100 | 100 | 100 | 100 | 100 | 100 | 100 |
| Polyallyl phenol | 70 | 70 | 70 | 70 | 70 | 70 | 30 |
| Silicon-modified epoxy resin | 30 | 30 | 30 | 30 | 30 | 30 | 30 |
| Ethylene/α-olefin copolymer | 5 | 20 | 40 | 60 | 80 | 2 | 90 |
| Glass transition point (°C.) | 190 | 195 | 193 | 185 | 180 | 210 | 140 |
| Flexural strength (kg/mm$^2$) | | | | | | | |
| 25° C. | 8 | 8 | 8 | 7 | 6 | 7 | 5 |
| 250° C. | 6 | 6 | 5 | 4 | 4 | 4 | 2 |
| Crack | o | o | o | o | o | o | o |
| Absorbing ratio (%) | 0.5 | 0.5 | 0.5 | 0.6 | 0.6 | 0.4 | 0.8 |
| Mold releasability (kg/cm$^2$) | | | | | | | |
| 1 cycle | 8 | 9 | 9 | 9 | 10 | 7 | 12 |
| 5 cycles | 4 | 4 | 4 | 5 | 5 | 3 | 7 |
| Bleedout | o | o | o | o | o | o | x |
| Package crack | o | o | o | o | o | x | x |

Ex. = Example
CE = Comparative Example

It is clearly noted from these results, particularly the results of Examples 64 to 68 and Comparative Examples 27 and 28 that the addition of the ethylene/α-olefin copolymer improved the flexibility of a cured resin product, that the desirable amounts of addition were from 5 to 80 parts by weight, and that the use of the polyallyl phenol as a curing agent allowed the production of a resin composition having an excellent hydrophobicity.

Examples 69 to 73 and Comparative Examples 29 and 30

Figure 16:
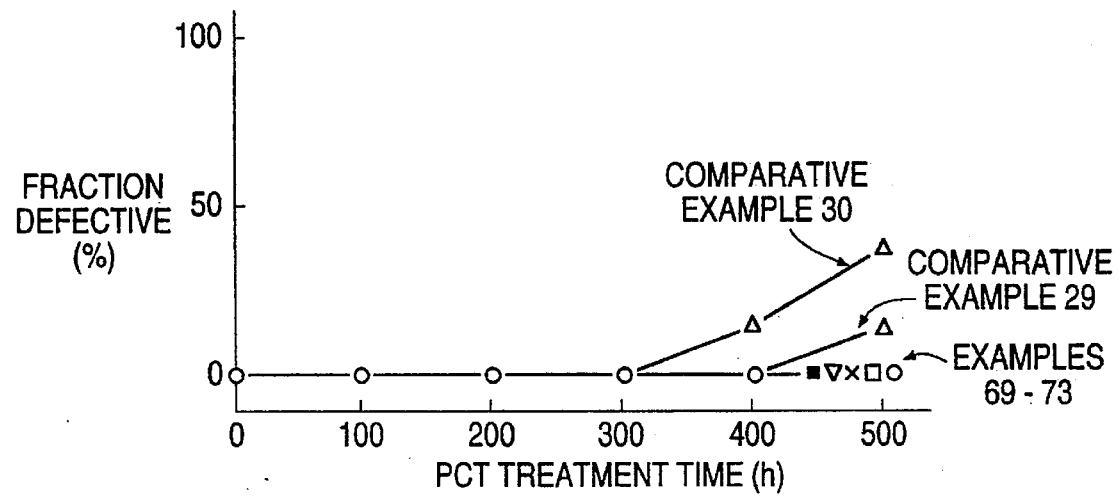

The procedure of Examples 30 to 34 and Comparative Examples 13 and 14 was repeated, excepting a biphenyl type epoxy resin (produced by Yuka-Shell Epoxy K.K. and marketed under produce code "YX-4000H" as an epoxy resin and the raw materials were kneaded at a varying ratio indicated in Table 13. The results are shown in Table 13 and in FIG. 16.

It is clearly noted from these results, particularly the results of Examples 69 to 73 and Comparative Examples 29 and 30 that the addition of the silicone powder containing an epoxy group improved the flexibility of a cured resin product, that the desirable amounts of addition are from 5 to 80 parts by weight, and that the use of the polyallyl phenol as a curing agent allowed the production of a resin composition having an excellent hydrophobicity.

Examples 74 to 78 and Comparative Examples 31 and 32

Figure 17:
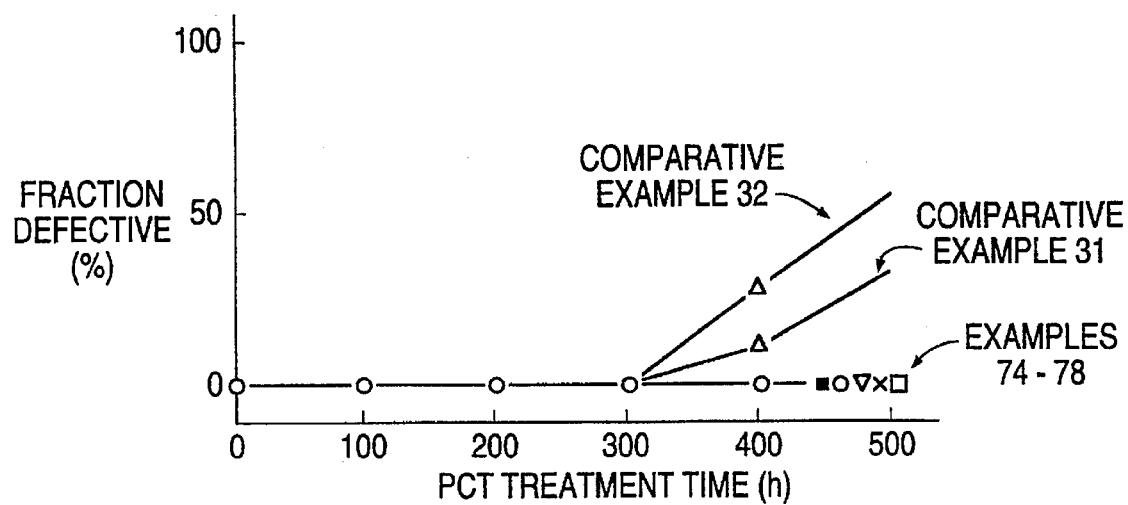

The procedure of Examples 35 to 39 and Comparative Examples 15 and 16 was repeated, excepting a biphenyl type epoxy resin (produced by Yuka-Shell Epoxy K.K. and marketed under product code "YX-4000H") was used as an epoxy resin and the raw materials were kneaded at a varying ratio indicated in Table 14. The results are shown in Table 14 and in FIG. 17.

TABLE 13

| | Ex. 69 | Ex. 70 | Ex. 71 | Ex. 72 | Ex. 73 | CE 29 | CE 30 |
|---|---|---|---|---|---|---|---|
| Composition (parts) | | | | | | | |
| Biphenyl type epoxy resin | 100 | 100 | 100 | 100 | 100 | 100 | 100 |
| Polyallyl phenol | 70 | 70 | 70 | 70 | 70 | 70 | 30 |
| Silicon-modified epoxy resin | 30 | 30 | 30 | 30 | 30 | 30 | 30 |
| Silicone powder | 5 | 20 | 40 | 60 | 80 | 2 | 90 |
| Glass transition point (°C.) | 210 | 210 | 203 | 200 | 198 | 215 | 165 |
| Flexural strength (kg/mm$^2$) | | | | | | | |
| 25° C. | 9 | 10 | 10 | 10 | 8 | 8 | 6 |
| 250° C. | 7 | 8 | 8 | 7 | 6 | 5 | 3 |
| Crack | o | o | o | o | o | o | o |
| Absorbing ratio (%) | 0.4 | 0.3 | 0.3 | 0.3 | 0.4 | 0.4 | 0.5 |
| Mold releasability (kg/cm$^2$) | | | | | | | |
| 1 cycle | 8 | 7 | 8 | 9 | 11 | 6 | 8 |
| 5 cycles | 3 | 2 | 3 | 2 | 3 | 1 | 4 |
| Bleedout | o | o | o | o | o | o | x |
| Package crack | o | o | o | o | o | x | x |

Ex. = Example
CE = Comparative Example

TABLE 14

| | Ex. 74 | Ex. 75 | Ex. 76 | Ex. 77 | Ex. 78 | CE 31 | CE 32 |
|---|---|---|---|---|---|---|---|
| Composition (parts) | | | | | | | |
| Biphenyl type epoxy resin | 100 | 100 | 100 | 100 | 100 | 100 | 100 |
| Polyallyl phenol | 70 | 70 | 70 | 70 | 70 | 70 | 30 |
| Silicon-modified epoxy resin | 30 | 30 | 30 | 30 | 30 | 30 | 30 |
| Silica (%) | 30 | 40 | 60 | 70 | 85 | 10 | 90 |
| Glass transition point (°C.) | 203 | 200 | 202 | 205 | 200 | 200 | 210 |
| Flexural strength (kg/mm$^2$) | | | | | | | |
| 25° C. | 14 | 15 | 18 | 19 | 19 | 9 | 17 |
| 250° C. | 12 | 12 | 15 | 17 | 15 | 4 | 10 |
| Crack | o | o | o | o | o | o | x |
| Absorbing ratio (%) | 0.3 | 0.2 | 0.1 | 0.1 | 0.1 | 0.5 | 0.1 |

TABLE 14-continued

|  | Ex. 74 | Ex. 75 | Ex. 76 | Ex. 77 | Ex. 78 | CE 31 | CE 32 |
|---|---|---|---|---|---|---|---|
| Mold releasability (kg/cm²) | | | | | | | |
| 1 cycle | 8 | 7 | 6 | 5 | 4 | 6 | 5 |
| 5 cycles | 3 | 2 | 2 | 0 | 0 | 2 | 0 |
| Package crack | o | o | o | o | o | x | x |
| Viscosity (P) | 40 | 70 | 150 | 220 | 400 | 110 | 800 |

Ex. = Example
CE = Comparative Example

It is clearly noted from these results, particularly the results of Examples 74 to 78 and Comparative Examples 31 and 32 that the addition of silica improved the mechanical strength of a cured resin product, that the desirable amounts of addition were from 30 to 85% by weight, and that the use of the polyallyl phenol as a curing agent allowed the production of a resin composition having an excellent hydrophobicity.

Figure 18:
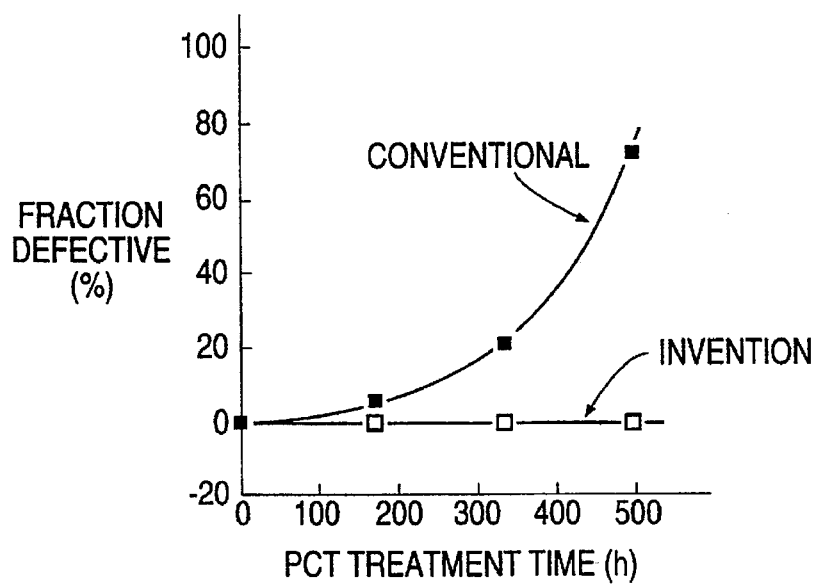
FIG. 18 compares products of the conventional art and the products of this invention with respect to the relationship between the time of PCT treatment (h) and the fraction defective (%)

The relationship between the time for the PCT treatment (h) and the fraction defective (%) can be easily understood from the accompanying drawings. The products of the comparative examples (cresol novolak type epoxy/phenol novolak type) and the products of this invention (biphenyl type epoxy/polyallyl phenyl type) are compared with respect to this relationship in FIG. 18. It can be understood from the results of the diagram that the products of this invention have an excellent moistureproofing.

Figure 19:
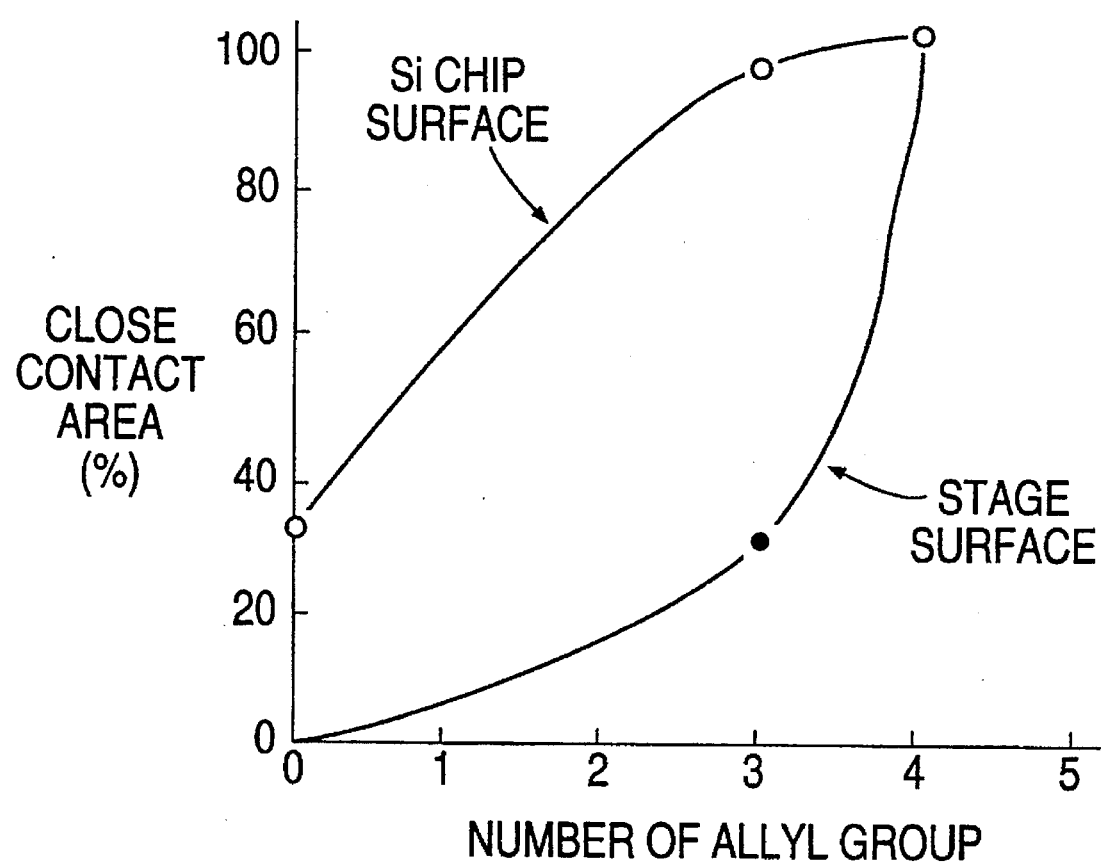
FIG. 19 is a graph showing the effect of the number of allyl groups on the surface of close contact.

FIG. 19 is a graph showing the effect produced by the number of allyl groups in the polyallyl phenol as a curing agent on the area of close contact. More specifically, this diagram shows the number of allyl groups contained in one benzene ring as a function of the degree of close contact between resin/silicon (Si) chips and resin/stage surface (rear surface) of a 100 pin flat type package after immersion in the solder bath for an absorption of humidity. It is noted from this diagram that the hydrophobicity and freedom from stress were improved and the close contact was enhanced proportionally with the increase of the number of allyl groups.

The epoxy resin to be used as the substratal resin in the composition of the present invention is not particularly limited. Nevertheless, the examples of epoxy resin which may be advantageously used for the composition of the present invention are glycidyl ether type epoxy resins such as bisphenol A type epoxy resins, cresol novolak type epoxy resins, phenol novolak type epoxy resins, and biphenyl type epoxy resins, and epoxy resins having 2 or more epoxy groups in a molecule, e. g. glycidyl ester type epoxy resins, glycidyl amine type epoxy resins, and halogenated epoxy resins.

Biphenyl type epoxy resins are more preferable epoxy resins in the present invention, because the composition of the present invention, containing a biphenyl type epoxy resin as a substratal resin gives a cured product with more increased heat resistance and moisture resistance.

As desirable biphenyl type epoxy resins, there may be mentioned, e. g., those disclosed in Japanese Unexamined Patent Publication No. 251,419/1988, e.g., 4,4'-bis(2,3-epoxypropoxy)biphenyl; 4,4'-bis(2,3-epoxypropoxy)-3,3',5,5'-tetramethylbiphenyl; 4,4'-bis(2,3-epoxypropoxy)-3,3',5,5'-tetramethyl-2-chlorobiphenyl; 4,4'-bis(2,3-epoxypropoxy)-3,3',5,5'-tetramethyl-2-bromobiphenyl; 4,4'-bis(2,3-epoxypropoxy)-3,3',5,5'-tetraethylbiphenyl; 4,4'-bis (2,3-epoxy-propoxy)-3,3',5,5'-tetrabutylbiphenyl, and the like. These epoxy resins are represented by the general formula:

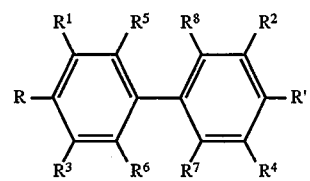

wherein R and R' each is an epoxy functional group, and $R^1$ and $R^8$ each represents a lower alkyl group with 1 to 4 carbon atoms, or a halogen atom. Representative examples of the epoxy functional groups indicated by R and R' are 2,3-epoxypropoxy groups. As preferred examples of the groups indicated by $R^1$ to $R^8$, there may be mentioned a hydrogen atom, methyl group, ethyl group, propyl group, butyl group, chlorine atom, bromine atom, and the like. These epoxy resins are commercially available, and e. g., "YX-4000H" produced by Yuka-Shell Epoxy K.K., and the like may be advantageously used.

As a matter of course, epoxy resins may be used either each singly or as a mixture of 2 or more of them.

The polyallyl phenols used in the epoxy resin composition of the present invention function as a curing agent. As examples of preferable polyallyl phenols, there may be mentioned those represented by the formula:

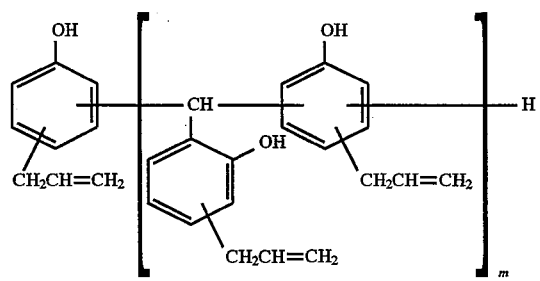

or

-continued

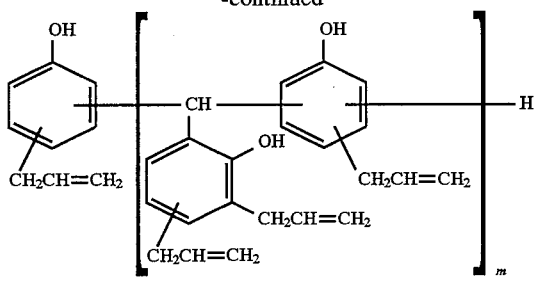

wherein m is an integer of 1 to 6.

It is understood that these polyallyl phenols come to have a higher viscosity, better workability, and become more improved in heat resistance, in proportion as the numerical value of m in the above formulae is increased. These polyallyl phenols may be synthesized by a known method, or as such polyallyl phenols, there may be utilized commercially available products including, e. g., those delivered as samples by Mitsubishi Petrochemical Co., Ltd. under the trade name of "SH-150 AR".

Polyallyl phenols used as curing agent elevate the glass transition temperature of the cured product, thus enabling the improvement of the heat resistance of the product, and also improving the hydrophobic nature thereof. The amount of the polyallyl phenol to be incorporated in the epoxy resin composition is preferably within the range between 5 and 200 parts by weight based on 100 parts by weight of the epoxy resin as a substratal resin. When this amount is less than 5 parts by weight, a sufficient development of the curing reaction of the epoxy resin composition cannot be expected, and when it exceeds 200 parts by weight, the glass transition temperature of the cured resin product lowers, resulting in impairment of the heat resistance of the cured resin product. The more preferable amount of polyallyl phenol to be incorporated in the epoxy resin composition is within the range between 50 and 100 parts by weight based on 100 parts by weight of the epoxy resin.

The polyphenol to be added to the composition of the present invention functions as a curing auxiliary agent, and is especially effective for the simultaneous improvement of the curability and mechanical strength of the present composition. This polyphenol is represented by the general formula:

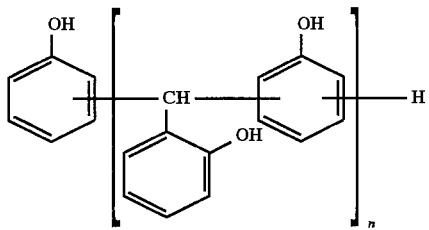

wherein n is an integer of 1 to 6.

These polyphenols may be synthesized by a known method, or as such polyphenols, there may be used commercially available ones including, e. g., the product marketed by Mitsubishi Petrochemical Co., Ltd. under the trade name of "SH-180".

The polyphenol used as a curing auxiliary agent may be incorporated in the composition of the present invention in an amount variable depending on the effect desired from the addition thereof, and this amount may generally be varied in a wide range. However, this amount is preferably within the range between 5 and 200 parts by weight based on 100 parts by weight of the epoxy resin, in general. When this amount is less than 5 parts by weight, the effect of the addition does not sufficiently exhibit, and when the polyphenol is incorporated in the composition of the present invention in a great quantity exceeding 200 parts by weight, the properties such as toughness of the cured resin product are deteriorated because polyphenols are fragile substances. The more preferable amount of the polyphenol to be incorporated in the composition of the present invention is within the range between 30 and 100 parts by weight based on 100 parts by weight of the epoxy resin.

To the composition of the present invention, there may be added, if necessary, one, or 2 or more of the flexibilizers listed hereinbelow in order to impart appropriate flexibility to a cured resin product obtained from the composition of the present invention.

(a) polystyrene/polybutadiene/polystyrene terminal block copolymer.

(b) ethylene/propylene type copolymers.

(c) ethylene/α-olefin copolymers.

(d) epoxy functional group-containing silicone rubber powder.

(e) silicon-modified epoxy resins.

As the ethylene/propylene type copolymer of the above-listed flexibilizers, terpolymers containing dicyclopentadiene or ethylidene norbornene as a third component monomer in addition to ethylene monomer and propylene monomer are favorable.

These flexibilizers may have various structures, and are virtually marketed in various forms. For instance, the polystyrene/polybutadiene/polystyrene terminal copolymer is commercially available as "Kraton G-1652" (produced by Shell Kagaku K.K.), the ethylene/propylene type copolymer as "JSR 57P" (produced by Nippon Gosei Gomu K.K.), the ethylene/α-olefin copolymer as "Tafmer PP-0280" (produced by Mitsui Sekiyu Kagaku K.K.), epoxy functional group-containing silicone rubber powder as "Torayfil E 601" (produced by Toray-Dow Corning K.K.) and the silicon-modified epoxy resin as "SIN-620" (produced by Dai-Nippon Ink Kagaku K.K.), respectively.

The aforesaid flexibilizers are effective for improving the flexibility and toughness of the cured resin product and thereby improving the crack resistance thereof. In addition, these flexibilizers also possess a function of improving the moisture resistance of the cured resin product. Any of the flexibilizers is desirably added to the epoxy resin as a substratal resin in an amount ranging from 5 to 80 parts by weight based on 100 parts by weight of the epoxy resin. When this amount is less than 5 parts by weight, the effect of the addition is not exhibited, and when it exceeds 80 parts by weight, the heat resistance of the cured resin product is lowered.

The epoxy resin composition of the present invention may contain a powdery inorganic filler for the purpose of improving the mechanical strength of the cured resin product. As the inorganic filler, there may be mentioned fused silica, crystalline silica, alumina, calcium carbonate and the like. These fillers are added to the epoxy resin composition in an amount ranging preferably from 20 to 85% by weight based on the total weight of the composition. When this amount is less than 20% by weight, the expected effect cannot be achieved, and when it exceeds 85% by weight, the flowability of the composition is lowered to result in the lowering of the workability thereof, and the cured resin product obtained from the composition becomes liable to be cracked. In addition, to the composition of the present invention, there may be optionally added the components mentioned hereinbelow, if occasion demands.

(1) A curing catalyst for promoting the curing reaction of the epoxy resin as substratal resin, a polyallyl phenol as a curing agent, and a polyphenol as a curing auxiliary agent. As the curing catalyst, there are used imidazole type ones such as 2-methyl imidazole, phosphine type ones such as triphenyl phosphine. DBU type ones such as a phenol salt of diazabicycloundecene (DBU), and the like.

(2) A coupling agent for enhancing the compatibility of the inorganic filler with the resin when the inorganic filler is added to the resin. As the coupling agent, there may be mentioned, e. g., silane type coupling agents such as 3-aminopropyltriethoxysilane, titanium type coupling agents such as tetraoctyl bis(phosphite) titanate, or the like. Although the amount of the coupling agent to be incorporated in the composition of the present invention varies depending on the kind, amount and specific surface area of the inorganic filler to be used, and the minimum covering area of the coupling agent, it is desirably within the range between about 0.1 and 15 parts by weight, in the present invention.

(3) A mold release auxiliary agent (e. g., carnauba wax, stearic acid and metal salts thereof, montan wax, etc.)

(4) A flame-retarding agent (e. g., brominated epoxy resin, antimony trioxide, etc.)

(5) A pigment (e. g., carbon black, etc.)

(6) A coloring agent (e. g., titanium dioxide, etc.)

The epoxy resin composition of the present invention can be prepared by heating its ingredients at a temperature ranging from about 60° to 120° C. by the use of a befitting means such as rolls, kneader, extruder or the like. The epoxy resin composition of the present invention may be prepared by adoption of a mixing-in-solvent method, in which the ingredients are mixed under the dissolution thereof in a suitable solvent such as acetone and toluene. Furthermore, in the composition of the present invention, it is desirable to carry out postcuring treatment after molding in order to complete the curing reaction of the uncured epoxy resin in the cured resin product or the like. This postcuring subsequent to the molding may be carried out by heat-treating the cured resin product for a predetermined time in a constant temperature bath kept at a temperature substantially equaling to the temperature used in the molding.

The polyallyl phenol incorporated as a curing agent in the epoxy resin composition of the present invention elevates the glass transition temperature of the cured resin product, so as to enable the improvement of the heat resistance of the composition of the present invention, and more effectively functions for improving the hydrophobic nature, flexibility and crack resistance of the composition of the present invention, compared with polyimide type resins which are typical of the conventional heat resistant resins. The polyphenol to be added as a curing auxiliary agent not only improves the curability of the composition of the present invention but also enables the improvement of the mechanical strength of the cured resin product obtained from the composition.

The flexibilizer to be added to the epoxy resin composition of the present invention, if necessary, functions effectively for improving the flexibility of the cured resin product and consequently improving the crack resistance of the cured resin product. In addition, the inorganic filler to be added to the composition of the present invention enhances the mechanical strength of the cured resin product.

Next, the present invention will further be illustrated with reference to the working examples and comparative examples. In each of the following examples, "parts" indicate "parts by weight" unless otherwise specified. In addition, the cresol novolak type epoxy resin used in each of the following examples was "EOCN-1025" produced by Nippon Kayaku K.K., the biphenyl type epoxy resin used therein was "YX-4000H" produced by Yuka-Shell Epoxy K.K., the polyallyl phenol used therein was "SH-150AR" produced by Mitsubishi Yuka K.K. and the polyphenol used therein was "SH-180" produced also by Mitsubishi Yuka K.K.

The evaluations of the properties of the compositions and the cured resin products thereof prepared in each of the following examples were conducted according to the undermentioned methods.

Glass transition point: This property was determined with a thermomechanical analyzer (produced by Shinku Riko K.K.).

Flexural strength: This property was determined in accordance with the method specified in Japanese Industrial Standard (JIS) K-6911.

Flexural modulus: This property was determined in accordance with the method specified in JIS K-6911.

Crack: The occurrence of this phenomenon in a given test piece and the extent of the phenomenon were determined by observing a cross section of a molded and cooled test piece (10×5×30 mm) under a microscope.

Water absorption ratio: This property was determined by the method specified in JIS K-6911.

Moisture resistance: This property was determined by evaluating the extent of the failure of a given sample, which had preliminarily been subjected to a PCT (pressure cooker test) treatment (125° C./2.3 atm.), by the use of an aluminum-wired model device.

Package crack: This property was determined such that a 84-pin QFP (quad flat package) was molded and the thus obtained QFP was subjected to a moisture absorption treatment for 24 hours at a temperature of 121° C. and a relative humidity of 100%, whereafter the thus treated QFP was immersed into a solder bath of 260° C., and the occurrence of cracks was visually observed.

Gel time: This property was determined by measuring the curing time of a given sample on a hot plate (180° C.).

Viscosity: This property was determined by a method using a flow tester.

In the following Examples 79 to 117 and Comparative Examples 33 to 48, a cresol novolak type resin was used as an epoxy resin as a substratal resin, and in Examples 118 to 156 and Comparative Examples 49 to 64, a biphenyl type epoxy resin was used:

Examples 79 to 87 and Comparative Examples 33 to 36

A cresol novolak type epoxy resin, a polyallyl phenol and a polyphenol were kneaded together in a pressure kneader, so that compositions with the compounding ratios set forth in Table 15 were prepared.

Next, the obtained compositions were, respectively, pulverized into 8 mesh pass powder, and the obtained powders were compression molded for 20 minutes at a temperature of 200° C. and under a pressure of 80 kg/cm$^2$, and then aftercured for 8 hours at a temperature of 200° C., so that test pieces were prepared. The various properties of these test pieces were prepared. The various properties of these test pieces were determined according to the aforesaid methods. The obtained results are set forth in Table 15 and FIG. 20.

TABLE 15

|  | Ex. 79 | Ex. 80 | Ex. 81 | Ex. 82 | Ex. 83 | Ex. 84 | Ex. 85 | Ex. 86 | Ex. 87 | CE 33 | CE 34 | CE 35 | CE 36 |
| --- | --- | --- | --- | --- | --- | --- | --- | --- | --- | --- | --- | --- | --- |
| Composition (parts) | | | | | | | | | | | | | |
| epoxy resin | 100 | 100 | 100 | 100 | 100 | 100 | 100 | 100 | 100 | 100 | 100 | 100 | 100 |
| polyallyl phenol | 70 | 70 | 70 | 70 | 70 | 5 | 50 | 100 | 200 | 70 | 70 | 2 | 210 |
| polyphenol | 5 | 50 | 100 | 150 | 200 | 50 | 50 | 50 | 50 | 2 | 210 | 50 | 50 |
| Glass transition temperature (°C.) | 135 | 198 | 200 | 210 | 228 | 210 | 205 | 190 | 178 | 173 | 145 | 230 | 140 |
| Flexural strength (kg/mm$^2$) | | | | | | | | | | | | | |
| 25° C. | 7 | 8 | 10 | 13 | 12 | 9 | 9 | 10 | 9 | 6 | 5 | 5 | 4 |
| 250° C. | 6 | 7 | 3 | 10 | 9 | 7 | 7 | 8 | 7 | 4 | 2 | 1 | 1 |
| Flexural modulus (kg/mm$^2$) | 600 | 640 | 680 | 720 | 780 | 730 | 675 | 620 | 570 | 580 | 320 | 800 | 420 |
| Crack | o | o | o | o | o | o | o | o | o | o | x | x | x |
| Water absorption rate (%) | 0.5 | 0.5 | 0.6 | 0.6 | 0.7 | 0.6 | 0.5 | 0.4 | 0.4 | 0.5 | 0.9 | 1.1 | 0.8 |
| Gel time (s) | 400 | 380 | 370 | 350 | 300 | 380 | 370 | 380 | 387 | 550 | 228 | 370 | 390 |
| Package crack | x | x | x | x | x | x | x | x | x | x | x | x | x |

Ex. = Example
CE = Comparative Example
o . . . Crack or package crack did not occur.
x . . . Crack or package crack occurred.

It can be seen from Table 15 that by the use of a polyallyl phenol in an amount ranging from 5 to 200 parts based on 100 parts of the epoxy resin, there may be obtained an epoxy resin composition excellent in the heat resistance of its cured product (having a high glass transition temperature). It can also be seen that the hydrophobic nature of the cured resin product, which may be judged by its water absorption ratio, is also excellent. In addition, by the use of a polyphenol as a curing auxiliary agent in an amount ranging from 5 to 200 parts, an epoxy resin composition having good curability could be obtained.

Figure 20:
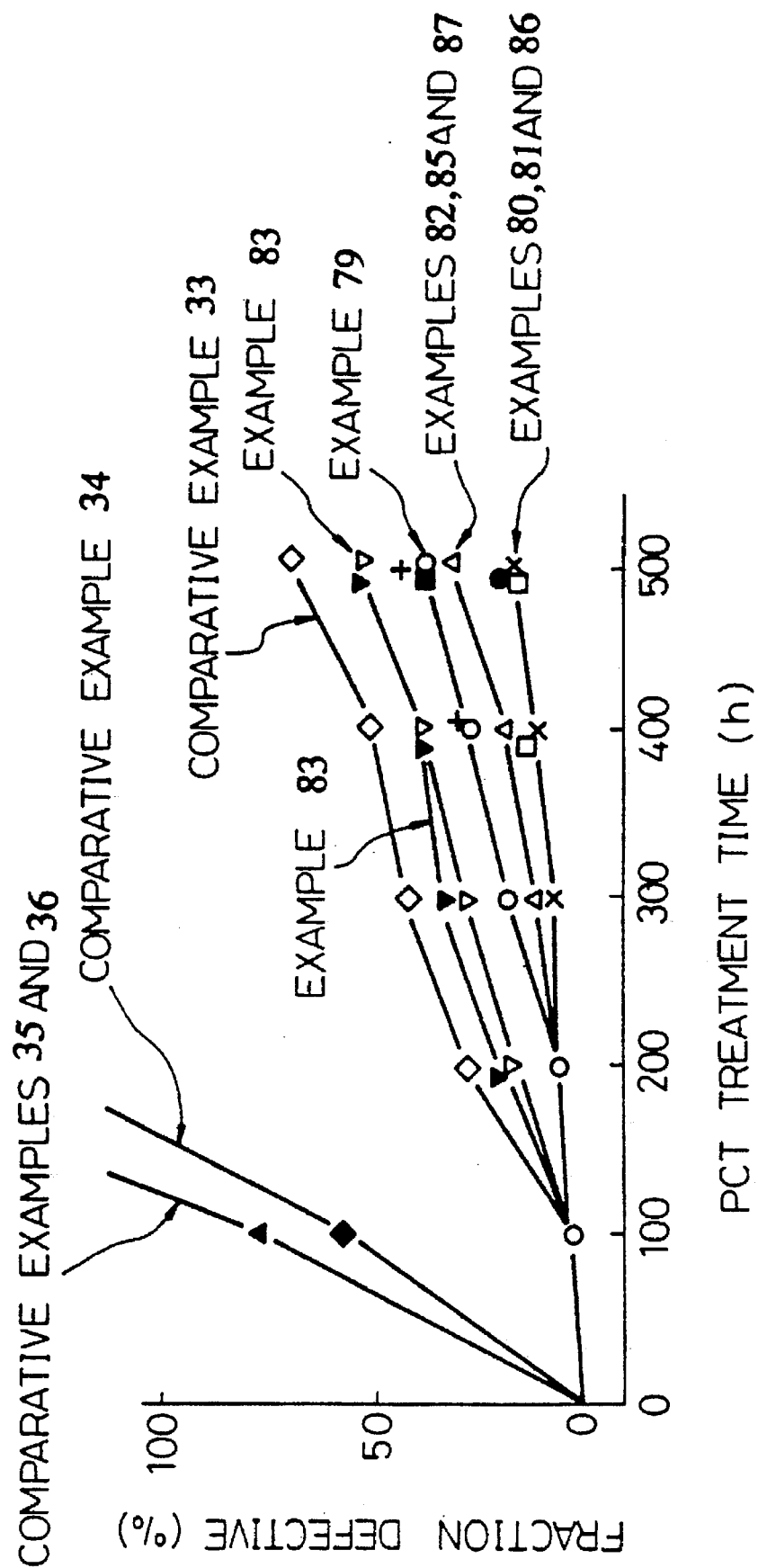
FIGS. 20 to 33 are graphs each showing the relationship between the time of PCT treatment and the fraction of defective cured resin products.

From FIG. 20 illustrating a graph of the PCT test results, showing the moisture resistances of cured products, it is clearly noted that the composition of the present invention gives its cured product having conspicuously better moisture resistance as compared with the compositions of the comparative examples.

As described above, it has clearly been seen that from the epoxy resin composition with which a polyallyl phenol curing agent and a polyphenol curing auxiliary agent have been blended, there is obtained a cured resin product having characteristics useful as multilayer laminate resins, electro-conductive pastes, protective films for electronic devices, sealing materials, molding materials and the like, which are used in electronic•electric equipments, transport equipments or the like. Nevertheless, as shown in the evaluation results concerning package crack, it has been clarified that under solder bath immersion conditions after such severe PCT treatment described above, there occur some package cracks.

Examples 88 to 92 and Comparative Examples 37 and 38

In these examples, to a mixture of a cresol novolak type epoxy resin, a polyallyl phenol and a polyphenol, there was further added a polystyrene/polybutadiene/polystyrene terminal block copolymer ("Kraton G-1652" produced by Shell Kagaku K.K.) as a flexibilizer, and these substances were together kneaded in a pressure kneader, so that compositions with the compounding ratios set forth in Table 16 were prepared.

Figure 21:
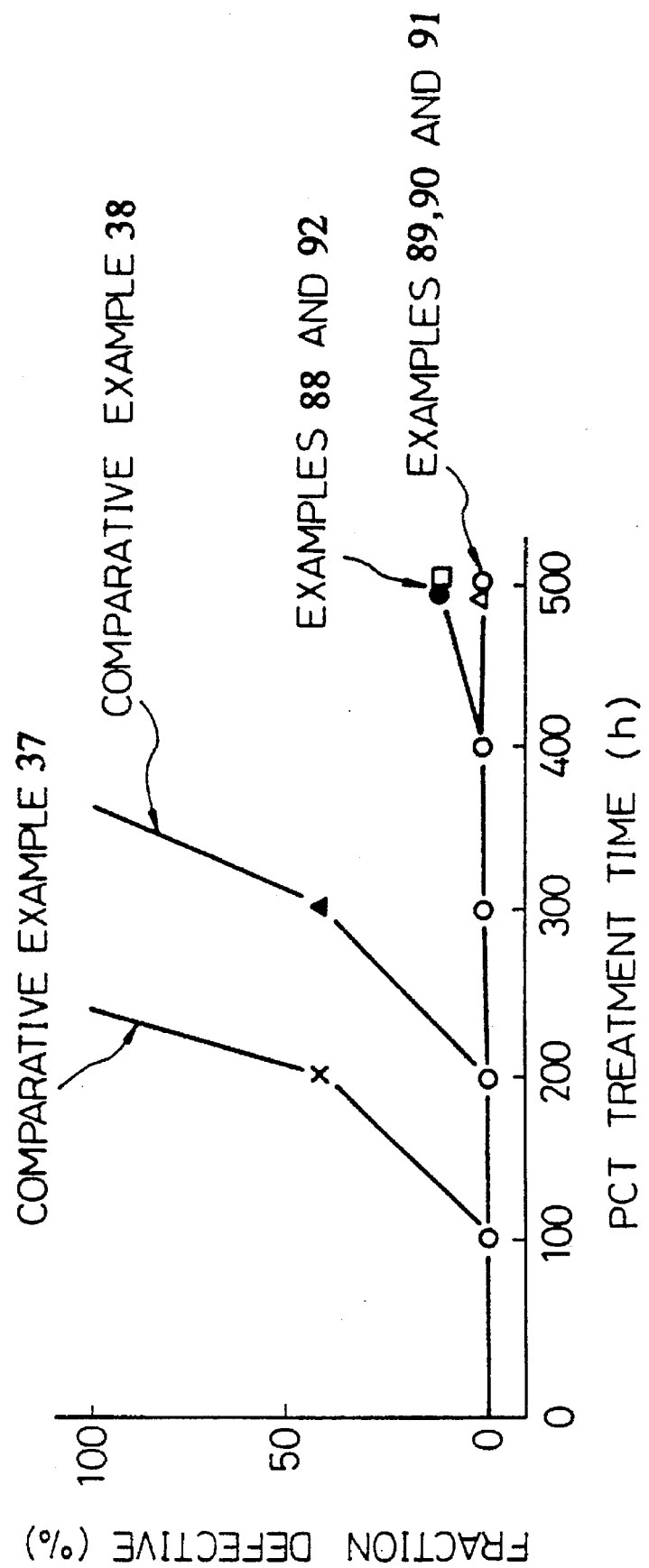

From each of the obtained compositions, test pieces were prepared in accordance with the procedures explained in Example 79, and the properties of the cured resin products obtained from the compositions were evaluated in the same manner as in Example 79. The results are set forth in Table 16 and FIG. 21.

TABLE 16

|  | Ex. 88 | Ex. 89 | Ex. 90 | Ex. 91 | Ex. 92 | CE 37 | CE 38 |
| --- | --- | --- | --- | --- | --- | --- | --- |
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| polystyrene/polybutadiene/polystyrene terminal block copolymer | 5 | 20 | 40 | 60 | 80 | 2 | 90 |
| Glass transition temperature (°C.) | 190 | 187 | 185 | 180 | 175 | 195 | 150 |
| Flexural strength (kg/mm$^2$) | | | | | | | |
| 25° C. | 9 | 9 | 8 | 8 | 7 | 8 | 4 |
| 250° C. | 8 | 8 | 7 | 6 | 5 | 7 | 2 |
| Crack | o | o | o | o | o | o | o |

TABLE 16-continued

|  | Ex. 88 | Ex. 89 | Ex. 90 | Ex. 91 | Ex. 92 | CE 37 | CE 38 |
|---|---|---|---|---|---|---|---|
| Water absorption ratio (%) | 0.6 | 0.6 | 0.6 | 0.7 | 0.7 | 0.5 | 0.8 |
| Flexural modulus (kg/mm$^2$) | 600 | 580 | 560 | 500 | 450 | 630 | 320 |
| Gel time (s) | 390 | 395 | 397 | 400 | 410 | 384 | 450 |
| Package crack | o | o | o | o | o | x | x |

Ex. = Example
CE = Comparative Example
o . . . Crack or package crack did not occur.
x . . . Crack or package crack occurred.

It is clearly seen from Table 16 that by the addition of the polystyrene/polybutadiene/polystyrene terminal block copolymer to the epoxy resin in an amount ranging from 5 to 80 parts based on 100 parts of the epoxy resin, the flexibility of the cured resin product obtained from the epoxy resin was improved and the occurrence of package crack was controlled. In addition, it can be noted from FIG. 21 that in these examples, there were obtained cured resin products with better moisture resistance than the cured products obtained from the compositions in Examples 79 to 87.

Examples 93 to 97 and Comparative Examples 39 and 40

Figure 22:
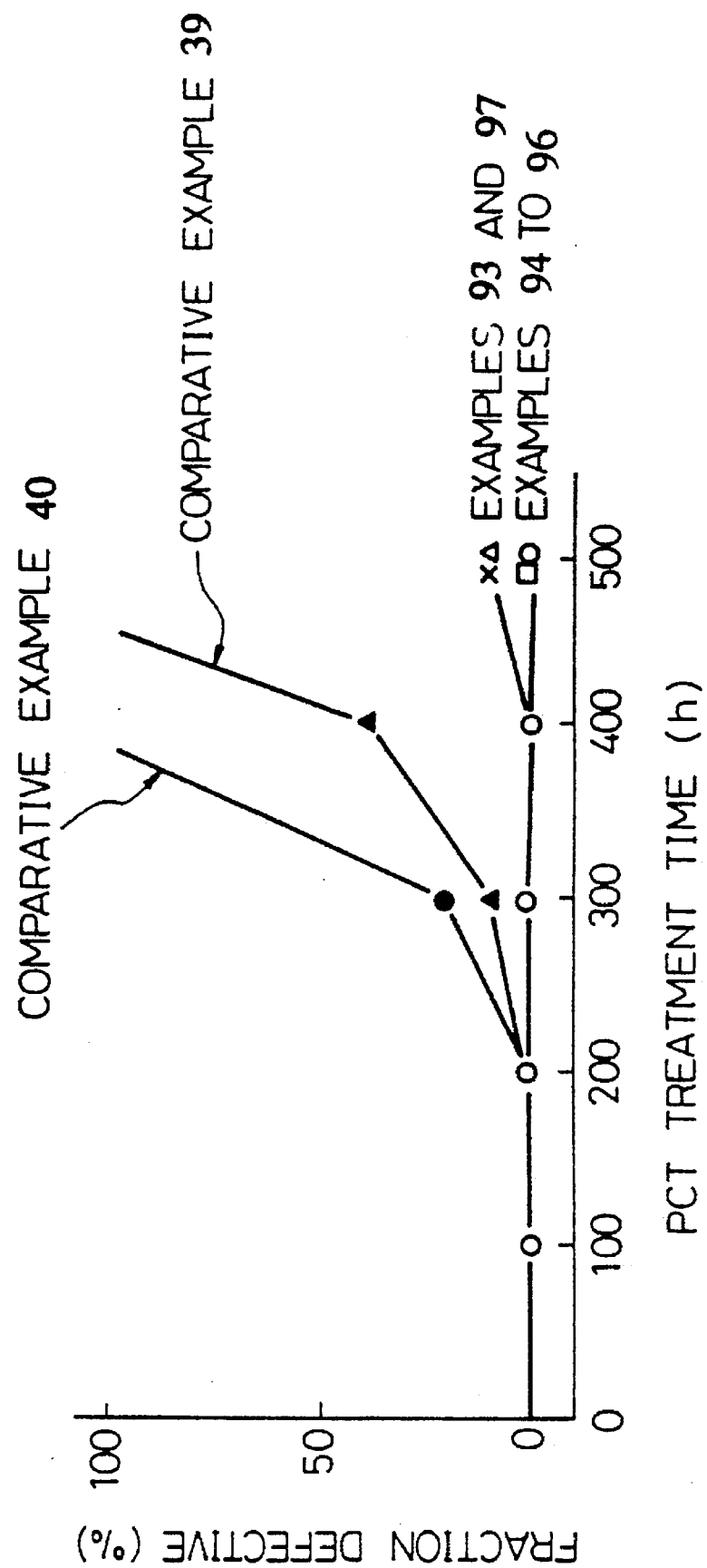

Compounds having the compounding ratios set forth in Table 17 were prepared in the same manner as in Examples 88 to 92, with the exception that an ethylene/propylene type copolymer ("JSR 57P" produced by Nippon Gosei Gomu K.K.) was used as a flexibilizer, and the properties of the cured test pieces obtained from these compositions were evaluated. The results are set forth in Table 17 and FIG. 22.

It is clearly seen from Table 17 that by the addition of an ethylene/propylene type copolymer as a flexibilizer to the epoxy resin in an amount ranging from 5 to 80 parts based on 100 parts of the epoxy resin, the flexibility of the cured resin product obtained from the epoxy resin was improved and the occurrence of package crack was controlled. In addition, it can be noted from FIG. 22 that in these examples, there were obtained cured resin products with better moisture resistance than the cured products obtained from the composition in Examples 79 to 87.

Examples 98 to 102 and Comparative Examples 41 and 42

Figure 23:
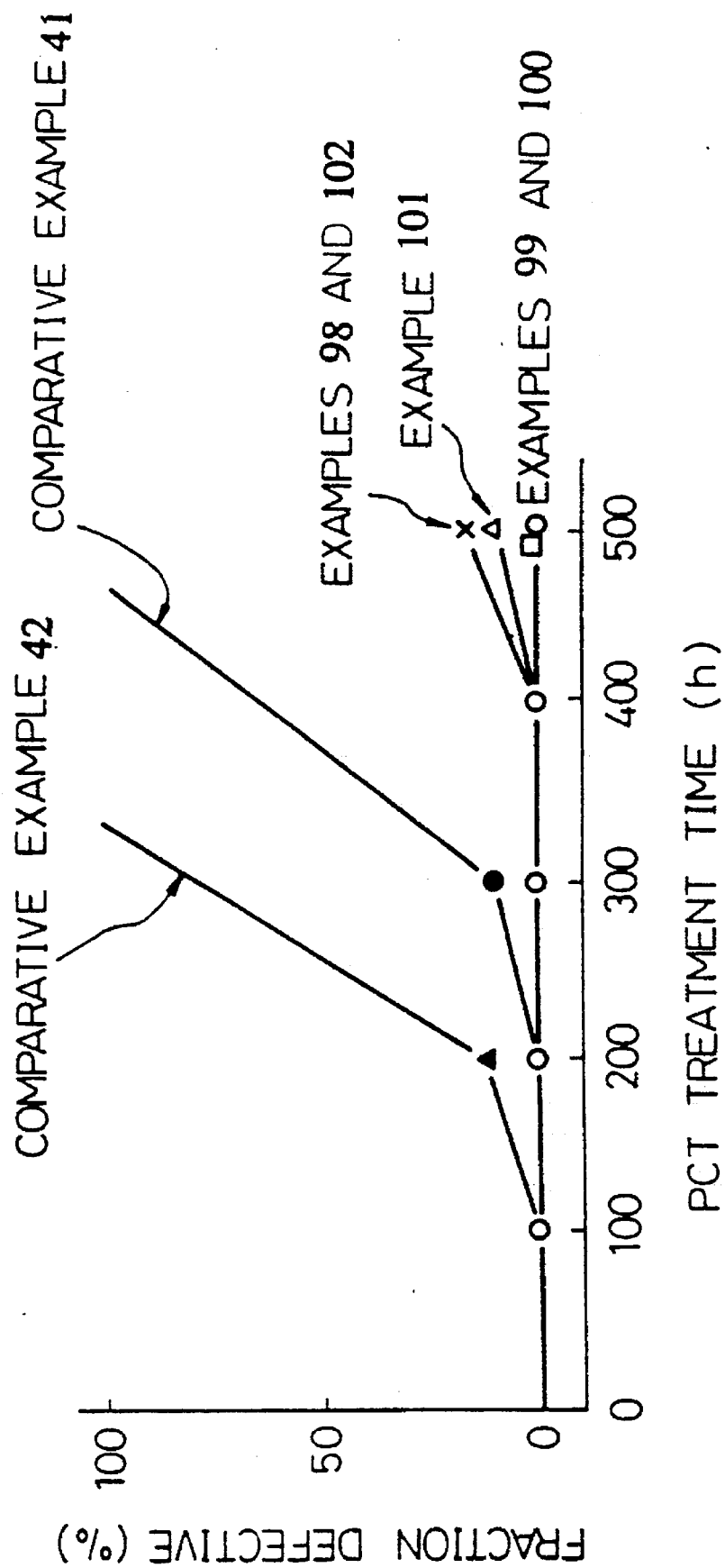

Compounds having the compounding ratios set forth in Table 18 were prepared in the same manner as in Examples 88 to 92, with the exception that an ethylene/α-olefin copolymer ("Tafmer PP-0280" produced by Mitsui Sekiyu Kagaku K.K.) was used as a flexibilizer, and the properties of the cured test pieces obtained from these compositions were evaluated. The results are set forth in Table 18 and FIG. 23.

TABLE 17

|  | Ex. 93 | Ex. 94 | Ex. 95 | Ex. 96 | Ex. 97 | CE 39 | CE 40 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| ethylene/propylene type copolymer | 5 | 20 | 40 | 60 | 80 | 2 | 90 |
| Glass transition temperature (°C.) | 195 | 190 | 188 | 178 | 178 | 195 | 140 |
| Flexural strength (kg/mm$^2$) | | | | | | | |
| 25° C. | 8 | 8 | 7 | 6 | 5 | 8 | 5 |
| 250° C. | 6 | 6 | 5 | 5 | 4 | 7 | 1 |
| Crack | o | o | o | o | o | o | o |
| Water absorption ratio (%) | 0.6 | 0.6 | 0.6 | 0.7 | 0.7 | 0.5 | 0.8 |
| Flexural modulus (kg/mm$^2$) | 610 | 590 | 570 | 520 | 460 | 620 | 330 |
| Gel time (s) | 395 | 398 | 405 | 410 | 415 | 380 | 460 |
| Package crack | o | o | o | o | o | x | x |

Ex. = Example
CE = Comparative Example
o . . . Crack or package crack did not occur.
x . . . Crack or package crack occurred.

TABLE 18

|  | Ex. 98 | Ex. 99 | Ex. 100 | Ex. 101 | Ex. 102 | CE 41 | CE 42 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| ethylene/α-olefin copolymer | 5 | 20 | 40 | 60 | 80 | 2 | 90 |
| Glass transition temperature (°C.) | 192 | 189 | 188 | 185 | 179 | 206 | 135 |
| Flexural strength (kg/mm$^2$) | | | | | | | |
| 25° C. | 8 | 8 | 7 | 7 | 7 | 7 | 6 |
| 250° C. | 6 | 5 | 5 | 5 | 4 | 4 | 1 |
| Crack | o | o | o | o | o | o | o |
| Water absorption ratio (%) | 0.7 | 0.8 | 0.4 | 0.7 | 0.7 | 0.5 | 0.9 |
| Flexural modulus (kg/mm$^2$) | 600 | 580 | 570 | 530 | 470 | 620 | 320 |
| Gel time (s) | 390 | 400 | 415 | 420 | 430 | 380 | 480 |
| Package crack | o | o | o | o | o | x | x |

Ex. = Example
CE = Comparative Example
o . . . Crack or package crack did not occur.
x . . . Crack or package crack occurred.

It is clearly seen from Table 18 that by the addition of an ethylene/α-olefin copolymer as a flexibilizer to the epoxy resin in an amount ranging from 5 to 80 parts based on 100 parts of the epoxy resin, the flexibility of the cured resin product obtained from the epoxy resin was improved and the occurrence of package crack was controlled. In addition, it can be noted from FIG. 23 that in these examples, there were obtained cured resin products with better moisture resistance than the cured products obtained from the compositions in Examples 79 to 87.

Examples 103 to 107 and Comparative Examples 43 and 44

Figure 24:
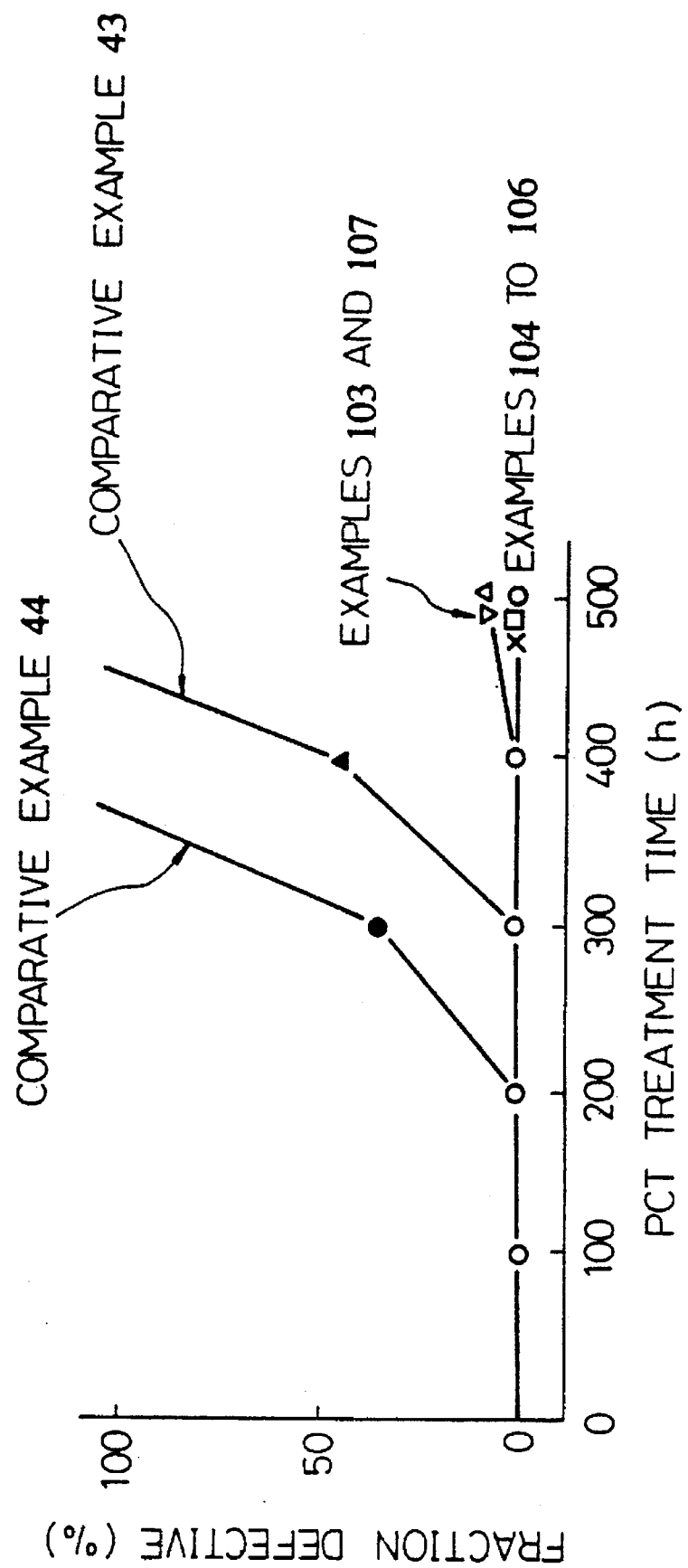

Compounds having the compounding ratios set forth in Table 19 were prepared in the same manner as in Examples 88 to 92, with the exception that epoxy functional group-containing silicone rubber powder ("Torayfil E-601" produced by Toray-Dow Corning K.K.) was used as a flexibilizer, and the properties of the cured test pieces obtained from these compositions were evaluated. The results are set forth in Table 19 and FIG. 24.

TABLE 19

|  | Ex. 103 | Ex. 104 | Ex. 105 | Ex. 106 | Ex. 107 | CE 43 | CE 44 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| epoxy functional group-containing silicone powder | 5 | 20 | 40 | 60 | 80 | 2 | 90 |
| Glass transition temperature (°C.) | 195 | 190 | 187 | 180 | 175 | 195 | 160 |
| Flexural strength (kg/mm$^2$) | | | | | | | |
| 25° C. | 8 | 9 | 9 | 8 | 8 | 7 | 6 |
| 250° C. | 7 | 7 | 6 | 6 | 5 | 5 | 1 |
| Crack | o | o | o | o | o | o | o |
| Water absorption ratio (%) | 0.5 | 0.5 | 0.4 | 0.4 | 0.5 | 0.5 | 0.6 |
| Flexural modulus (kg/mm$^2$) | 610 | 580 | 550 | 490 | 470 | 620 | 320 |
| Gel time (s) | 390 | 405 | 410 | 420 | 425 | 385 | 440 |
| Package crack | o | o | o | o | o | x | x |

Ex. = Example
CE = Comparative Example
o . . . Crack or package crack did not occur.
x . . . Crack or package crack occurred.

It is clearly seen from Table 19 that by the addition of epoxy functional group-containing silicone rubber powder as a flexibilizer to the epoxy resin in an amount ranging from 5 to 80 parts based on 100 parts of the epoxy resin, the flexibility of the cured resin product obtained from the epoxy resin was improved and the occurrence of package crack was controlled. In addition, it can be noted from FIG. 24 that in these examples, there were obtained cured resin products with better moisture resistance than the cured resin products obtained from the compositions in Examples 79 to 87.

Examples 108 to 112 and Comparative Examples 45 and 46

Figure 25:
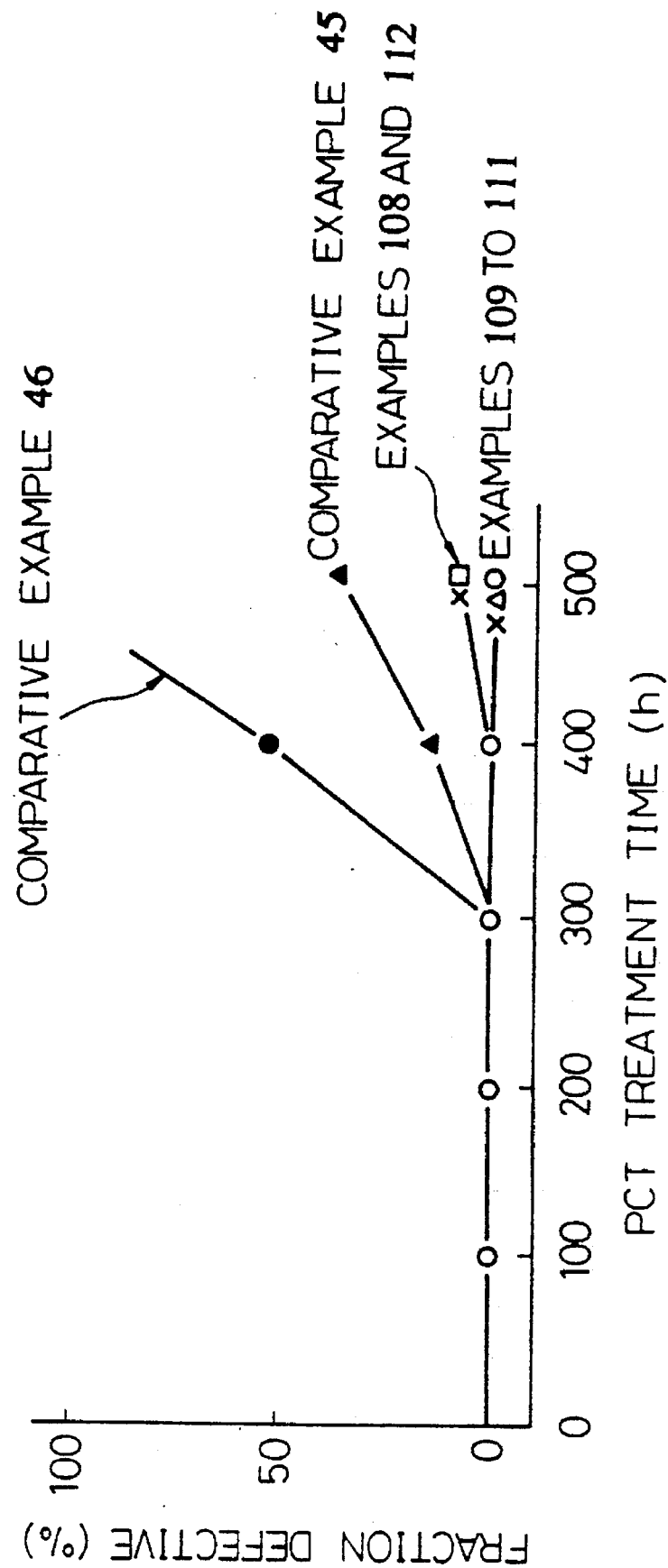

Compounds having the compounding ratios set forth in Table 20 were prepared in the same manner as in Examples 88 to 92, with the exception that a silicon-modified epoxy resin ("SIN-620" produced by Dai-Nippon Ink Kagaku K.K.) was used as a flexibilizer, and the properties of the cured test pieces obtained from these compositions were evaluated. The results are set forth in Table 20 and FIG. 25.

sumori K.K.) as an inorganic filler, and these substances were together kneaded in a pressure kneader, so that compositions having the compounding ratios set forth in Table 21 were prepared.

TABLE 20

|  | Ex. 108 | Ex. 109 | Ex. 110 | Ex. 111 | Ex. 112 | CE 45 | CE 46 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| silicone-modified epoxy resin | 5 | 20 | 40 | 60 | 80 | 2 | 90 |
| Glass transition temperature (°C.) | 195 | 190 | 187 | 180 | 175 | 195 | 160 |
| Flexural strength (kg/mm$^2$) | | | | | | | |
| 25° C. | 7 | 8 | 8 | 7 | 6 | 6 | 4 |
| 250° C. | 6 | 6 | 6 | 5 | 4 | 4 | 1 |
| Crack | o | o | o | o | o | o | o |
| Water absorption ratio (%) | 0.5 | 0.5 | 0.4 | 0.4 | 0.5 | 0.5 | 0.6 |
| Flexural modulus (kg/mm$^2$) | 620 | 600 | 580 | 550 | 500 | 630 | 430 |
| Gel time (s) | 400 | 400 | 410 | 415 | 420 | 390 | 495 |
| Package crack | o | o | o | o | o | x | x |

Ex. = Example
CE = Comparative Example
o . . . Crack or package crack did not occur.
x . . . Crack or package crack occurred.

It is clearly seen from Table 20 that by the addition of a silicon-modified epoxy resin as a flexibilizer to the epoxy resin in an amount ranging from 5 to 80 parts based on 100 parts of the epoxy resin, the flexibility of the cured resin product obtained from the epoxy resin was improved and the occurrence of package crack was controlled. In addition, it can be noted from FIG. 25 that in these examples, there were obtained cured resin products with better moisture resistance than the cured resin products obtained from the compositions in Examples 79 to 87.

Examples 113 to 117 and Comparative Examples 47 and 48

Figure 26:
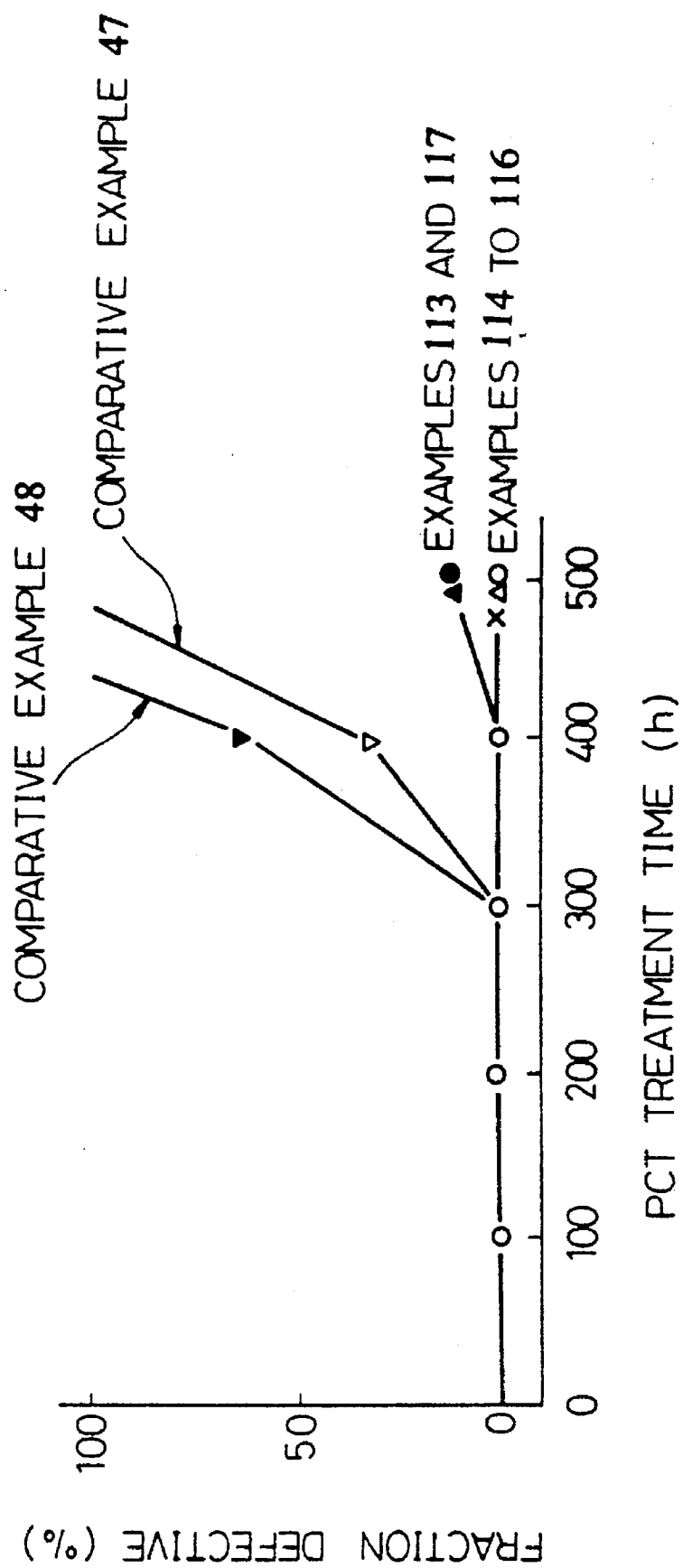

In these examples, to a mixture of a cresol novolak type epoxy resin, a polyallyl phenol and a polyphenol, there was further added powdery silica ("RD-8" produced by Tat- Test pieces were prepared from the obtained compositions, respectively, in accordance with the procedures explained in Examples 79 to 87, and the properties of the cured resin products obtained from these compounds were evaluated in the same manner as in Examples 79 to 87. The results are set forth in Table 21 and FIG. 26. In Table 21, the viscosities of the prepared compositions are also set forth.

TABLE 21

|  | Ex. 113 | Ex. 114 | Ex. 115 | Ex. 116 | Ex. 117 | CE 47 | CE 48 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| silica (%) | 30 | 40 | 60 | 70 | 85 | 10 | 90 |
| Glass transition temperature (°C.) | 185 | 186 | 185 | 185 | 185 | 184 | 186 |
| Flexural strength (kg/mm$^2$) | | | | | | | |
| 25° C. | 13 | 14 | 16 | 17 | 17 | 9 | 13 |
| 250° C. | 9 | 9 | 10 | 10 | 11 | 3 | 9 |
| Crack | o | o | o | o | o | o | x |
| Water absorption ratio (%) | 0.3 | 0.2 | 0.2 | 0.1 | 0.1 | 0.5 | 0.1 |
| Flexural modulus (kg/mm$^2$) | 800 | 1000 | 1200 | 1400 | 1800 | 700 | 1900 |
| Gel time (s) | 370 | 365 | 360 | 350 | 340 | 380 | 320 |
| Package crack | o | o | o | o | o | x | x |
| Viscosity (P) | 150 | 320 | 360 | 430 | 510 | 120 | 1300 |

Ex. = Example
CE = Comparative Example
o . . . Crack or package crack did not occur.
x . . . Crack or package crack occurred.

It is clearly seen from Table 21 that when an inorganic filler is added to the composition in an amount ranging from 20 to 85% by weight based on the total weight of the composition, the mechanical strength of the cured product obtained from the composition can be advantageously improved without greatly lowering the flowability of the composition. In addition, it is noted from FIG. 26 that the moisture resistance of the cured products is also good.

Examples 118 to 126 and Comparative Examples 49 and 52

Figure 27:
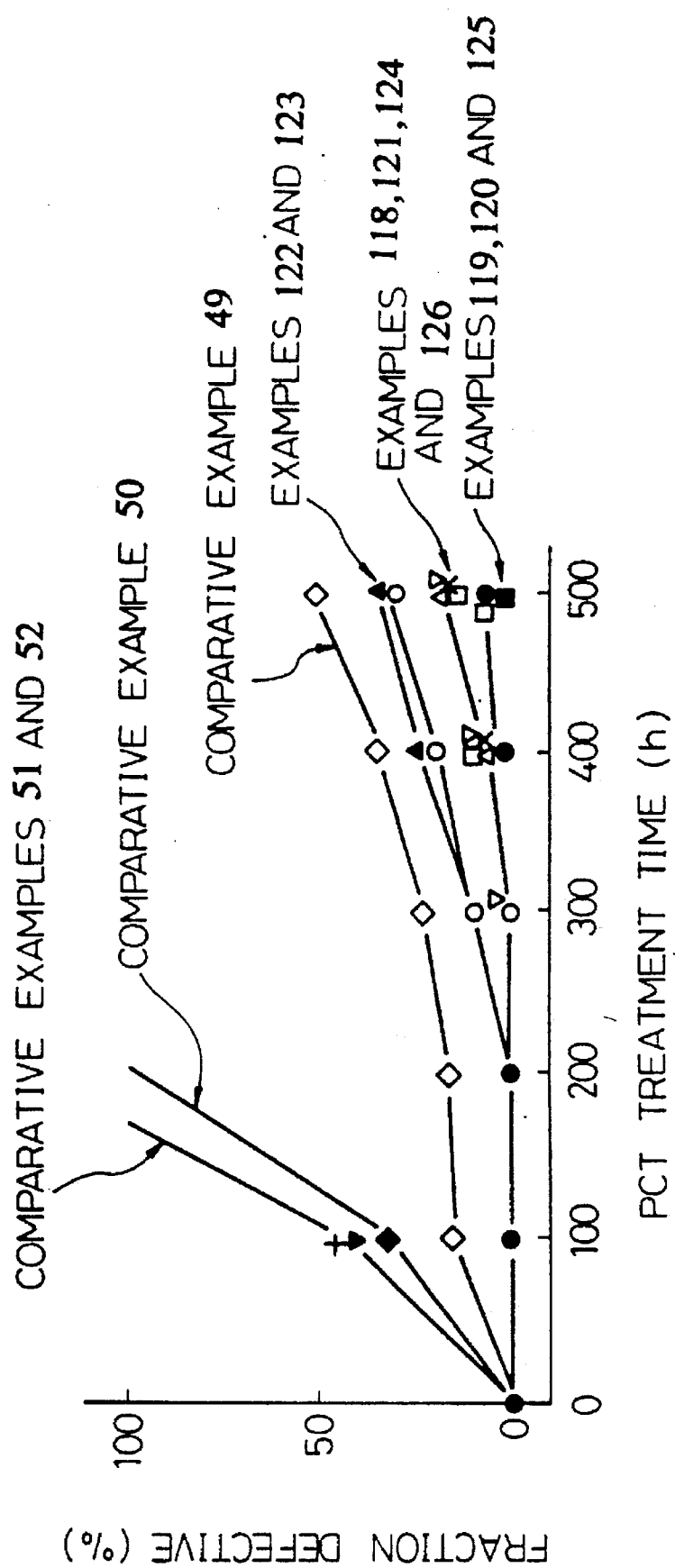

Compositions were prepared in the same manner as in Examples 79 to 87 with the exception that a biphenyl type epoxy resin was used instead of cresol novolak type epoxy resin, and the various properties of the cured test pieces obtained from the compositions were evaluated. The prepared compositions were as set forth in Table 22. The obtained results are set forth in Table 22 and FIG. 27.

recognized also in moisture resistance. However, in the compositions of Examples 118 to 126, some package cracks were caused under solder bath immersion conditions after particularly severe PCT treatment, like in the compositions of Examples 79 to 87.

Examples 127 to 131 and Comparative Examples 53 and 54

The procedures in Examples 118 to 126 were repeated with the exception that to a mixture of a polyallyl phenol and polyphenol, there was further added a polystyrene/polybutadiene/polystyrene terminal block copolymer

TABLE 22

|  | Ex. 118 | Ex. 119 | Ex. 120 | Ex. 121 | Ex. 122 | Ex. 123 | Ex. 124 | Ex. 125 | Ex. 126 | CE 49 | CE 50 | CE 51 | CE 52 |
|---|---|---|---|---|---|---|---|---|---|---|---|---|---|
| Composition (parts) | | | | | | | | | | | | | |
| epoxy resin | 100 | 100 | 100 | 100 | 100 | 100 | 100 | 100 | 100 | 100 | 100 | 100 | 100 |
| polyallyl phenol | 70 | 70 | 70 | 70 | 70 | 5 | 50 | 100 | 200 | 70 | 70 | 2 | 210 |
| polyphenol | 5 | 50 | 100 | 150 | 200 | 50 | 50 | 50 | 50 | 2 | 210 | 50 | 50 |
| Glass transition temperature (°C.) | 190 | 217 | 220 | 225 | 240 | 223 | 220 | 200 | 183 | 180 | 135 | 223 | 135 |
| Flexural strength (kg/mm$^2$) | | | | | | | | | | | | | |
| 25° C. | 9 | 10 | 11 | 14 | 13 | 10 | 10 | 10 | 9 | 7 | 6 | 5 | 4 |
| 250° C. | 6 | 7 | 8 | 11 | 10 | 8 | 8 | 8 | 7 | 4 | 3 | 2 | 1 |
| Flexural modulus (kg/mm$^2$) | 590 | 630 | 670 | 710 | 770 | 720 | 663 | 610 | 560 | 570 | 810 | 790 | 410 |
| Crack | o | o | o | o | o | o | o | o | o | o | x | x | x |
| Water absorption ratio (%) | 0.4 | 0.4 | 0.5 | 0.5 | 0.6 | 0.4 | 0.3 | 0.3 | 0.3 | 0.4 | 0.8 | 1.0 | 0.9 |
| Gel time (s) | 420 | 400 | 390 | 360 | 310 | 370 | 380 | 390 | 410 | 570 | 240 | 380 | 400 |
| Package crack | x | x | x | x | x | x | x | x | x | x | x | x | x |

Ex. = Example
CE = Comparative Example
o . . . Crack or package crack did not occur.
x . . . Crack or package crack occurred.

Figure 28:
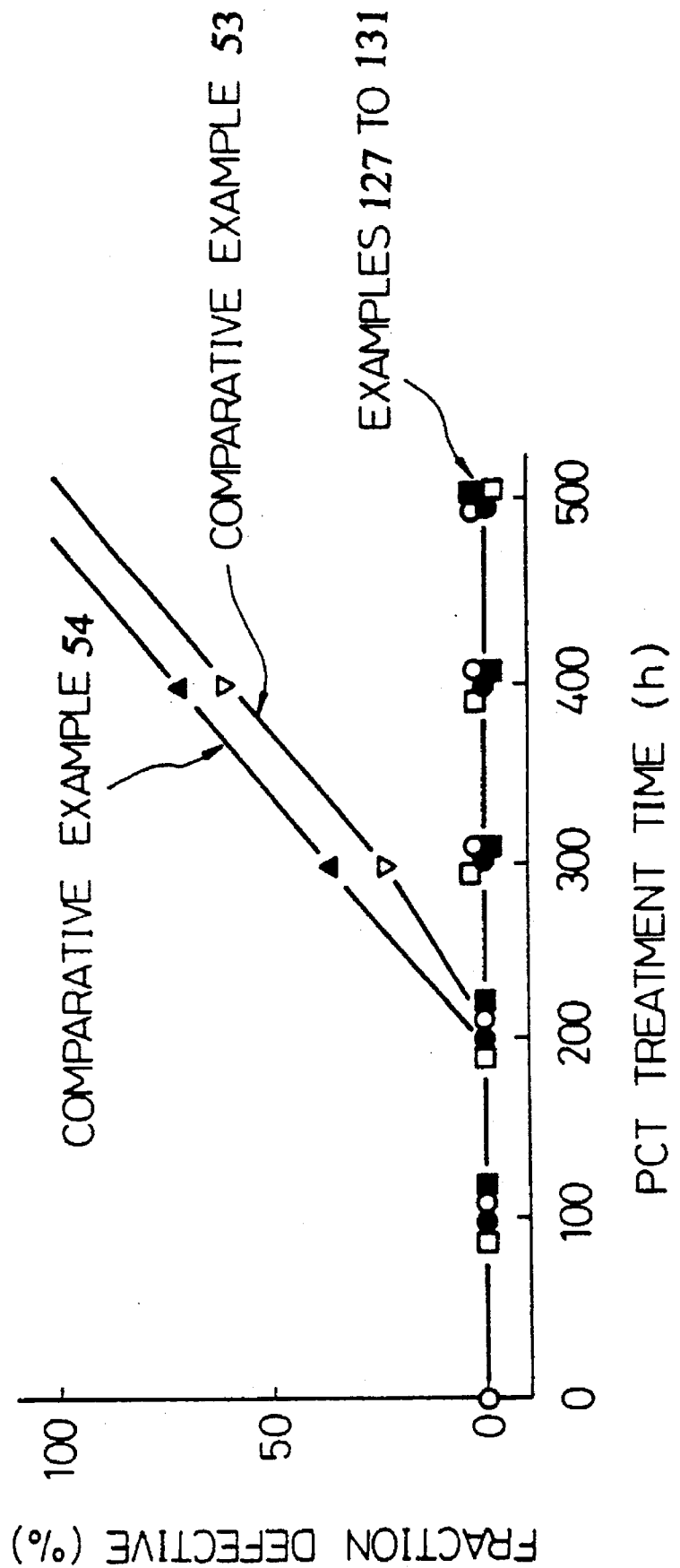

It can be seen from Table 22 that by the change of the substratal resin into a biphenyl type epoxy resin, the heat resistance of the cured products was furthermore improved. In addition, from FIG. 27, a significant improvement is ("Kraton G-1652" produced by Shell Kagaku K.K.) as a flexibilizer, so as to prepare compositions. The prepared compositions are as set forth in Table 23, and the obtained results are set forth in Table 23 and FIG. 28.

TABLE 23

|  | Ex. 127 | Ex. 128 | Ex. 129 | Ex. 130 | Ex. 131 | CE 53 | CE 54 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| polystyrene/polybutadiene/polystyrene terminal block copolymer | 5 | 20 | 40 | 60 | 80 | 2 | 90 |
| Glass transition temperature (°C.) | 185 | 182 | 180 | 178 | 175 | 190 | 142 |
| Flexural strength (kg/mm$^2$) | | | | | | | |
| 25° C. | 10 | 10 | 9 | 9 | 8 | 9 | 4 |
| 250° C. | 8 | 9 | 7 | 6 | 5 | 8 | 1 |

TABLE 23-continued

|  | Ex. 127 | Ex. 128 | Ex. 129 | Ex. 130 | Ex. 131 | CE 53 | CE 54 |
|---|---|---|---|---|---|---|---|
| Crack | o | o | o | o | o | o | o |
| Water absorption ratio (%) | 0.5 | 0.5 | 0.5 | 0.6 | 0.6 | 0.4 | 0.8 |
| Flexural modulus (kg/mm$^2$) | 595 | 570 | 550 | 490 | 450 | 620 | 300 |
| Gel time (s) | 400 | 410 | 420 | 420 | 425 | 395 | 455 |
| Package crack | o | o | o | o | o | x | x |

Ex. = Example
CE = Comparative Example
o . . . Crack or package crack did not occur.
x . . . Crack or package crack occurred.

It is clearly seen from Table 23 that by the addition of a polystyrene/polybutadiene/polystyrene terminal block copolymer to the epoxy resin in an amount ranging from 5 to 80 parts based on 100 parts of the epoxy resin, the flexibility of the cured product obtained from the epoxy resin was improved and the occurrence of package crack was controlled. In addition, it can be noted from FIG. 28 that in these examples, there were obtained cured resin products with better moisture resistance than the cured products obtained from the compositions in Examples 118 to 126.

Examples 132 to 136 and Comparative Examples 55 and 56

Figure 29:
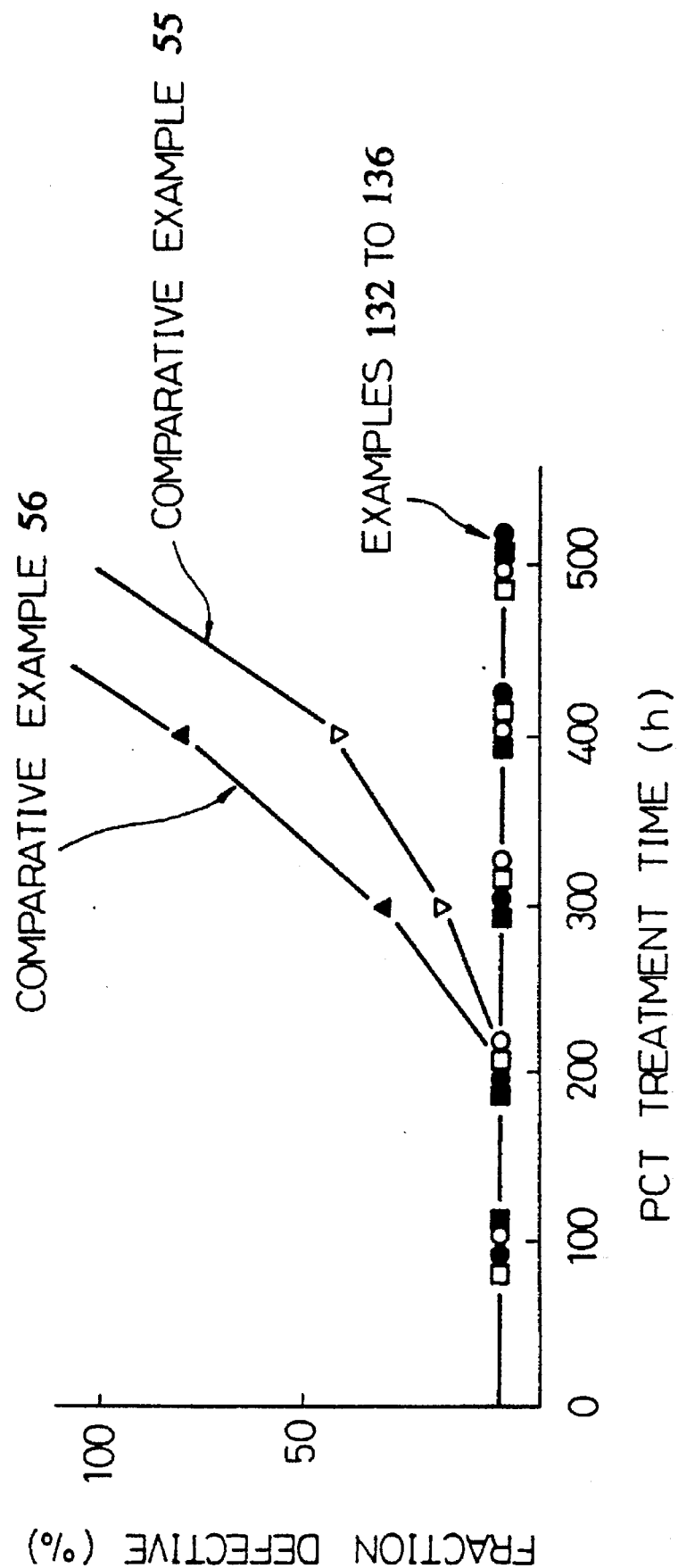

Compounds having the compounding ratios set forth in Table 24 were prepared in the same manner as in Examples 127 and 131, with the exception that an ethylene/propylene type copolymer ("JSR 57P" produced by Nippon Gosei Gomu K.K.) was used as a flexibilizer, and the properties of the cured test pieces obtained from these compositions were evaluated. The results are set forth in Table 24 and FIG. 29.

It is clearly seen from Table 24 that by the addition of an ethylene/propylene type copolymer as a flexibilizer to the epoxy resin in an amount ranging from 5 to 80 parts based on 100 parts of the epoxy resin, the flexibility of the cured resin product obtained from the epoxy resin was improved and the occurrence of package crack was controlled. In addition, it can be noted from FIG. 29 that in these examples, there were obtained cured resin products with better moisture resistance than the cured products obtained from the compositions in Examples 118 to 126.

Examples 137 to 141 and Comparative Examples 57 and 58

Figure 30:
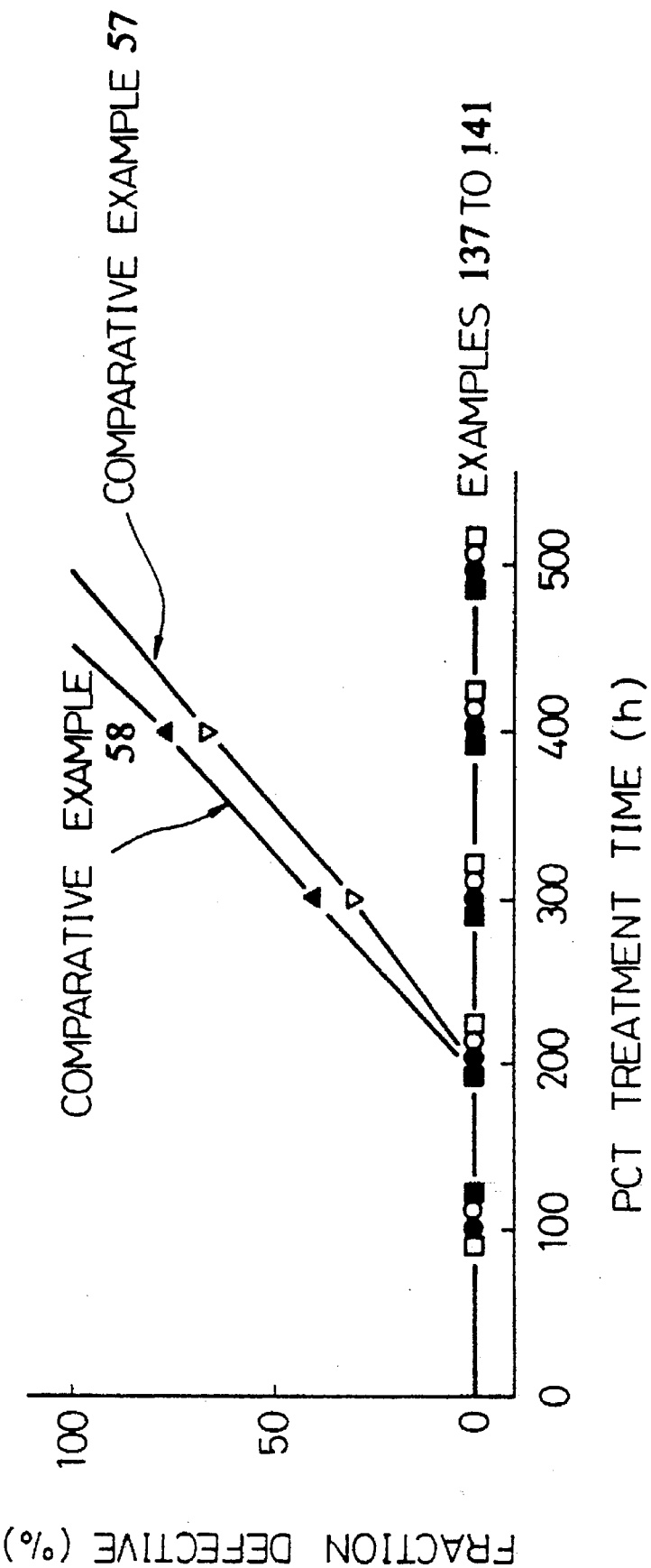

Compounds having the compounding ratios set forth in Table 25 were prepared in the same manner as in Examples 127 to 131, with the exception that an ethylene/α-olefin copolymer ("Tafmer PP-0280" produced by Mitsubishi Sekiyu Kagaku K.K.) as a flexibilizer, and the properties of the cured test pieces obtained from these compositions were evaluated. The results are set forth in Table 25 and FIG. 30.

TABLE 24

|  | Ex. 132 | Ex. 133 | Ex. 134 | Ex. 135 | Ex. 136 | CE 55 | CE 56 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| ethylene/propylene type copolymer | 5 | 20 | 40 | 60 | 80 | 2 | 90 |
| Glass transition temperature (°C.) | 185 | 182 | 178 | 175 | 170 | 185 | 130 |
| Flexural strength (kg/mm$^2$) | | | | | | | |
| 25° C. | 9 | 9 | 8 | 7 | 6 | 8 | 5 |
| 250° C. | 7 | 7 | 6 | 5 | 4 | 6 | 2 |
| Crack | o | o | o | o | o | o | o |
| Water absorption ratio (%) | 0.5 | 0.5 | 0.5 | 0.6 | 0.6 | 0.4 | 0.7 |
| Flexural modulus (kg/mm$^2$) | 600 | 585 | 560 | 510 | 455 | 610 | 320 |
| Gel time (s) | 400 | 410 | 415 | 420 | 420 | 390 | 345 |
| Package crack | o | o | o | o | o | x | x |

Ex. = Example
CE = Comparative Example
o . . . Crack or package crack did not occur.
x . . . Crack or package crack occurred.

TABLE 25

|  | Ex. 137 | Ex. 138 | Ex. 139 | Ex. 140 | Ex. 141 | CE 57 | CE 58 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| α-olefin copolymer | 5 | 20 | 40 | 60 | 80 | 2 | 90 |
| Glass transition temperature (°C.) | 185 | 180 | 178 | 175 | 170 | 185 | 125 |
| Flexural strength (kg/mm$^2$) | | | | | | | |
| 25° C. | 9 | 9 | 8 | 7 | 7 | 8 | 5 |
| 250° C. | 7 | 6 | 5 | 5 | 4 | 4 | 2 |
| Crack | o | o | o | o | o | o | o |
| Water absorption ratio (%) | 0.5 | 0.5 | 0.5 | 0.6 | 0.6 | 0.4 | 0.8 |
| Flexural modulus (kg/mm$^2$) | 595 | 575 | 565 | 520 | 465 | 610 | 310 |
| Gel time (s) | 400 | 410 | 420 | 425 | 440 | 390 | 490 |
| Package crack | o | o | o | o | o | x | x |

Ex. = Example
CE = Comparative Example
o ... Crack or package crack did not occur.
x ... Crack or package crack occurred.

It is clearly seen from Table 25 that by the addition of an ethylene/α-olefin copolymer as a flexibilizer to the epoxy resin in an amount ranging from 5 to 80 parts based on 100 parts of the epoxy resin, flexibility of the cured resin product obtained from the composition was improved and the occurrence of package crack was controlled. In addition, it can be noted from FIG. 30 that in these examples, there were obtained cured resin products with outstandingly good moisture resistance as compared with the cured products obtained from the compositions in Examples 118 to 126.

Examples 142 to 146 and Comparative Examples 59 and 60

Figure 31:
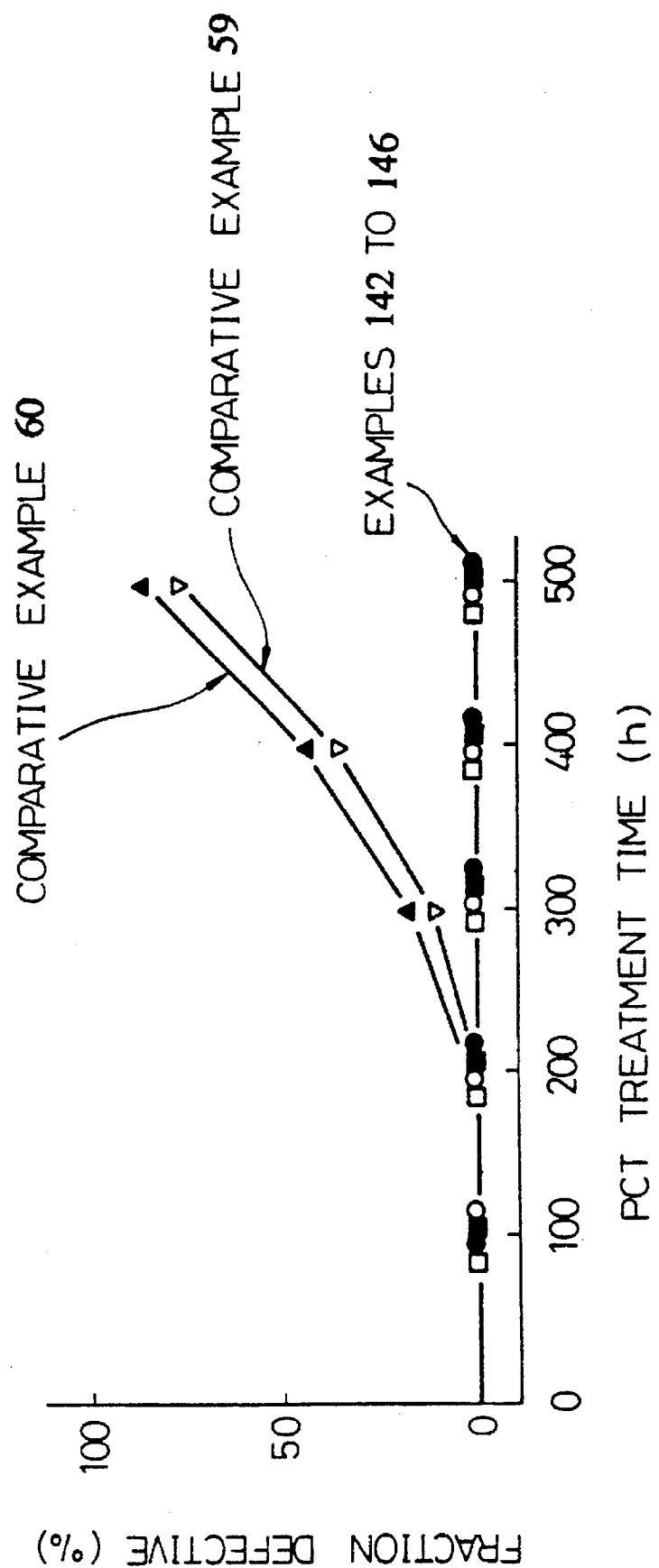

Compounds having the compounding ratios set forth in Table 26 were prepared in the same manner as in Examples 127 to 131, with the exception that epoxy functional group-containing silicone rubber powder ("Torayfil E-601" produced by Toray-Dow Corning K.K.) was used as a flexibilizer, and the properties of the cured test pieces obtained from these compositions were evaluated. The results are set forth in Table 26 and FIG. 31.

TABLE 26

|  | Ex. 142 | Ex. 143 | Ex. 144 | Ex. 145 | Ex. 146 | CE 59 | CE 60 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| epoxy functional group-containing silicone powder | 5 | 20 | 40 | 60 | 80 | 2 | 90 |
| Glass transition temperature (°C.) | 190 | 185 | 180 | 175 | 173 | 190 | 155 |
| Flexural strength (kg/mm$^2$) | | | | | | | |
| 25° C. | 9 | 10 | 10 | 9 | 8 | 8 | 6 |
| 250° C. | 7 | 8 | 8 | 7 | 6 | 5 | 3 |
| Crack | o | o | o | o | o | o | o |
| Water absorption ratio (%) | 0.4 | 0.3 | 0.3 | 0.3 | 0.3 | 0.4 | 0.5 |
| Flexural modulus (kg/mm$^2$) | 600 | 575 | 545 | 480 | 465 | 610 | 310 |
| Gel time (s) | 400 | 410 | 420 | 430 | 435 | 390 | 450 |
| Package crack | o | o | o | o | o | x | x |

Ex. = Example
CE = Comparative Example
o ... Crack or package crack did not occur.
x ... Crack or package crack occurred.

It is clearly seen from Table 26 that by the addition of epoxy functional group-containing silicone rubber powder as a flexibilizer to the epoxy resin in an amount ranging from 5 to 80 parts based on 100 parts of the epoxy resin, the flexibility of the cured resin product obtained from the epoxy resin composition was improved and the occurrence of package crack was controlled. In addition, it can be noted from FIG. 31 that in these examples, there were obtained cured resin products with outstandingly good moisture resistance as compared with the cured products obtained from the compositions in Examples 118 to 126.

Examples 147 to 151 and Comparative Examples 61 and 62

Figure 32:
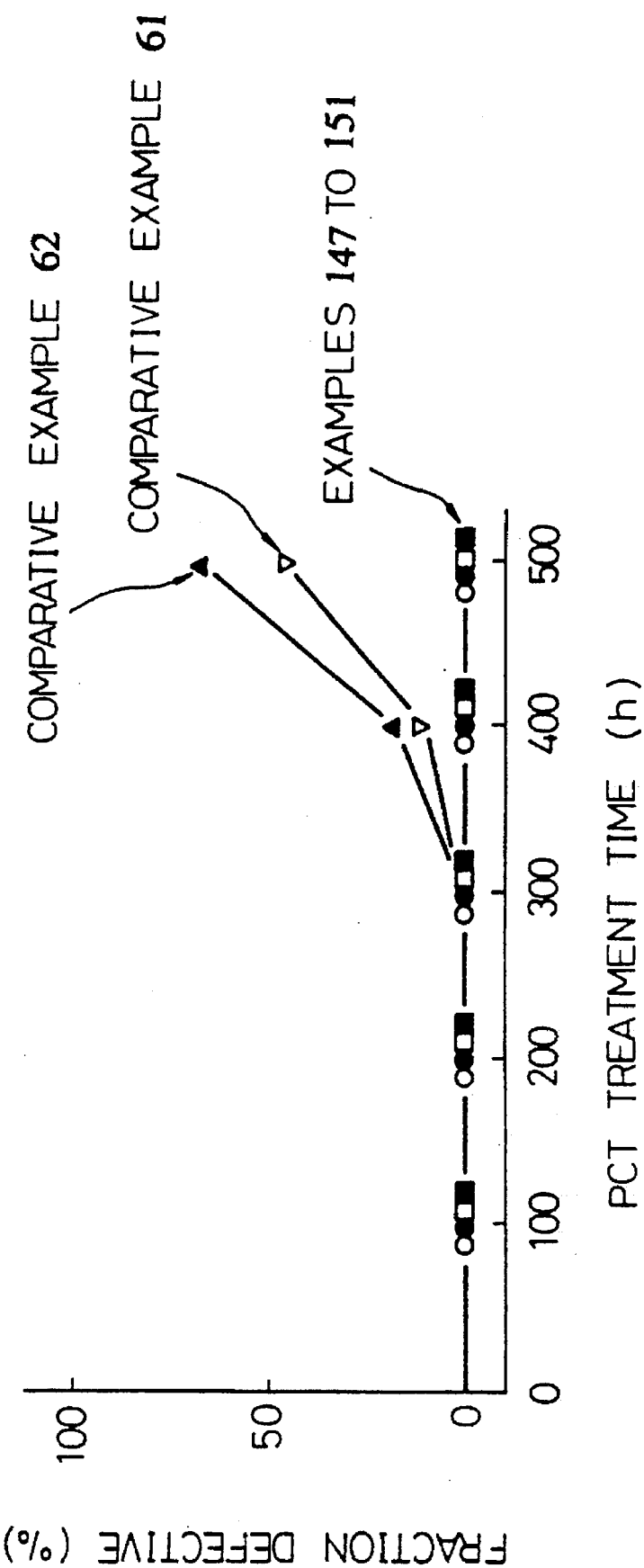

Compounds having the compounding ratios set forth in Table 27 were prepared in the same manner as in Examples 127 to 131, with the exception that a silicon-modified epoxy resin ("SIN-620" produced by Dai-Nippon Ink Kagaku K.K.) was used as a flexibilizer, and the properties of the cured test pieces obtained from these compositions were evaluated. The results are set forth in Table 27 and FIG. 32.

added powdery silica ("RD-8" produced by Tatsumori K.K.) as an inorganic filler, and these substances were together

TABLE 27

|  | Ex. 147 | Ex. 148 | Ex. 149 | Ex. 150 | Ex. 151 | CE 61 | CE 62 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 70 |
| polyphenol | 50 | 50 | 50 | 50 | 50 | 50 | 50 |
| silicon-modified epoxy resin | 5 | 20 | 40 | 60 | 80 | 2 | 90 |
| Glass transition temperature (°C.) | 190 | 185 | 184 | 177 | 175 | 190 | 160 |
| Flexural strength (kg/mm$^2$) | | | | | | | |
| 25° C. | 8 | 9 | 9 | 10 | 7 | 6 | 4 |
| 250° C. | 7 | 8 | 8 | 9 | 5 | 5 | 1 |
| Crack | o | o | o | o | o | o | o |
| Water absorption ratio (%) | 0.4 | 0.4 | 0.3 | 0.3 | 0.4 | 0.4 | 0.5 |
| Flexural modulus (kg/mm$^2$) | 610 | 600 | 575 | 545 | 490 | 620 | 420 |
| Gel time (s) | 410 | 410 | 415 | 420 | 427 | 395 | 500 |
| Package crack | o | o | o | o | o | x | x |

Ex. = Example
CE = Comparative Example
o . . . Crack or package crack did not occur.
x . . . Crack or package crack occurred.

It is clearly seen from Table 27 that by the addition of a silicon-modified epoxy resin as a flexibilizer to the epoxy resin in an amount ranging from 5 to 80 parts based on 100 parts of the epoxy resin, the flexibility of the cured resin product obtained from the epoxy resin composition, the flexibility of the cured product obtained from the composition was improved and the occurrence of package crack was controlled. In addition, it can be noted from FIG. 32 that in these examples, there were obtained cured resin products with outstandingly good moisture resistance as compared with the cured resin products obtained from the compositions in Examples 118 to 126.

kneaded in a pressure kneader, so that compositions having the compounding ratios set forth in Table 28 were prepared.

Figure 33:
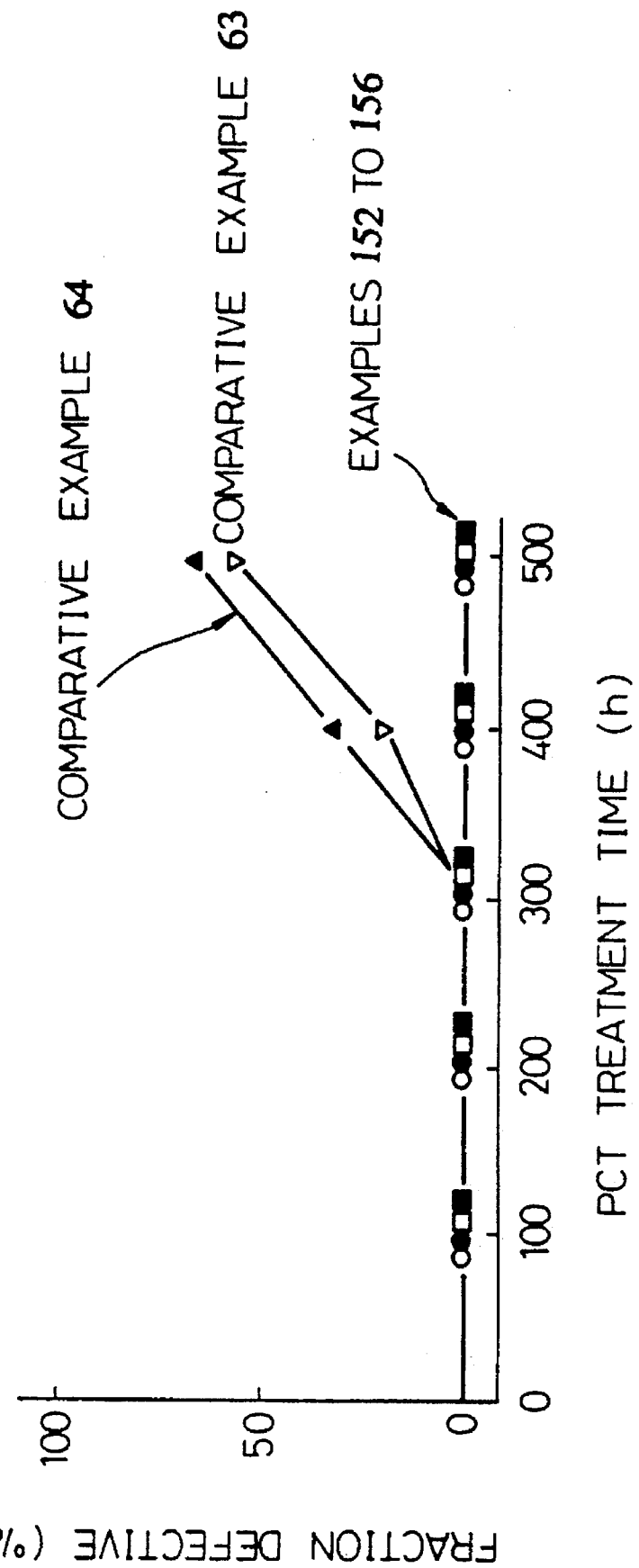

Test pieces were prepared from the obtained compositions, respectively, in accordance with the procedures explained in Examples 118 to 126, and the properties of the cured resin products obtained from these compositions were evaluated in the same manner as in Examples 79 to 87. The results are set forth in Table 28 and FIG. 33. In Table 28, viscosities of the prepared compositions are also set forth.

TABLE 28

|  | Ex. 152 | Ex. 153 | Ex. 154 | Ex. 155 | Ex. 156 | CE 63 | CE 64 |
|---|---|---|---|---|---|---|---|
| Composition (parts) | | | | | | | |
| epoxy resin | 100 | 100 | 100 | 100 | 100 | 100 | 100 |
| polyallyl phenol | 70 | 70 | 70 | 70 | 70 | 70 | 30 |
| polyphenol | 50 | 50 | 50 | 50 | 50 | 50 | 50 |
| silica (%) | 30 | 40 | 60 | 70 | 85 | 10 | 90 |
| Glass transition temperature (°C.) | 180 | 180 | 180 | 180 | 183 | 185 | 185 |
| Flexural strength (kg/mm$^2$) | | | | | | | |
| 25° C. | 14 | 15 | 17 | 18 | 19 | 9 | 14 |
| 250° C. | 12 | 13 | 15 | 16 | 15 | 6 | 10 |
| Crack | o | o | o | o | o | o | x |
| Water absorption ratio (%) | 0.2 | 0.2 | 0.1 | 0.1 | 0.1 | 0.4 | 0.1 |
| Flexural modulus (kg/mm$^2$) | 800 | 980 | 1100 | 1400 | 1700 | 670 | 1800 |
| Package crack | o | o | o | o | o | x | x |
| Viscosity (P) | 110 | 120 | 200 | 240 | 300 | 80 | 1000 |

Ex. = Example
CE = Comparative Example
o . . . Crack or package crack did not occur.
x . . . Crack or package crack occurred.

Examples 152 to 156 and Comparative Examples 63 and 64

In these examples, to a mixture of a biphenyl type epoxy resin, a polyallyl phenol and a polyphenol, there was further It is clearly seen from Table 28 that when an inorganic filler is added to the composition in an amount ranging from 20 to 85% by weight based on the total weight of the composition, the mechanical strength of the cured resin product obtained from the composition can be advantageously improved without greatly lowering the flowability of the composition. In addition, it is noted from FIG. 33 that the moisture resistance of the cured resin product is remarkably good.

As explained in detail in the foregoing, the epoxy resin composition of the present invention, comprising an epoxy resin as a substratal resin, a polyallyl phenol curing agent and a polyphenol curing auxiliary agent, is excellent in curability, and can produce therefrom cured resin products excellent in heat resistance. Accordingly, the present epoxy resin composition is very useful as multilayer laminate resins, electroconductive pastes, protective films for electronic devices, sealing materials, adhesives, coatings and molding materials, which are used in electronic·electric equipments, transportation equipments or the like.

In addition, the epoxy resin composition of the present invention, comprising further added a polyallyl phenol curing agent and a polyphenol curing auxiliary agent can produce therefrom a cured resin product with sufficient flexibility for displaying or exhibiting excellent crack resistance. In addition, the present epoxy resin composition with an added inorganic filler can produce therefrom a cured product with excellent mechanical strength.

In the composition of the present invention, examples of the epoxy resin having a naphthalene skeleton used as a substratal resin include epoxy resins represented by the following formula XII:

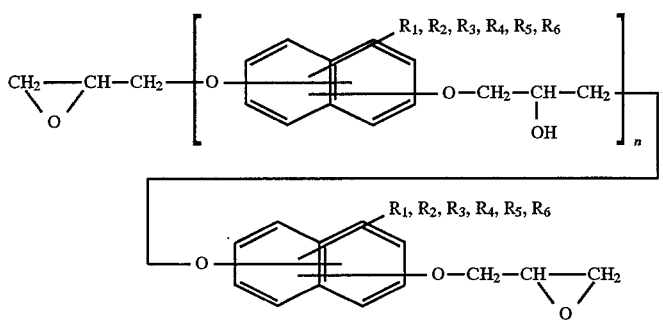

wherein $R_1$, $R_2$, $R_3$, $R_4$, $R_5$ and $R_6$ which may be the same or different each represents a hydrogen atom, a halogen atom or an alkyl group having 1 to 4 carbon atoms and n is 0 to 10, provided that at least one of $R_1$ to $R_6$ represents a halogen atom or an alkyl group having 1 to 4 carbon atoms, and epoxy resins represented by the following formula XIII:

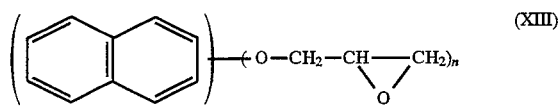

wherein n is 2 or 3.

As described in Japanese Patent Unexamined Patent Publication (Kokai) Nos. 61-73719, 1-268712 and 1-268715, these epoxy resins are produced by reacting dihydroxynaphthalane or trihydroxynaphthalene with epichlorohydrin. Examples of the dihydroxynaphthalene include compounds represented by the following formula XIV:

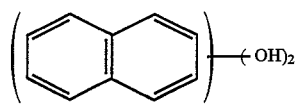

or compounds represented by the following formula XV:

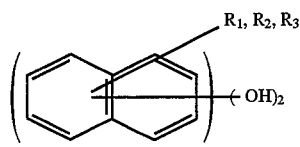

wherein $R_1$, $R_2$, $R_3$, $R_4$, $R_5$ and $R_6$ which may be the same or different each represents a hydrogen atom, a halogen atom or an alkyl group having 1 to 4 carbon atoms, provided that at least one of $R_1$ to $R_6$ represents a halogen atom or an alkyl group having 1 to 4 carbon atoms. The trihydroxy naphthalene includes compounds represented by the following formula XVI:

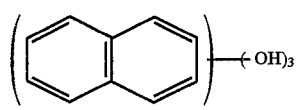

or compounds represented by the following formula (XVII):

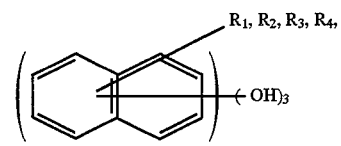

wherein $R_1$, $R_2$, $R_3$, $R_4$ and $R_5$ which may be the same or different each represents a hydrogen atom, a halogen atom or an alkyl group having 1 to 4 carbon atoms, provided that at least one of $R_1$ to $R_5$ represents a halogen atom or an alkyl group having 1 to 4 carbon atoms.

Since the substratal resin according to the present invention has a naphthalene skeleton, an improvement in the heat resistance and hydrophobicity of the cured product can be attained over cured products of conventional resins widely used in the art, such as bisphenol A epoxy resin, cresol novolak epoxy resin and phenol novolak epoxy resin. With respect to the structure of the substratal resin, any of a bifunctional type and a polyfunctional type including a novolak structure may be applied to the composition of the present invention so far as the resin is an epoxy resin having a naphthalene skeleton.

The use of polyallylphenol as the curing agent can improve the hydrophobicity of the cured product by virtue of the presence of the allyl group and further imparts flexibility of the cured product, which can contribute also to an improvement in the toughness. In general, there is a tendency that the addition of an elastomer for the purpose of imparting the flexibility gives rise to a lowering in the moisture resistance. However, the allyl group in the polyallylphenol can prevent the lowering in the moisture resistance. Such a polyallylphenol is a compound having in its repeating unit a plurality of constitutive units represented by the following formula XVIII:

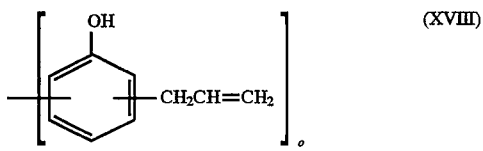

Examples of the compound of this type include compounds represented by the following formula XIX:

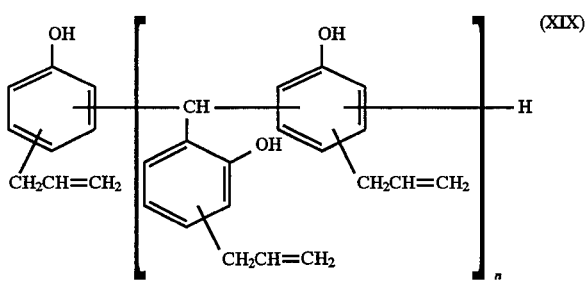

wherein n is an integer of 1 to 5, and compounds represented by the following formula XX:

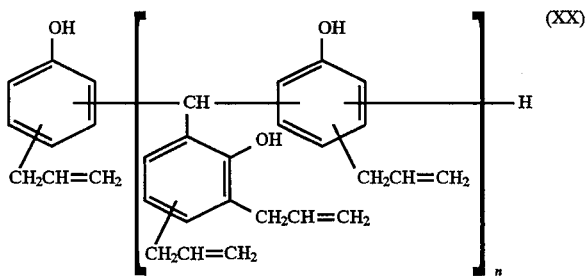

wherein n is an integer of 1 to 5.

The above-described polyallyl phenol is incorporated in an amount of 30 to 120 parts based on 100 parts of the epoxy resin in the composition. When the amount of incorporation is less than 30 parts, no effect can be attained by the addition. On the other hand, when the amount of incorporation exceeds 120 parts, unfavorable phenomena, such as phase separation, occur, which gives rise to a deterioration in properties, such as heat resistance and moisture resistance.

As described above, in the present invention, the use of polyallylphenol as the curing agent can impart flexibility to the cured product. When the flexibility is still unsatisfactory, the following flexibilizers may be added according to need. Examples of a flexibilizer or plasticizer include rubbers, such as natural rubber, isoprene rubber, styrene-butadiene rubber, butadiene rubber, butyl rubber, ethylene-propylene rubber, chloroprene rubber, acrylonitrile butadiene rubber, hydrogenated nitrile rubber, silicone rubber, acrylic rubber, epichlorohydrin rubber, fluororubber, chlorosulfonated polyethylene, chlorinated polyethylene and polyetheric special rubber, block polymer type elastomers, such as those having a styrene-butadiene-sytrene structure, urethane thermoplastic elastomers produced by a polyaddition reaction wherein use is made of a short-chain glycol and a diisocyanate as a hard phase and a long-chain polyol as a soft phase and ester thermoplastic elastomers produced by a polycondensation reaction wherein use is made of polybutylene terephthalate as a hard phase and a long-chain polyol or a polyester as a soft phase, olefin thermoelastomers including a blend of polypropylene with ethylene-propylene rubber, 1,2-polybutadiene thermoplastic elastomers and silicone-modified epoxy resins. Particularly preferred examples of the flexibilizer include polystyrene/polybutadiene/polystyrene terminal block copolymer, ethylene/propylene-based terpolymer, ethylene/α-olefin copolymer, epoxy-containing silicone rubber powder, silicone-modified epoxy resin and butadiene/acrylonitrile copolymer.

Examples of the butadiene/acrylonitrile copolymer include copolymers represented by the following formula:

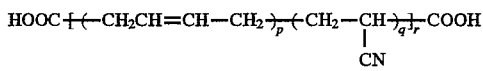

wherein $1 \leq p/q \leq 20$ and r is 5 to 20.

The above-described flexibilizers may have various structures. In fact, they are commercially available in various forms. For instance, the polystyrene/polybutadiene/polystyrene terminal block copolymer is commercially available as "Kraton G-1652" (produced by Shell Kagaku K.K.), the ethylene/propylene type rubber as "JSR 57P" (produced by Nippon Gosei Gomu K.K.), the ethylene/α-olefin copolymer as "Tafmer P P-0280" (produced by Mitsui Sekiyu Kagaku K.K.), the epoxy functional group-containing silicone rubber powder as "Torayfil E 601" (produced by Toray-Dow Corning K.K.), the silicon-modified epoxy resin as "SIN-620" (produced by Dainippon Ink and Chemicals, Inc.), and the butadiene/acrylonitrile copolymer as CTBN1008 (produced by Ube Industries, Ltd.), respectively.

Any of the above-described flexibilizer is desirably added to the epoxy resin as the substratal resin in an amount ranging from 5 to 80 parts by weight based on 100 parts by weight of the epoxy resin. When this amount is less than 5 parts by weight, the effect of the addition is not exhibited, and when it exceeds 80 parts by weight, the heat resistance of the cured resin product is lowered.

The epoxy resin composition of the present invention may contain an inorganic filler for the purpose of improving the mechanical strength of the cured resin product. As the inorganic filler, there may be mentioned, for example, powdery materials, such as fused silica, crystalline silica, alumina, calcium carbonate and the like. These fillers are added to the epoxy resin composition in an amount ranging preferably from 30 to 95 parts based on the total weight of the composition. When this amount is less than 30 parts, the expected effect cannot be achieved, and when it exceeds 95 parts, the flowability of the composition is lowered to result in the lowering of the workability thereof.

In addition, to the composition of the present invention, there may be optionally added the components mentioned hereinbelow, if occasion demands.

(1) A curing accelerator for promoting the curing reaction of the epoxy resin with a curing agent and a curing auxiliary agent. As the curing accelerator, there are used imidazole type curing accelerators, such as 2-methyl imidazole, phosphine type curing accelerators, such as triphenyl phosphine, and DBU (diazabicycloundecene) type curing accelerators, such as a phenol salt of DBU.

(2) A coupling agent for enhancing the compatibility of the inorganic filler with the resin when the inorganic filler is added to the resin. As the coupling agent, there may be mentioned, e. g., silane type coupling agents, such as 3-aminopropyltriethoxysilane, titanium type coupling agents or the like. Although the amount of the coupling agent to be incorporated in the composition of the present invention varies depending on the kind, amount and specific surface area of the inorganic filler to be used, and the minimum covering area of the coupling agent, it is desirably within the range between about 0.1 and 15 parts, in the present invention.

(3) A mold release auxiliary agent, e. g., carnauba wax, stearic acid or a metal salt thereof or montan wax, may be used.

(4) A colorant, a pigment, a flame-retarding agent and a flame-retarding auxiliary agent, for example, titanium dioxide, carbon black, brominated epoxy resin, antimony trioxide, etc.

The epoxy resin composition of the present invention can be prepared by heating the above-described ingredients at a temperature ranging from about 60° to 120° C. by the use of means such as rolls, kneader, extruder or the like. Furthermore, in the composition of the present invention, it is desirable to carry out postcuring treatment after molding in order to complete the curing reaction of the uncured epoxy resin in the cured resin product or the like. This postcuring subsequent to the molding may be carried out by heat-treating the cured resin product for a predetermined time in a constant temperature bath kept at a temperature substantially equal to the temperature used in the molding.

In the epoxy resin composition according to the present invention, the use of an epoxy resin having a naphthalene skeleton as a substratal resin, the addition of polyallylphenol as a curing agent and the addition of a flexibilizer, for example, a polystyrene/polybutadiene/polystyrene terminal block copolymer, an ethylene/propylene type rubber, an ethylene/α-olefin copolymer, a silicone rubber powder having an epoxy group as a functional group, a particular silicone-modified epoxy resin and a butadiene//acrylonitrile copolymer can effectively serve to improve the heat resistance, moisture resistance, toughness, flexibility, low thermal expansion and crack resistance. Further, the addition of an inorganic filler contributes also to an improvement in the mechanical strength.

The present invention will now be described in more detail with reference to the following Examples and Comparative Examples, though it is not limited to these Examples only.

EXAMPLES

Examples 157 to 161 and Comparative Examples 65 to 67

In the following Examples and Comparative Examples, use was made of the following starting materials.

(1) Epoxy resin having a naphthalene skeleton:

EPICLON EXA-4300 (an epoxy resin produced by co-condensing cresol with β-naphthol in a ratio of 1:1) produced by Dainippon Ink and Chemicals, Inc.

(2) Polyallylphenol [a polyallylphenol represented by the formula II wherein n is 1 to 4 (in all the following Examples, use was made of this polyallylphenol)].

(3) Epoxy resin:

Cresol novolak epoxy resin (EOCN-1025 produced by Nippon Kayaku Co., Ltd.).

The compositions in the following Examples and Comparative Examples were prepared by kneading starting compounds with each other in a pressure kneader. Specimens were prepared as follows.

At the outset, an 8-mesh pass powder was provided from the composition prepared by kneading, transferred to a press mold, subjected to compression molding at 200° C. under a pressure of 80 kg/cm² for 20 min. and further subjected to aftercuring at 200° C. for 8 hrs.

The compositions thus produced were subjected to evaluation of properties as follows.

Glass transition point: this property was determined with a thermomechanical analyzer (produced by Shinku Riko Inc.)

Flexural strength: This property was determined in accordance with the method specified in Japanese Industrial Standards (JIS) K-6911.

Flexural modulus: This property was determined in accordance with the method specified in Japanese Industrial Standards (JIS) K-6911.

Water absorption ratio: This property was determined in accordance with the method specified in Japanese Industrial Standards (JIS) K-6911.

Coefficient of thermal expansion: A coefficient of thermal expansion, α, was determined at a temperature range of from room temperature to the glass transition temperature in the determination of the glass transition temperature.

The results are provided in Table 29.

TABLE 29

|  | Ex. 157 | Ex. 158 | Ex. 159 | Ex. 160 | Ex. 161 | Comp. Ex. 65 | Comp. Ex. 66 | Comp. Ex. 67 |
| --- | --- | --- | --- | --- | --- | --- | --- | --- |
| Composition (parts) | | | | | | | | |
| naphthalene epoxy resin | 100 | 100 | 100 | 100 | 100 | 100 | 100 | 0 |
| cresol novolak epoxy | 0 | 0 | 0 | 0 | 0 | 0 | 0 | 100 |
| polyallylphenol | 30 | 50 | 70 | 90 | 120 | 20 | 130 | 70 |
| Glass transition temperature (°C.) | 180 | 195 | 200 | 215 | 190 | 170 | 173 | 160 |
| Flexural strength (kg/mm²) | | | | | | | | |
| 25° C. | 8 | 9 | 11 | 10 | 8 | 6 | 5 | 7 |
| 250° C. | 5 | .7 | 9 | 8 | 7 | 2 | 2 | 1 |
| Flexural modulus (kg/mm²) | 650 | 630 | 630 | 620 | 600 | 720 | 663 | 610 |
| Water absorption ratio (%) | 0.30 | 0.28 | 0.25 | 0.23 | 0.21 | 0.40 | 0.35 | 0.43 |
| Coefficient of thermal expansion (α) | 5.3 | 5.2 | 4.9 | 5.1 | 5.4 | — | — | 6.2 |

It can be seen from Table 29 that the use of an epoxy resin having a naphthalene skeleton as a substratal resin and polyallylphenol as a curing agent can provide resin compositions having excellent heat resistance, moisture resistance and toughness. Further, it can also be seen that good results can be obtained when the amount of addition of the polyallylphenol is 30 to 120 parts by weight based on 100 parts by weight of the epoxy resin.

Examples 162 to 166 and Comparative Examples 68 and 69

In these Examples, use was made of the following starting materials.

Epoxy resin having a naphthalene skeleton:

thus obtained QFP was subjected to a moisture absorption treatment for 24 hr at a temperature of 121° C. and a relative humidity of 100%, whereafter the thus treated QFP was immersed into a solder bath of 260° C., and the occurrence of cracks was visually observed.

Figure 34:
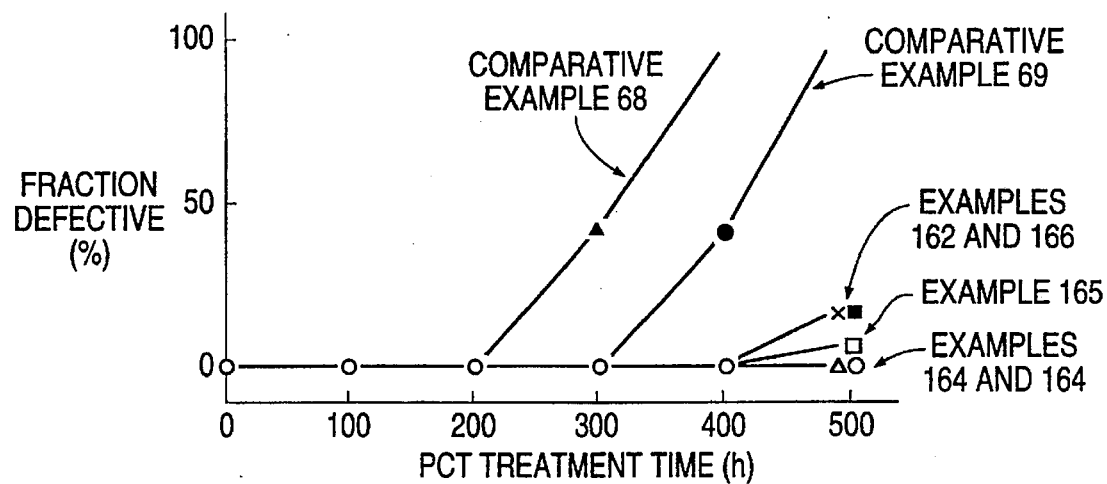
FIG. 34 is a graph showing the relationship between the PCT time (hr) and the fraction defective (%)

The results are given in Table 30 and FIG. 34.

TABLE 30

| | | Ex. 162 | Ex. 163 | Ex. 164 | Ex. 165 | Ex. 166 | Comp. Ex. 68 | Comp. Ex. 69 |
|---|---|---|---|---|---|---|---|---|
| Compo- | naphthalene epoxy resin | 100 | 100 | 100 | 100 | 100 | 100 | 100 |
| sition | polyallylphenol | 70 | 70 | 70 | 70 | 70 | 70 | 70 |
| (parts) | terminal block copolymer | 5 | 20 | 40 | 60 | 80 | 2 | 90 |
| Glass transition temperature (°C.) | | 198 | 195 | 190 | 185 | 178 | 190 | 142 |
| Flexural strength 25° C. | | 11 | 10 | 9 | 9 | 8 | 9 | 4 |
| (kg/mm$^2$) 250° C. | | 8 | 9 | 7 | 6 | 5 | 8 | 1 |
| Flexural modulus (kg/mm$^2$) | | 620 | 600 | 580 | 520 | 490 | 630 | 400 |
| Water absorption ratio (%) | | 0.25 | 0.28 | 0.30 | 0.33 | 0.40 | 0.25 | 0.6 |
| Package crack | | O | O | O | O | O | X | X |

EPICLON EXA-4300 produced by Dainippon Ink and Chemicals, Inc.

Polyallylphenol: the same as described in Examples 157–161 and Comparative Examples 65–67.

Flexibilizer: Kraton G-1652 (a polystyrene/polybutadiene/polystyrene terminal block copolymer produced by Shell Kagaku K.K.).

The compositions in the following Examples and Comparative Examples were prepared by kneading starting compounds with each other in a pressure kneader. Specimens were prepared as follows.

At the outset, an 8-mesh pass powder was provided from the composition prepared by kneading, transferred to a press mold, subjected to compression molding at 200° C. under a pressure of 80 kg/cm$^2$ for 20 min. and further subjected to aftercuring at 200° C. for 8 hrs.

The compositions thus produced were subjected to evaluation of properties as follows.

Glass transition point: This property was determined with a thermomechanical analyzer (produced by Shinku Riko Inc.)

Flexural strength: This property was determined in accordance with the method specified in Japanese Industrial Standards (JIS) K-6911.

Flexural modulus: This property was determined in accordance with the method specified in Japanese Industrial Standards (JIS) K-6911.

Water absorption ratio: This property was determined in accordance with the method specified in Japanese Industrial Standards (JIS) K-6911.

Moisture resistance: This property was determined by evaluating the extent of the failure of a given sample, which had preliminarily been subjected to a PTC (pressure cooker test) treatment (125° C./2.3 atm), by the use of an aluminum-wired model device (see FIG. 9). In this test, the resistance across aluminum electrodes in the device was measured.

Package crack: This property was determined such that an 84-pin QFP (quad flat package) was molded and the It can be seen from Table 30 that the addition of a polystyrene/butadiene/polystyrene terminal block copolymer contributes to an improvement in the flexibility of the cured product and that good results can be obtained when the amount of addition of the copolymer is 5 to 80 parts. It can also be seen that the use of a polyallylphenol as the curing agent can provide a resin composition having an excellent hydrophobicity.

In FIG. 34, the device was evaluated as defective when even one defective circuit was found in 100 circuits as a population parameter, and the percentage occurrence of defective device was determined and expressed as the fraction defective (%) (the same shall apply hereinafter).

Examples 167 to 171 and Comparative Examples 70 and 71

In the Examples and Comparative Examples, use was made of the following starting materials.

Epoxy resin having a naphthalene skeleton:

EPICLON EXA-4300 produced by Dainippon Ink and Chemicals, Inc.

Polyallylphenol: the same as described in Examples 157–161 and Comparative Examples 65–67.

Flexibilizer: JSR 57P (an ethylene/propylene-based terpolymer produced by Nippon Gosei Gomu K.K.).

The compositions in the Examples and Comparative Examples were prepared by kneading starting compounds with each other in a pressure kneader. Specimens were prepared as follows.

At the outset, an 8-mesh pass powder was provided from the composition prepared by kneading, transferred to a press mold, subjected to compression molding at 200° C. under a pressure of 80 kg/cm$^2$ for 20 min. and further subjected to aftercuring at 200° C. for 8 hr.

The compositions thus produced were subjected to evaluation of properties; glass transition point, flexural strength, flexural modulus, water absorption ratio, moisture resistance, and package crack, as in Examples 162–166 and Comparative Examples 68 and 69.

Figure 35:
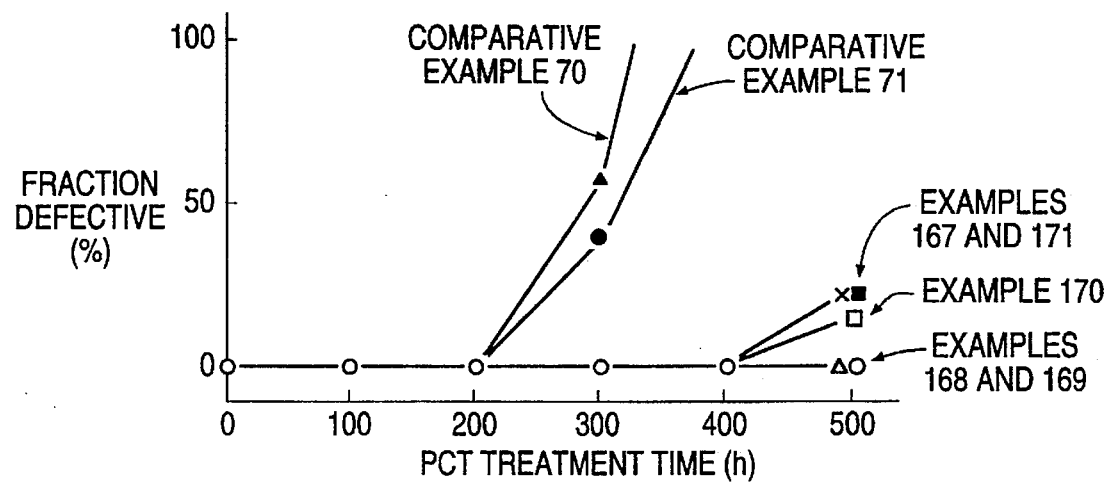
FIG. 35 is a graph showing the relationship between the PCT time (hr) and the fraction defective (%)

The results are given in Table 31 and FIG. 35.

TABLE 31

|  |  | Ex. 167 | Ex. 168 | Ex. 169 | Ex. 170 | Ex. 171 | Comp. Ex. 70 | Comp. Ex. 71 |
|---|---|---|---|---|---|---|---|---|
| Compo- | naphthalene epoxy resin | 100 | 100 | 100 | 100 | 100 | 100 | 100 |
| sition | polyallylphenol | 70 | 70 | 70 | 70 | 70 | 70 | 70 |
| (parts) | terpolymer | 5 | 20 | 40 | 60 | 80 | 2 | 90 |
| Glass transition temperature (°C.) | | 195 | 190 | 186 | 178 | 175 | 195 | 140 |
| Flexural strength | 25° C. | 10 | 9 | 8 | 7 | 6 | 10 | 5 |
| (kg/mm$^2$) | 250° C. | 8 | 7 | 5 | 5 | 4 | 8 | 1 |
| Flexural modulus (kg/mm$^2$) | | 620 | 600 | 580 | 540 | 495 | 630 | 420 |
| Water absorption ratio (%) | | 0.25 | 0.27 | 0.30 | 0.34 | 0.38 | 0.25 | 0.60 |
| Package crack | | O | O | O | O | O | X | X |

It can be seen from Table 31 that the addition of an ethylene/propylene-based terpolymer contributes to an improvement in the flexibility of the cured product and that good results can be obtained when the amount of addition of the terpolymer is 5 to 80 parts. It can be seen from FIG. 35 that the use of a polyallylphenol as the curing agent can provide a resin composition having an excellent hydrophobicity. Further, the addition of a polyphenol can provide an epoxy resin composition having a good curability.

Examples 172 to 176 and Comparative Examples 72 and 73

In the Examples and Comparative Examples, use was made of the following starting materials.

Epoxy resin having a naphthalene skeleton:

EPICLON EXA-4300 produced by Dainippon Ink and Chemicals, Inc.
Polyallylphenol: the same as in Examples 157–161 and Comparative Examples 65–67.
Flexibilizer: "Tafmer P P-0280" (an ethylene/α-olefin copolymer produced by Mitsui Sekiyu Kagaku K.K.).

The compositions in the Examples and Comparative Examples were prepared by kneading starting compounds with each other in a pressure kneader. Specimens were prepared as follows.

At the outset, an 8-mesh powder was provided from the composition prepared by kneading, transferred to a press mold, subjected to compression molding at 200° C. under a pressure of 80 kg/cm$^2$ for 20 min. and further subjected to aftercuring at 200° C. for 8 hr.

The compositions thus produced were subjected to evaluation of properties as described in Examples 162–166 and Comparative Examples 68 and 69.

Figure 36:
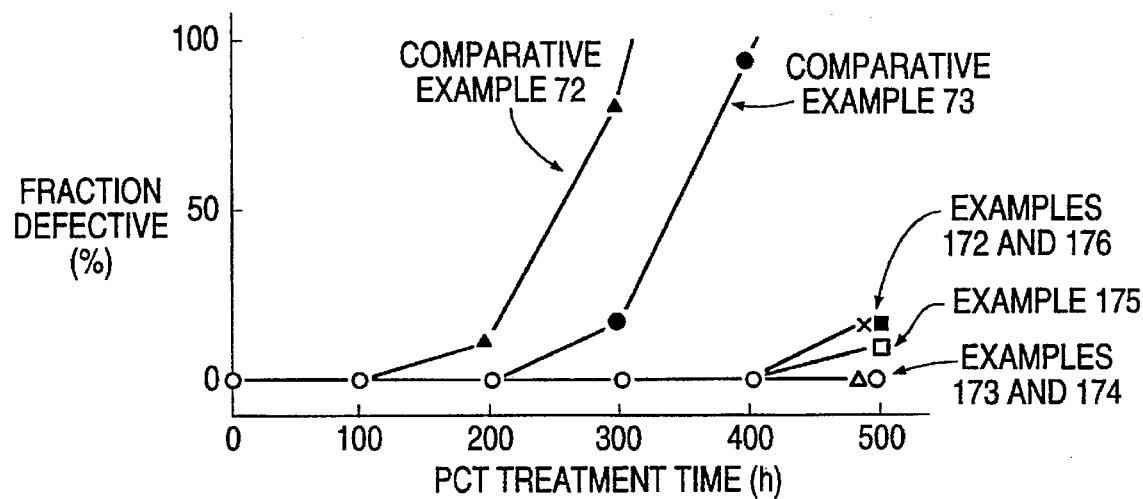
FIG. 36 is a graph showing the relationship between the PCT time (hr) and the fraction defective (%)

The results are given in Table 32 and FIG. 36.

It can be seen from Table 32 that the addition of an ethylene/α-olefin copolymer contributes to an improvement in the flexibility of the cured product and that good results can be obtained when the amount of addition of the copolymer is 5 to 80 parts. It can be seen from FIG. 36 that the use of a polyallylphenol as the curing agent can provide a resin composition having an excellent hydrophobicity.

Examples 177 to 181 and Comparative Examples 74 and 75

In the Examples and Comparative Examples, use was made of the following starting materials.

Epoxy resin having a naphthalene skeleton:

EPICLON EXA-4300 produced by Dainippon Ink and Chemicals, Inc.
Polyallylphenol: the same as in Examples 157–161 and Comparative Examples 65–67.
Flexibilizer: Torayfil E 601 (an epoxy-group-containing silicone rubber powder produced by Toray-Dow Corning K.K.).

The compositions in the Examples and Comparative Examples were prepared by kneading starting compounds with each other in a pressure kneader. Specimens were prepared as follows.

At the outset, an 8-mesh pass powder was provided from the composition prepared by kneading, transferred to a press mold, subjected to compression molding at 200° C. under a pressure of 80 kg/cm$^2$ for 20 min. and further subjected to aftercuring at 200° C. for 8 hr.

The compositions thus produced were subjected to evaluation of properties as described in Examples 162–166 and Comparative Examples 68 and 69.

Figure 37:
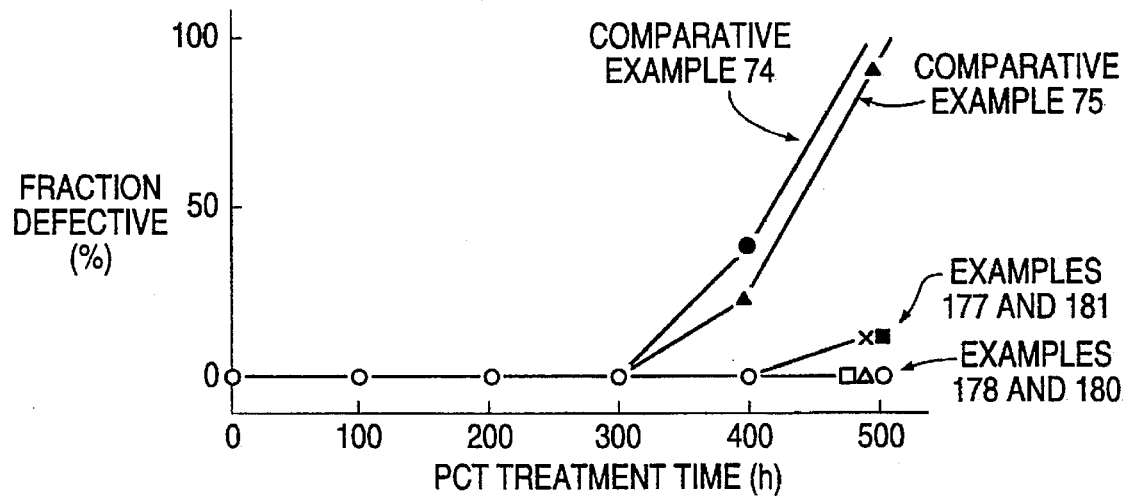
FIG. 37 is a graph showing the relationship between the PCT time (hr) and the fraction defective (%)

The results are given in Table 33 and FIG. 37.

TABLE 32

|  |  | Ex. 172 | Ex. 173 | Ex. 174 | Ex. 175 | Ex. 176 | Comp. Ex. 72 | Comp. Ex. 73 |
|---|---|---|---|---|---|---|---|---|
| Compo- | naphthalene epoxy resin | 100 | 100 | 100 | 100 | 100 | 100 | 100 |
| sition | polyallylphenol | 70 | 70 | 70 | 70 | 70 | 70 | 70 |
| (parts) | α-olefin copolymer | 5 | 20 | 40 | 60 | 80 | 2 | 90 |
| Glass transition temperature (°C.) | | 195 | 190 | 185 | 178 | 175 | 185 | 125 |
| Flexural strength | 25° C. | 10 | 10 | 8 | 7 | 7 | 10 | 5 |
| (kg/mm$^2$) | 250° C. | 8 | 7 | 6 | 5 | 4 | 8 | 1 |
| Flexural modulus (kg/mm$^2$) | | 617 | 600 | 580 | 565 | 500 | 620 | 450 |
| Water absorption ratio (%) | | 0.30 | 0.33 | 0.37 | 0.42 | 0.45 | 0.30 | 0.70 |
| Package crack | | O | O | O | O | O | X | X |

TABLE 33

|  |  | Ex. 177 | Ex. 178 | Ex. 179 | Ex. 180 | Ex. 181 | Comp. Ex. 74 | Comp. Ex. 75 |
|---|---|---|---|---|---|---|---|---|
| Compo- | naphthalene epoxy resin | 100 | 100 | 100 | 100 | 100 | 100 | 100 |
| sition | polyallylphenol | 70 | 70 | 70 | 70 | 70 | 70 | 70 |
| (parts) | silicone powder | 5 | 20 | 40 | 60 | 80 | 2 | 90 |
| Glass transition temperature (°C.) | | 195 | 190 | 184 | 180 | 175 | 195 | 165 |
| Flexural strength 25° C. | | 11 | 10 | 10 | 9 | 8 | 11 | 5 |
| (kg/mm$^2$) 250° C. | | 8 | 8 | 7 | 7 | 6 | 8 | 2 |
| Flexural modulus (kg/mm$^2$) | | 610 | 585 | 555 | 520 | 440 | 615 | 410 |
| Water absorption ratio (%) | | 0.24 | 0.25 | 0.29 | 0.32 | 0.38 | 0.25 | 0.45 |
| Package crack | | O | O | O | O | O | X | X |

It can be seen from Table 33 that the addition of an epoxy-group-containing silicone powder contributes to an improvement in the flexibility of the cured product and that good results can be obtained when the amount of addition of the silicone powder is 5 to 80 parts. It can be seen from FIG. 37 that the use of polyallylphenol as the curing agent can provide a resin composition having an excellent hydrophobicity. Further, the addition of a polyphenol can provide an epoxy resin composition having a good curability.

Examples 182 to 186 and Comparative Examples 76 and 77

In the Examples and Comparative Examples, use was made of the following starting materials.

Epoxy resin having a naphthalene skeleton:

EPICLON EXA-4300 produced by Dainippon Ink and Chemicals, Inc.

Polyallylphenol: the same as in Examples 157–161 and Comparative Examples 65–67.

Flexibilizer: SIN-260 (silicone-modified epoxy resin produced by Dainippon Ink and Chemicals, Inc.)

The compositions in the Examples and Comparative Examples were prepared by kneading starting compounds with each other in a pressure kneader. Specimens were prepared as follows.

At the outset, an 8-mesh pass powder was provided from the composition prepared by kneading, transferred to a press mold, subjected to compression molding at 200° C. under a pressure of 80 kg/cm$^2$ for 20 min. and further subjected to aftercuring at 200° C. for 8 hr.

The compositions thus produced were subjected to evaluation of properties as described in Examples 162–166 and Comparative Examples 68 and 69.

Figure 38:
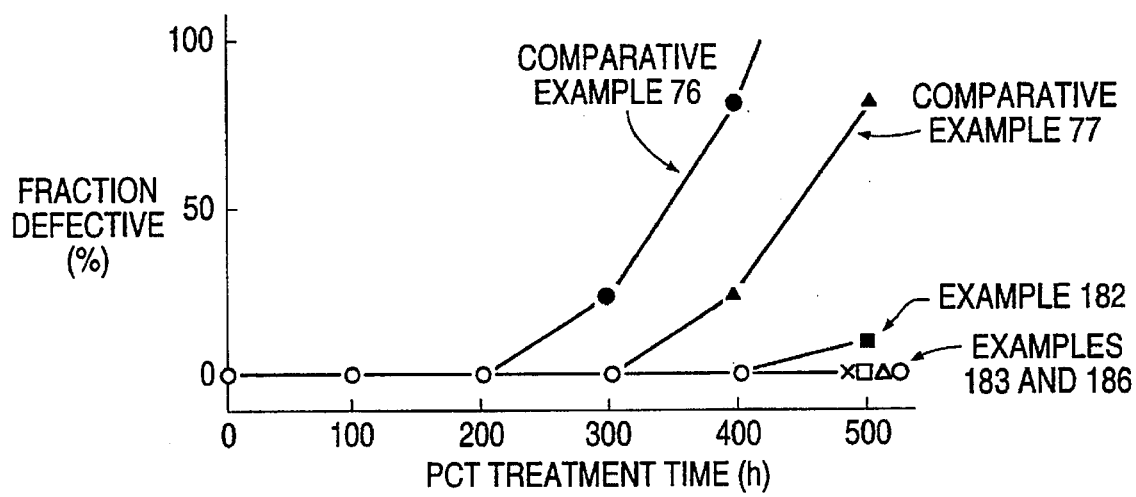
FIG. 38 is a graph showing the relationship between the PCT time (hr) and the fraction defective (%)

The results are given in Table 34 and FIG. 38.

It can be seen from Table 34 that the addition of a silicone-modified epoxy resin contributes to an improvement in the flexibility of the cured produce and that good results can be obtained when the amount of addition of the resin is 5 to 80 parts. It can be seen from FIG. 38 that the use of a polyallylphenol as the curing agent can provide a resin composition having an excellent hydrophobicity.

Examples 187 to 191 and Comparative Examples 78 and 79

In the Examples and Comparative Examples, use was made of the following starting materials.

Epoxy resin having a naphthalene skeleton:

EPICLON EXA-4300 produced by Dainippon Ink and Chemicals, Inc.

Polyallylphenol: the same as in Examples 157–161 and Comparative Examples 65–67.

Flexibilizer: CTBN 1008 (a butadiene/acrylonitrile copolymer produced by Ube Industries, Ltd.)

The compositions in the Examples and Comparative Examples were prepared by kneading starting compounds with each other in a pressure kneader. Specimens were prepared as follows.

At the outset, an 8-mesh pass powder was provided from the composition prepared by kneading, transferred to a press mold, subjected to compression molding at 200° C. under a pressure of 80 kg/cm$^2$ for 20 min. and further subjected to aftercuring at 200° C. for 8 hr.

The compositions thus produced were subjected to evaluation of properties as described in Examples 162–166 and Comparative Examples 68 and 69.

Figure 39:
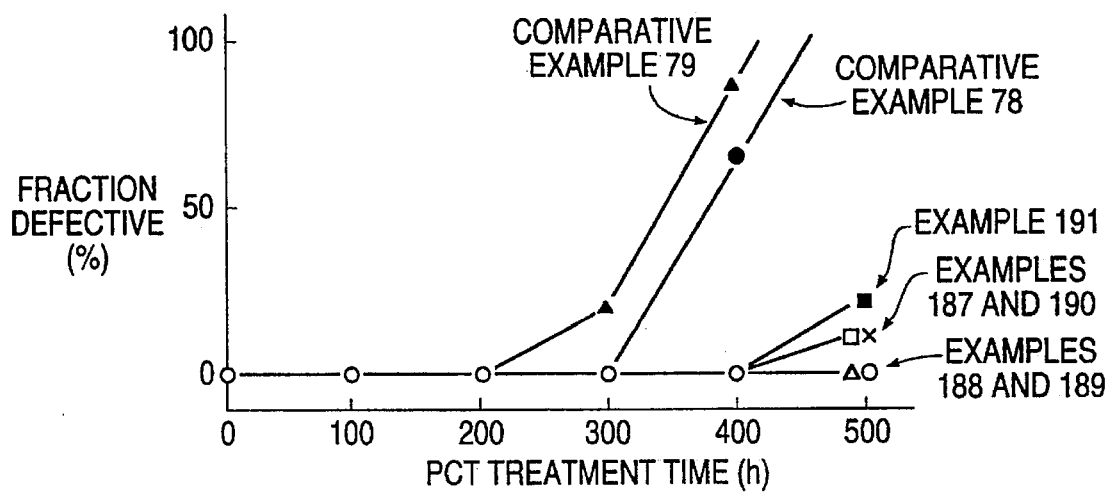
FIG. 39 is a graph showing the relationship between the PCT time (hr) and the fraction defective (%)

The results are given in Table 35 and FIG. 39.

TABLE 34

|  |  | Ex. 182 | Ex. 183 | Ex. 184 | Ex. 185 | Ex. 186 | Comp. Ex. 76 | Comp. Ex. 77 |
|---|---|---|---|---|---|---|---|---|
| Compo- | naphthalene epoxy resin | 100 | 100 | 100 | 100 | 100 | 100 | 100 |
| sition | polyallylphenol | 70 | 70 | 70 | 70 | 70 | 70 | 70 |
| (parts) | silicone-modified epoxy resin | 5 | 20 | 40 | 60 | 80 | 2 | 90 |
| Glass transition temperature (°C.) | | 193 | 187 | 183 | 178 | 175 | 190 | 160 |
| Flexural strength 25° C. | | 10 | 10 | 9 | 8 | 7 | 10 | 5 |
| (kg/mm$^2$) 250° C. | | 8 | 8 | 7 | 7 | 5 | 8 | 1 |
| Flexural modulus (kg/mm$^2$) | | 615 | 600 | 585 | 535 | 495 | 620 | 430 |
| Water absorption ratio (%) | | 0.25 | 0.28 | 0.30 | 0.30 | 0.35 | 0.25 | 0.45 |
| Package crack | | O | O | O | O | O | X | X |

TABLE 35

|  |  | Ex. 187 | Ex. 188 | Ex. 189 | Ex. 190 | Ex. 191 | Comp. Ex. 78 | Comp. Ex. 79 |
|---|---|---|---|---|---|---|---|---|
| Compo- | naphthalene epoxy resin | 100 | 100 | 100 | 100 | 100 | 100 | 100 |
| sition | polyallylphenol | 70 | 70 | 70 | 70 | 70 | 70 | 30 |
| (parts) | CTBN | 5 | 20 | 40 | 60 | 80 | 2 | 90 |
| Glass transition temperature (°C.) | | 192 | 185 | 180 | 178 | 173 | 195 | 155 |
| Flexural strength | 25° C. | 10 | 10 | 9 | 8 | 8 | 10 | 4 |
| (kg/mm$^2$) | 250° C. | 8 | 8 | 7 | 7 | 4 | 8 | 1 |
| Flexural modulus (kg/mm$^2$) | | 625 | 600 | 580 | 540 | 480 | 625 | 400 |
| Water absorption ratio (%) | | 0.27 | 0.30 | 0.32 | 0.35 | 0.40 | 0.25 | 0.60 |
| Package crack | | ◯ | ◯ | ◯ | ◯ | ◯ | X | X |

It can be seen from Table 35 that the addition of a butadiene/acrylonitrile copolymer contributes to an improvement in the flexibility of the cured product and that good results can be obtained when the amount of addition of the copolymer is 5 to 80 parts. It can be seen from FIG. 39 that the use of a polyallylphenol as the curing agent can provide a resin composition having an excellent hydrophobicity.

Examples 192 to 196 and Comparative Examples 80 and 81

In the Examples and Comparative Examples, use was made of the following starting materials.

Epoxy resin having a naphthalene skeleton:
EPICLON EXA-4300 produced by Dainippon Ink and Chemicals, Inc.
Polyallylphenol: the same as in Examples 1–5 and Comparative Examples 65–67.
Flexibilizer: RD-8 (an inorganic silica (silica) manufactured by Tatsumori Ltd.)

The compositions in the Examples and Comparative Examples were prepared by kneading starting compounds with each other in a pressure kneader. Specimens were prepared as follows.

At the outset, an 8-mesh pass powder was provided from the composition prepared by kneading, transferred to a press mold, subjected to compression molding at 200° C. under a pressure of 80 kg/cm$^2$ for 20 min. and further subjected to aftercuring at 200° C. for 8 hr.

The compositions thus produced were subjected to evaluation of properties as described in Examples 162–166 and Comparative Examples 68 and 69.

Further, viscosity was determined by a method using a flow tester.

The results are given in Table 36 and FIG. 40.

It can be seen from Table 36 that the addition of an inorganic filler contributes to an improvement in the mechanical strength of the cured product and that good results can be obtained when the amount of addition of the inorganic filler is 30 to 95%. It can be seen from FIG. 40 that the use of a polyallylphenol as the curing agent can provide a resin composition having an excellent hydrophobicity.

As described above, in the present invention, a resin composition having excellent heat resistance, moisture resistance, toughness, flexibility and crack resistance can be provided by using an epoxy resin having a naphthalene skeleton as a substratal resin, a particular polyallyphenol as a curing agent, and further adding a particular flexibilizer. Further, the addition of an inorganic filler can provide a resin composition having an excellent mechanical strength.

Examples of the epoxy resins having a biphenyl skeletal structure in the present invention include polymers of 4,4'-bis(2,3-epoxypropoxy)biphenyl; 4,4'-bis(2,3-epoxypropoxy)-3,3',5,5'-tetramethylbiphenyl; 4,4'-bis(2,3-epoxypropoxy)-3,3',5,5'-tetramethyl-2-cholorbiphenyl; 4,4'-bis(2,3-epoxypropoxy)-3,3',5,5'-tetramethyl-2-bromobiphenyl; 4,4'-bis(2,3-epoxypropoxy)-3,3',5,5'-tetraethylbiphenyl and 4,4'-bis(2,3-epoxypropoxy)-3,3',5,5'-tetrabutylbiphenyl. The biphenyl skeletal structure of such resins can be represented by the following general formula (XXI) (refer Japanese Unexamined Patent Publication (Koaki) No. 63-251419)

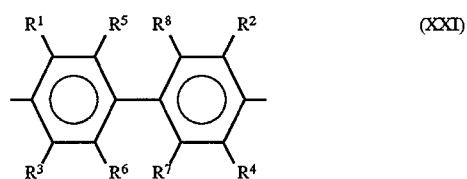

(XXI)

wherein each of $R^1$ to $R^8$ represents hydrogen or a $C_1$ to $C_4$ lower alkyl group or a halogen atom.

TABLE 36

|  |  | Ex. 192 | Ex. 193 | Ex. 194 | Ex. 195 | Ex. 196 | Comp. Ex. 80 | Comp. Ex. 81 |
|---|---|---|---|---|---|---|---|---|
| Compo- | naphthalene epoxy resin | 100 | 100 | 100 | 100 | 100 | 100 | 100 |
| sition | polyallylphenol | 70 | 70 | 70 | 70 | 70 | 70 | 70 |
| (parts) | silica (%) | 30 | 40 | 60 | 70 | 95 | 10 | 98 |
| Glass transition temperature (°C.) | | 200 | 200 | 200 | 200 | 200 | 200 | 200 |
| Flexural strength | 25° C. | 13 | 14 | 15 | 17 | 18 | 10 | 15 |
| (kg/mm$^2$) | 250° C. | 11 | 12 | 14 | 15 | 15 | 8 | 10 |
| Flexural modulus (kg/mm$^2$) | | 820 | 980 | 1200 | 1450 | 1700 | 670 | 2000 |
| Water absorption ratio (%) | | 0.23 | 0.20 | 0.18 | 0.14 | 0.13 | 0.25 | 0.10 |
| Package crack | | ◯ | ◯ | ◯ | ◯ | ◯ | X | X |
| Viscosity (P) | | 80 | 100 | 150 | 200 | 350 | 80 | 2000 |

Preferred examples of $R^1$ to $R^8$ include a hydrogen atom, a methyl group, an ethyl group, a propyl group, a butyl group, a chlorine atom and a bromine atom.

The hydrophobic property, heat resistance and toughness can be improved by the use of the epoxy resin having a biphenyl skeletal structure as the base resin. Since such resins are crystalline and have a low viscosity at the time of melting, the flow property can be improved during transfer molding.

Polyallylphenol that is used as the curing agent in the epoxy resin composition according to the present invention is represented by the formula XXII and preferably, by the formula XXIII or XXIV

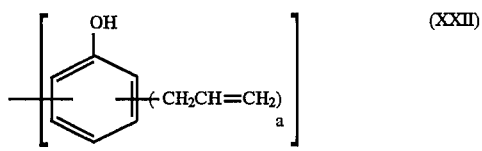

wherein a is an integer of 1 to 4;

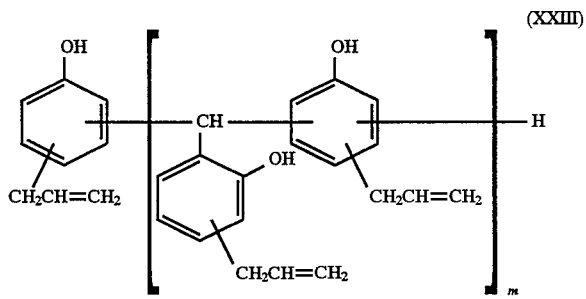

where m is an integer of 1 to 4;

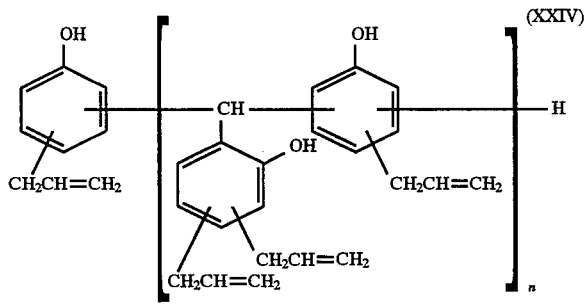

wherein n is an integer of 1 to 4.

The greater the values m and n in the formulas given above, the greater becomes the viscosity, so that the resin can be solidified and a working factor during dry blend becomes high. At the same time, the heat resistance can be improved, too. Such a polyallylphenol can be easily synthesized with a known method. Generally, m and n are 1 to 4 and preferably, within the range of 1 to 3.

When polyallylphenol is used as the curing agent, the glass transition temperature of the cured product can be improved to 180° C. to 220° C., and the hydrophobic property can be improved, too. These effects are brought forth by the allyl group contained in polyallylphenol. Generally, this polyallyphenol is blended in such an amount that the hydroxyl group of polyallyphenol is equivalent to the epoxy group of the epoxy resin in the resin composition, but depending on the case, this amount may be greater or smaller by 5 to 20 parts by weight than the equivalent as the boundary. When polyallylphenol is blended in excess, the allyl group in the composition increases and for this reason, the hydrophobic property can be improved. When it is blended in a smaller amount, the unreacted epoxy resin improved adhesion (for example, adhesion between a Si chip and a molding resin in semiconductor molding) and improves reliability of the device.

It has been found out that the epoxy resin of the formula (1) that is added in the present invention is effective for simultaneously improving curability, mold releasability, mechanical strength and heat resistance, in particular. Mold releasability necessary at the time of molding is affected by the degree of progress of a reaction system, that is, by the hardness. In other words, when the molded article is uncured, its adhesion with the mold is great and the molded article is difficult to release from the mold. Particularly, the reactivity of the tetramethylbiphenyl type epoxy resin is low, and the apparent reaction rate of the system becomes high as a whole due to the addition of the epoxy resin of the formula (1). Accordingly, during transfer molding, the primary curing reaction proceeds between a specific epoxy and polyallylphenol, and a desired hardness can be obtained within a short time. A part of the unreacted biphenyl type epoxy resin is completely cured by post-cure. It has high compatibility with the epoxy resin having the biphenyl skeletal structure and with polyallyphenol, and voids are unlikely to occur in the cured product.

The epoxy resin represented by the formula (1) described above can be used in various blend amounts in the epoxy resin composition in accordance with a desired addition effect. Though this blend amount can generally be changed over a broad range, it is generally preferably from about 10 to about 120 parts by weight on the basis of 100 parts by weight of the base resin. As will be explained in detail in the later-appearing Examples of this invention, a desired effect of the addition cannot be obtained if the blend amount is less than 10 parts by weight, and if the blend amount exceeds 120 parts by weight, toughness of the cured product gets deteriorated due to the brittle property of the cured product and at the same time, hydrophobicity drops. More preferably, the blend amount is within the range of 20 to 80 parts by weight.

To impart flexibility and toughness to the cured product, the following flexibility imparting agents may be added in the present invention, whenever necessary:

1) polystyrene/polybutadiene/polystyrene terminated block copolymers
2) ethylene/propylene type terpolymers
3) ethylene/α-olefin copolymer
4) silicone rubber characterized by containing an epoxy resin as a functional group
5) silicone modified epoxy resin, and
6) butadiene acrylonitrile.

The flexibility imparting agents described above can assume various structures. As a matter of fact, they are commercially available on the market in various forms. For example, the polystyrene/polybutadiene/polystyrene terminated block copolymer is available as "Crayton G-1652" (a product of Shell Chemical), the ethylene/propylene type rubber is available as "JSR 57P" (a product of Nippon Gosei Bomu K.K.), the ethylene/α-olefin copolymer is available as "Toughmer P P-0280" (a product of Mitsui Petrochemical Co.), the silicone rubber powder characterized by containing an epoxy resin as a functional group is available as "Torayfil E601" (a product of Toray Dow-Corning), the silicone modified epoxy resin is available as "SIN-620" (a product of Dai-Nippon Ink Kagaku K.K.), and butadiene acrylonitrile is available as "Hycar CTBN 1300" (a product of Ube Kosan K.K.). A product expressed by the following formula is also available as the butadiene/acrylonitrile copolymer.

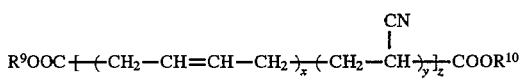

In the formula given above, each of $R^3$ and $R^{10}$ represents a substituted or unsubstituted hydrocarbon such as an alkyl group or an aryl group, x and y each is a positive integer satisfying the relation $1 \leq x/y \leq 20$, and z is an integer of 5 to 20.

Preferably, 5 to 80 parts by weight of each of these compounds is added on the basis of 100 parts by weight of the epoxy resin as the principal component in the epoxy resin composition. If the amount is less than 5 parts, the effect of addition does not appear and if it exceeds 80 parts, layer separation develops and moisture resistance drops. Preferably, the amount of addition of the silicone modified epoxy resin is from 5 to 200 parts by weight, and when it is added, mold releasability from the mold at the time of molding can be improved without substantially lowering hydrophobicity and moisture resistance.

Preferably, the amount of addition of a powdery inorganic filler such as molten silica, crystalline silica, alumina, calcium carbonate, etc., is within the range of 20 to 95 wt %. For, if the amount is smaller than 20 wt %, the effect of addition does not appear and if it is greater than 95 wt %, the working factor might drop due to the drop in flowability. The form of the inorganic filler may be either amorphous or spherical, and their mixture can also be used.

The melt viscosity of the epoxy resin having the biphenyl skeletal structure as the base resin and polyallylphenol, is extremely low, and this makes it possible to charge the filler in a high density. On the other hand, the melt viscosity of the specific epoxy resin represented by the formula (1) is low, too, and the increase of viscosity due to the addition hardly occurs. Accordingly, charging of up to 95 wt %, that has been difficult according to the prior art, has now become possible.

Further, the following components can be added to the composition of the present invention, whenever necessary:

(1) A curing promoter for promoting the curing reaction between the epoxy resin, the curing agent and the curing assistant:

Examples of the curing promoters include an imidazole type curing promoter such as 2-methylimidazole, a phosphine type curing promoter such as triphenylphosphine, a DBU (diazabicycloundecene) type curing promoter such as a phenol salt of DBU, and so forth.

(2) A coupling agent for improving compatibility with the resin when an inorganic filler is added:

Examples include a silane type coupling agent such as 3-aminopropyltriethoxysilane, or a titanium type coupling agent such as tetraoctylbis(phosphite) titanate. Preferably, the amount of addition of the coupling agent is from 0.1 to 15 parts, though this amount varies with the kind, amount and specific surface area of the inorganic filler used and with the minimum covering area of the coupling agent.

(3) It is possible to add carnauba wax, stearic acid and its metallic salt, montan wax, etc., as a mold releasing assistant, a brominated epoxy resin, antimony trioxide, etc., as a flame-retardant, and carbon black as a pigment.

The resin composition according to the present invention can be prepared by heating the components described above at about 60° to about 120° C. by using such means as a roll, a kneader, an extruder, or the like. In the present invention, after-cure is preferably carried out after molding in order to complete the curing reaction of the unreacted epoxy resin, etc., in the cured product. After-cure after molding may be effected by heat-treatment inside a thermostat having substantially the same temperature as the temperature during molding, for a predetermined time.

In the epoxy resin composition according to the present invention, polyallylphenol as the curing agent so functions as to effectively improve the heat resistance and hydrophobicity of the cured product in the epoxy resin used as the base resin, and the addition of the specific epoxy resin of the formula (1) can accomplish the improvement of curability. The polystyrene/polybutadiene/polystyrene terminate block copolymer, the ethylene/propylene type rubber, the ethylene/α-olefin copolymer, the silicone rubber powder characterized by containing the epoxy group as a functional group, the specific silicone modified epoxy resin or butadiene acrylonitrile as the flexibility imparting agent operates effectively as the crack resistance improving agent and the mold releasability improving agent. As a result, the improvement in flexibility, toughness, mold releasability and crack resistance can simultaneously be accomplished. Furthermore, when the inorganic filler is added, the mechanical strength, too, can be improved.

Next, the present invention will be explained in further detail with reference to the following non-limitative Examples and Comparative Examples.

Examples 197 to 202 and Comparative Examples 82 and 83

These Examples and Comparative Examples used the following starting materials:

biphenyl type epoxy resin
  Yuka-Shell epoxy YX-4000 having the chemical structure expressed by the following formula; epoxy equivalent=195

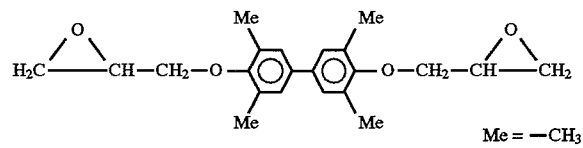

polyallylphenol
  Mitsubishi Yuka Sh-150AR having the chemical structure expressed by the formula (5); hydroxyl equivalent=155
epoxy resin
  Yuka-Shell epoxy E1032H60 having the chemical structure expressed by the formula (1); epoxy equivalent=166
curing promoter (triphenylphosphine)
  K. I. Kasei PP-360, having the chemical structure expressed by the following formula:

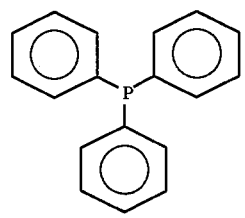

The composition illustrated in Examples and Comparative Examples were prepared by kneading the starting materials by a press kneader. By the way, the amounts of the epoxy and hydroxyl groups associated with the curing reaction were set to be equivalent to each other. Each testpiece was prepared in the following way.

First of all, the composition obtained by kneading was converted to powder of 8-mesh pass, and this powder was tableted. After transfer molding at 180° C. and 40 kg/cm² for 5 minutes, the resulting molded article was after-cured at 180° C. for 5 hours.

Characteristic of each of the compositions obtained in this way were evaluated in the following way.

- glass transition temperature: measured by thermo-mechanical analyzer (a product of Shinku Riko)
- flexural strength: JIS K6911
- flexural elastic modulus: JIS K6911
- water absorption ratio: JIS K6911
- gel time: Curing time on a hot plate (180° C.) was measured.
- package crack: An 84-pin QFP was molded, was subjected to hygroscopic treatment at 121° C./100% RH/24 hours, and was then dipped into solder at 260° C., and occurrence of cracks was examined.

As can be understood from Examples 197 to 202 and Comparative Examples 82 and 83, the resin compositions having excellent curability could be obtained without lowering heat resistance and hydrophobicity by using polyallylphenol as the curing agent and by adding the specific epoxy resin. It was also found out that the amounts of addition was preferably 10 to 200 parts by weight on the basis of 100 parts of the base resin.

at 180° C. and 40 kg/cm² for 5 minutes. The resulting molded article was after-cured at 180° C. for 5 hours.

The characteristics of the resulting compositions were evaluated in the following way:

- glass transition temperature:
    measured by thermo-mechanical analyzer (a product of Shinku Riko)
- flexural strength: JIS K6911
- flexural elastic modulus: JIS K6911
- water absorption ratio: JIS K6911
- gel time: Curing time on a hot place (180° C.) was measured.
- package crack: An 84-pin QFP was molded, was subjected to hygroscopic treatment at 121° C./100% FJ/24 hours, and was then dipped into solder at 260° C., and occurrence of cracks was examined.

It could be understood from Examples 203 to 206 and Comparative Examples 84 and 85 that characteristics were hardly affected even when the blend amount of polyallylphenol was increased and decreased within the range of ±20 parts with respect to the value at which the epoxy group and the phenolic hydroxyl group were equivalent, but when the blend amount exceeded 20 parts, layer separation and inferior curing occurred, and the characteristics dropped.

TABLE 37

|  |  | Example |  |  |  |  |  | Comparative Example |  |
|---|---|---|---|---|---|---|---|---|---|
|  |  | 197 | 198 | 199 | 200 | 201 | 202 | 82 | 83 |
| Composition (part) | biphenyl epoxy resin | 100 | 100 | 100 | 100 | 100 | 100 | 100 | 100 |
|  | polyallylphenol | 89 | 98 | 117 | 154 | 173 | 192 | 84 | 201 |
|  | specific epoxy resin | 10 | 20 | 40 | 80 | 100 | 120 | 5 | 130 |
|  | curing promoter | 2 | 2 | 2 | 2 | 2 | 2 | 2 | 2 |
| glass transition temp. (°C.) |  | 190 | 195 | 205 | 220 | 230 | 235 | 180 | 240 |
| flexural strength | 25° C. | 6 | 7 | 7 | 8 | 9 | 7 | 5 | 6 |
|  | 250° C. | 5 | 6 | 6 | 6 | 7 | 5 | 2 | 3 |
| water absorption ratio (%) |  | 0.30 | 0.30 | 0.31 | 0.31 | 0.33 | 0.34 | 0.28 | 0.38 |
| gel time (s) |  | 70 | 65 | 60 | 50 | 45 | 35 | 80 | 30 |
| package crack |  | x | x | x | x | x | x | x | x |

Examples 203 to 206 and Comparative Examples 84 and 85

These Examples and Comparative Examples used the following starting materials.

biphenyl type epoxy resin
    Yuka-Shell epoxy YX-4000
polyallylphenol
    Mitsubishi Yuka SH-150AR
epoxy resin
    Yuka-Shell epoxy E1032H60
curing promoter (triphenylphosphine)
    K. I. Kasei PP-360

The compositions illustrated in Examples and Comparative Examples were prepared by kneading the starting materials by a press kneader. Each testpiece was prepared in the following way.

First, each of the resulting compositions obtained by kneading was converted to powder of 8-mesh pass, and after this powder was tableted, transfer molding was carried out

TABLE 38

|  |  | Example |  |  |  | Comparative Example |  |
|---|---|---|---|---|---|---|---|
|  |  | 203 | 204 | 205 | 206 | 84 | 85 |
| Composition (part) | biphenyl type epoxy resin | 100 | 100 | 100 | 100 | 100 | 100 |
|  | polyallylphenol | 97 | 107 | 127 | 137 | 87 | 137 |
|  | specific epoxy resin | 40 | 40 | 40 | 40 | 40 | 47 |
|  | curing promoter | 2 | 2 | 2 | 2 | 2 | 2 |
| glass transition temp. (°C.) |  | 190 | 198 | 207 | 200 | 180 | 170 |
| flexural strength (kg/mm²) | 25° C. | 6 | 7 | 7 | 7 | 5 | 4 |
|  | 250° C. | 5 | 5 | 6 | 5 | 3 | 2 |
| water absorption ratio (%) |  | 0.33 | 0.32 | 0.30 | 0.30 | 0.35 | 0.34 |
| gel time (s) |  | 68 | 65 | 55 | 67 | 75 | 70 |
| package crack |  | x | x | x | x | x | x |

Examples 207 to 211 and Comparative Examples 86 and 87

These Examples and Comparative Examples used the following starting materials.

biphenyl type epoxy resin
  Yuka-Shell epoxy YX-4000
polyallylphenol
  Mitsubishi Yuka SH-150AR
epoxy resin
  Yuka-Shell epoxy E1032H60
polystyrene/polybutadiene/polystyrene terminate block copolymer
  Crenton G-1652 (a product of Shell Chemical)
curing promoter (triphenylphosphine)
  K. I. Kasei PP-360

The compositions illustrated in these Examples and Comparative Examples were prepared by kneading the starting materials by a press kneader, respectively. Each testpiece was prepared in the following way.

First, each of the resulting compositions obtained by kneading was converted to powder of 8-mesh pass, and after this powder was tableted, transfer molding was carried out at 180° C. and 40 kg/cm² for 5 minutes. The resulting molded article was after-cured at 180° C. for 5 hours.

The characteristics of the resulting compositions were evaluated in the following way.

glass transition temperature:
  measured by thermo-mechanical analyzer (a product of Shinku Riko)
flexural strength: JIS K6911
flexural elastic modulus: JIS K6911
water absorption ratio: JIS K6911
gel time: Curing time on a hot place (180° C.) was measured.
package crack: An 84-pin QFP was molded, was subjected to hygroscopic treatment at 121° C./100% RH/24 hours, and was then dipped into solder at 260° C., and occurrence of cracks was examined.

It could be understood from Examples 207 to 211 and Comparative Examples 86 and 87 that flexibility of the cured product could be improved by adding the polystyrene/polybutadiene/polystyrene terminated block copolymer, the amount of addition was from 5 to 80 parts, the resin compositions having excellent hydrophobicity could be obtained by using polyallylphenol as the curing agent, and the resin composition having excellent curability could be obtained by adding the specific epoxy resin.

Examples 212 to 216 and Comparative Examples 88 and 89

These Examples and Comparative Examples used the following starting materials.

biphenyl type epoxy resin
  Yuka-Shell epoxy YX-4000
polyallylphenol
  Mitsubishi Yuka SH-150AR
epoxy resin
  Yuka-Shell epoxy E1032H60
ethylene/propylene type terpolymer
  JSR 57P (a product of Nippon Gosei Gomu)
curing promoter (triphenylphosphine)
  K. I. Kasei PP-360

The compositions illustrated in these Examples and Comparative Examples were prepared by kneading the starting materials by a press kneader. Each testpiece was produced in the following way.

First, each of the resulting compositions obtained by kneading was converted to powder of 8-mesh pass, and after this powder was tableted, transfer molding was carried out at 180° C. and 40 kg/cm² for 5 minutes. The resulting molded article was after-cured at 180° C. for 5 hours.

The characteristics of the resulting compositions were evaluated in the following way.

glass transition temperature:
  measured by thermo-mechanical analyzer (a product of Shinku Riko)
flexural strength: JIS K6911
flexural elastic modulus: JIS K6911
water absorption ratio: JIS K6911
gel time: Curing time on a hot place (180° C.) was measured.
package crack: An 84-pin QFP was molded, was subjected to hygroscopic treatment at 121° C./100% RH/24 hours, and was then dipped into solder at 260° C., and occurrence of cracks was examined.

It could be understood from Examples 212 to 216 and Comparative Examples 88 and 89 that flexibility of the cured product could be improved by adding the ethylene/propylene type terpolymer, the amount of addition was preferably from 5 to 80 parts, the resin compositions having excellent hydrophobicity could be obtained by using polyallylphenol as the curing agent, and the resin composition

TABLE 39

| | | Example | | | | | Comparative Example | |
|---|---|---|---|---|---|---|---|---|
| | | 207 | 208 | 209 | 210 | 211 | 86 | 87 |
| Composition (part) | biphenyl type epoxy resin | 100 | 100 | 100 | 100 | 100 | 100 | 100 |
| | polyallylphenol | 117 | 117 | 117 | 117 | 117 | 117 | 117 |
| | specific epoxy resin | 40 | 40 | 40 | 40 | 40 | 40 | 40 |
| | terminal block copolymer | 5 | 20 | 40 | 60 | 80 | 2 | 90 |
| | curing promoter | 2 | 2 | 2 | 2 | 2 | 2 | 2 |
| glass transition temp. (°C.) | | 205 | 200 | 195 | 190 | 183 | 205 | 160 |
| flexural strength 25° C. (kg/mm²) | | 7 | 8 | 9 | 8 | 6 | 7 | 4 |
| 250° C. | | 5 | 6 | 7 | 7 | 5 | 5 | 2 |
| flexural elastic modulus (kg/mm²) | | 700 | 670 | 630 | 580 | 550 | 720 | 500 |
| water absorption ratio (%) | | 0.31 | 0.32 | 0.35 | 0.37 | 0.38 | 0.30 | 0.40 |
| gel time (s) | | 60 | 60 | 60 | 60 | 60 | 60 | 60 |
| package crack | | o | o | o | o | o | x | x | having excellent curability could be obtained by adding the specific epoxy resin.

TABLE 40

|  |  | Example | | | | | Comparative Example | |
|---|---|---|---|---|---|---|---|---|
|  |  | 212 | 213 | 214 | 215 | 216 | 88 | 89 |
| Composition (part) | biphenyl type epoxy resin | 100 | 100 | 100 | 100 | 100 | 100 | 100 |
|  | polyallylphenol | 117 | 117 | 117 | 117 | 117 | 117 | 117 |
|  | specific epoxy resin | 40 | 40 | 40 | 40 | 40 | 40 | 40 |
|  | terpolymer | 5 | 20 | 40 | 60 | 80 | 2 | 90 |
|  | curing promoter | 2 | 2 | 2 | 2 | 2 | 2 | 2 |
| glass transition temp. (°C.) | | 205 | 203 | 198 | 195 | 188 | 205 | 163 |
| flexural strength (kg/mm$^2$) | 25° C. | 7 | 9 | 9 | 8 | 6 | 7 | 5 |
|  | 250° C. | 6 | 6 | 7 | 6 | 4 | 5 | 2 |
| flexural elastic modulus (kg/mm$^2$) | | 705 | 680 | 625 | 570 | 545 | 720 | 510 |
| water absorption ratio (%) | | 0.32 | 0.35 | 0.36 | 0.38 | 0.38 | 0.30 | 0.50 |
| gel time (s) | | 60 | 60 | 60 | 60 | 60 | 60 | 60 |
| package crack | | o | o | o | o | o | x | x |

Examples 217 to 221 and Comparative Examples 90 and 91

These Examples and Comparative Examples used the following starting materials.

biphenyl type epoxy resin
  Yuka-Shell epoxy YX-4000
polyallylphenol
  Mitsubishi Yuka SH-150AR
epoxy resin
  Yuka-Shell epoxy E1032H60
ethylene/α-olefin copolymer
  Toughmer-P P-0280 (a product of Mitsui Petrochemical)
curing promoter (triphenylphosphine)
  K. I. Kasei PP-360

The compositions of these Examples and Comparative Examples were prepared by kneading the starting materials by a press kneader. Each testpiece was prepared in the following way.

First, each of the resulting compositions obtained by kneading was converted to powder of 8-mesh pass, and after this powder was tableted, transfer molding was carried out at 180° C. and 40 kg/cm$^2$ for 5 minutes. The resulting molded article was after-cured at 180° C. for 5 hours.

The characteristics of the resulting compositions were evaluated in the following way.

glass transition temperature:
  measured by thermo-mechanical analyzer (a product of Shinku Riko)
flexural strength: JIS K6911
flexural elastic modulus: JIS K6911
gel time: Curing time on a hot place (180° C.) was measured.
water absorption ratio: JIS K6911
package crack: An 84-pin QFP was molded, was subjected to hygroscopic treatment at 121° C./100% RH/24 hours, and was then dipped into solder at 260° C., and occurrence of cracks was examined.

It could be understood from Examples 217 to 221 and Comparative Examples 90 and 90 that flexibility of the cured product could be improved by adding the ethylene/α-olefin copolymer, the amount of addition was preferably from 5 to 80 parts, and the resin composition having excellent hydrophobicity could be obtained by adding polyallylphenol as the curing agent. Further, the epoxy resin composition having excellent curability could be obtained by adding the specific epoxy resin.

TABLE 41

|  |  | Example | | | | | Comparative Example | |
|---|---|---|---|---|---|---|---|---|
|  |  | 217 | 218 | 219 | 220 | 221 | 90 | 91 |
| Composition (part) | biphenyl type epoxy resin | 100 | 100 | 100 | 100 | 100 | 100 | 100 |
|  | polyallylphenol | 117 | 117 | 117 | 117 | 117 | 117 | 117 |
|  | specific epoxy resin | 40 | 40 | 40 | 40 | 40 | 40 | 40 |
|  | α-olefin copolymer | 5 | 20 | 40 | 60 | 80 | 2 | 90 |
|  | curing promoter | 2 | 2 | 2 | 2 | 2 | 2 | 2 |
| glass transition temp. (°C.) | | 205 | 200 | 198 | 193 | 185 | 205 | 150 |
| flexural strength (kg/mm$^2$) | 25° C. | 8 | 9 | 8 | 7 | 6 | 7 | 5 |
|  | 250° C. | 6 | 7 | 6 | 5 | 4 | 4 | 2 |
| flexural elastic modulus (kg/mm$^2$) | | 703 | 692 | 630 | 580 | 560 | 720 | 520 |
| water absorption ratio (%) | | 0.32 | 0.35 | 0.37 | 0.38 | 0.40 | 0.32 | 0.51 |
| gel time (s) | | 60 | 60 | 60 | 60 | 60 | 60 | 60 |
| package crack | | o | o | o | o | o | x | x |

Examples 222 to 226 and Comparative Examples 92 and 93

These Examples and Comparative Examples used the following starting materials.

biphenyl type epoxy resin
  Yuka-Shell epoxy YX-4000
polyallylphenol
  Mitsubishi Yuka SH-150AR
epoxy resin
  Yuka-Shell epoxy E1032H60
epoxy-containing silicone powder
  Torayfil E-601 (Toray Dow Corning)
curing promoter (triphenylphosphine)
  K. I. Kasei PP-360

The compositions of these Examples and Comparative Examples were prepared by kneading the starting materials by a press kneader. Each testpiece was prepared in the following way.

First, each of the resulting compositions obtained by kneading was converted to powder of 8-mesh pass, and after this powder was tableted, transfer molding was carried out at 180° C. and 40 kg/cm$^2$ for 5 minutes. The resulting molded article was after-cured at 180° C. for 5 hours.

The characteristics of the resulting compositions were evaluated in the following way.

glass transition temperature:
  measured by thermo-mechanical analyzer (a product of Shinku Riko)
flexural strength: JIS K6911
flexural elastic modulus: JIS K6911 gel time: Curing time on a hot place (180° C.) was measured.

water absorption ratio: JIS K6911 package crack: An 84-pin QFP was molded, was subjected to hygroscopic treatment at 121° C./100% RH/24 hours, and was then dipped into solder at 260° C., and occurrence of cracks was examined.

It could be understood from Examples 222 to 226 and Comparative Examples 92 and 93 that flexibility of the cured product could be improved by adding the ethylene/α-olefin copolymer, the amount of addition was preferably from 5 to 80 parts, and the resin composition having excellent hydrophobicity could be obtained by adding polyallylphenol as the curing agent. Further, the epoxy resin composition having excellent curability could be obtained by adding the specific epoxy resin.

TABLE 42

|  |  | Example |  |  |  |  | Comparative Example |  |
|---|---|---|---|---|---|---|---|---|
|  |  | 222 | 223 | 224 | 225 | 226 | 92 | 93 |
| Composition (part) | biphenyl type epoxy resin | 100 | 100 | 100 | 100 | 100 | 100 | 100 |
|  | polyallylphenol | 117 | 117 | 117 | 117 | 117 | 117 | 117 |
|  | specific epoxy resin | 40 | 40 | 40 | 40 | 40 | 40 | 40 |
|  | silicone powder | 5 | 20 | 40 | 60 | 80 | 2 | 90 |
|  | curing promoter | 2 | 2 | 2 | 2 | 2 | 2 | 2 |
| glass transition temp. (°C.) |  | 210 | 213 | 207 | 200 | 198 | 207 | 175 |
| flexural strength (kg/mm$^2$) | 25° C. | 9 | 9 | 11 | 10 | 8 | 8 | 5 |
|  | 250° C. | 7 | 8 | 8 | 7 | 6 | 5 | 3 |
| flexural elastic modulus (kg/mm$^2$) |  | 700 | 690 | 670 | 620 | 570 | 715 | 530 |
| water absorption ratio (%) |  | 0.32 | 0.31 | 0.31 | 0.32 | 0.32 | 0.32 | 0.45 |
| gel time (s) |  | 60 | 60 | 60 | 60 | 60 | 60 | 60 |
| package crack |  | o | o | o | o | o | x | x |

Examples 227 to 233 and Comparative Examples 94 and 95

These Examples and Comparative Examples used the following starting materials.

biphenyl type epoxy resin
  Yuka-Shell epoxy YX-4000
polyallylphenol
  Mitsubishi Yuka SH-150AR
epoxy resin
  Yuka-Shell epoxy E1032H60
silicone modified epoxy resin
  SIN-620 (a product of Dai-Nippon Ink Chemicals), epoxy equivalent=252
curing promoter (triphenylphosphine)
  K. I. Kasei PP-360

The compositions illustrated in these Examples and Comparative Examples were prepared by kneading the starting materials by a press kneader. The epoxy group and the hydroxyl group were set to be equivalent to each other. Each testpiece was prepared in the following way.

First, each of the resulting compositions obtained by kneading was converted to powder of 8-mesh pass, and after this powder was tableted, transfer molding was carried out at 180° C. and 40 kg/cm$^2$ for 5 minutes. The resulting molded article was after-cured at 180° C. for 5 hours.

The characteristics of the resulting compositions were evaluated in the following way.

glass transition temperature:
  measured by thermo-mechanical analyzer (a product of Shinku Riko)

flexural strength: JIS K6911 flexural elastic modulus: JIS K6911 gel time: Curing time on a hot place (180° C.) was measured.

water absorption ratio: JIS K6911 package crack: An 84-pin QFP was molded, was subjected to hygroscopic treatment at 121° C./100% RH/24 hours, and was then dipped into solder at 260° C., and occurrence of cracks was examined.

mold releasability: The relation between the number of times of molding and bonding power when a molded article was released from the mold, when molding was carried out repeatedly using a chromium plated mold, was examined.

The results in the Examples of the present invention and in Comparative Examples are tabulated in Table 43.

It could be understood from Examples 227 to 233 and Comparative Examples 94 and 95 that toughness, flexibility and mold releasability of the cured product could be improved by adding the silicone modified epoxy resin, the amount of addition was preferably from 5 to 200 parts, and the resin composition having excellent hydrophobicity could be obtained by using polyallylphenol as the curing agent. The epoxy resin composition having excellent curability could also be obtained by adding the specific epoxy resin.

TABLE 43

|  |  | Example |  |  |  |  |  |  | Comparative Example |  |
|---|---|---|---|---|---|---|---|---|---|---|
|  |  | 227 | 228 | 229 | 230 | 231 | 232 | 233 | 94 | 95 |
| Composition (part) | biphenyl type epoxy resin | 100 | 100 | 100 | 100 | 100 | 100 | 100 | 100 | 100 |
|  | polyallylphenol | 120 | 135 | 154 | 172 | 198 | 215 | 240 | 118 | 246 |
|  | specific epoxy resin | 40 | 40 | 40 | 40 | 40 | 40 | 40 | 40 | 40 |
|  | silicone modified epoxy resin | 5 | 30 | 60 | 90 | 130 | 160 | 200 | 2 | 210 |
|  | curing promoter | 2 | 2 | 2 | 2 | 2 | 2 | 2 | 2 | 2 |
| glass transition temp. (°C.) |  | 208 | 205 | 207 | 205 | 200 | 195 | 190 | 203 | 180 |
| flexural strength (kg/mm$^2$) | 25° C. | 8 | 8 | 9 | 10 | 10 | 9 | 8 | 8 | 7 |
|  | 250° C. | 6 | 6 | 7 | 8 | 7 | 7 | 6 | 6 | 4 |
| flexural elastic modulus (kg/mm$^2$) |  | 702 | 685 | 670 | 630 | 560 | 505 | 500 | 705 | 495 |

TABLE 43-continued

|  | Example | | | | | | | Comparative Example | |
|---|---|---|---|---|---|---|---|---|---|
|  | 227 | 228 | 229 | 230 | 231 | 232 | 233 | 94 | 95 |
| water absorption ratio (%) | 0.31 | 0.30 | 0.29 | 0.28 | 0.29 | 0.29 | 0.31 | 0.31 | 0.37 |
| mold releasability once | 20 | 20 | 17 | 15 | 10 | 9 | 8 | 25 | 6 |
| (kg/cm$^2$)  5 times | 6 | 4 | 3 | 2 | 1 | 1 | 0 | 10 | 0 |
| gel time (s) | 55 | 53 | 51 | 50 | 50 | 45 | 42 | 55 | 42 |
| package crack | o | o | o | o | o | o | o | x | x |

Examples 234 to 238 and Comparative Examples 96 and 97

These Examples and Comparative Examples used the following starting materials.

biphenyl type epoxy resin
  Yuka-Shell epoxy YX-4000
polyallylphenol
  Mitsubishi Yuka SH-150AR
epoxy resin
  Yuka-Shell epoxy E1032H60
butadiene acrylonitrile
  Hycar CTBN1300 (a product of Ube Kosan)
curing promoter (triphenylphosphine)
  K. I. Kasei PP-360

The compositions illustrated in these Examples and Comparative Examples were prepared by kneading the starting materials by a press kneader, respectively. Each testpiece was prepared in the following way.

First, each of the resulting compositions obtained by kneading was converted to powder of 8-mesh pass, and after this powder was tableted, transfer molding was carried out at 180° C. and 40 kg/cm$^2$ for 5 minutes. The resulting molded article was after-cured at 180° C. for 5 hours.

The characteristics of the resulting compositions were evaluated in the following way.

glass transition temperature:
  measured by thermo-mechanical analyzer (a product of Shinku Riko)

flexural strength: JIS K6911 flexural elastic modulus: JIS K6911 gel time: Curing time on a hot place (180° C.) was measured.

water absorption ratio: JIS K6911 package crack: An 84-pin QFP was molded, was subjected to hygroscopic treatment at 121° C./100% RH/24 hours, and was then dipped into solder at 260° C., and occurrence of cracks was examined.

The results in the Examples of the present invention and in Comparative Examples are tabulated in Table 44.

It could be understood from Examples 234 to 238 and Comparative Examples 96 and 97 that toughness and flexibility of the cured product could be improved by adding the butadiene acrylonitrile, the amount of addition was preferably from 5 to 80 parts, and the resin composition having excellent hydrophobicity could be obtained by using polyallylphenol as the curing agent. Further, the epoxy resin composition having excellent curability could be obtained by adding the specific epoxy resin.

TABLE 44

|  |  | Example | | | | | Comparative Example | |
|---|---|---|---|---|---|---|---|---|
|  |  | 234 | 235 | 236 | 237 | 238 | 96 | 97 |
| Composition (part) | biphenyl type epoxy resin | 100 | 100 | 100 | 100 | 100 | 100 | 100 |
|  | polyallylphenol | 117 | 117 | 117 | 117 | 117 | 117 | 117 |
|  | specific epoxy resin | 40 | 40 | 40 | 40 | 40 | 40 | 40 |
|  | CTBN | 5 | 20 | 40 | 60 | 80 | 2 | 90 |
|  | curing promoter | 2 | 2 | 2 | 2 | 2 | 2 | 2 |
| glass transition temp. (°C.) | | 207 | 205 | 198 | 190 | 183 | 205 | 160 |
| flexural strength (kg/mm$^2$) | 25° C. | 9 | 9 | 10 | 9 | 8 | 6 | 4 |
|  | 250° C. | 7 | 8 | 8 | 7 | 5 | 4 | 1 |
| flexural elastic modulus (kg/mm$^2$) | | 705 | 690 | 620 | 580 | 530 | 705 | 520 |
| water absorption ratio (%) | | 0.32 | 0.34 | 0.37 | 0.38 | 0.38 | 0.32 | 0.40 |
| gel time (s) | | 60 | 60 | 60 | 60 | 60 | 60 | 60 |
| package crack | | o | o | o | o | o | x | x |

Examples 239 to 243 and Comparative Examples 98 and 99

These Examples and Comparative Examples used the following starting materials.

biphenyl type epoxy resin
  Yuka-Shell epoxy YX-4000
polyallylphenol
  Mitsubishi Yuka SH-150AR
epoxy resin
  Yuka-Shell epoxy E1032H60
inorganic filler (silica)
  RD-8 (a product of Tatsumori)
curing promoter (triphenylphosphine)
  K. I. Kasei PP-360

The compositions illustrated in these Examples and Comparative Examples were prepared by kneading the starting materials by a press kneader. Each testpiece was prepared in the following way.

First, each of the resulting compositions obtained by kneading was converted to powder of 8-mesh pass, and after this powder was tableted, transfer molding was carried out at 180° C. and 40 kg/cm$^2$ for 5 minutes. The resulting molded article was after-cured at 180° C. for 5 hours.

The characteristics of the resulting compositions were evaluated in the following way.

glass transition temperature:
  measured by thermo-mechanical analyzer (a product of Shinku Riko)

flexural strength: JIS K6911 flexural elastic modulus: JIS K6911 gel time: Curing time on a hot place (180° C.) was measured.

water absorption ratio: JIS K6911 package crack: An 84-pin QFP was molded, was subjected to hygroscopic treatment at 121° C./100% RH/24 hours, and was then dipped into solder at 260° C., and occurrence of cracks was examined.

viscosity: measured by flow tester process

It could be understood from Examples 239 to 243 and Comparative Examples 98 and 99 that the mechanical strength of the cured product could be improved by adding the inorganic filler, the amount of addition was preferably from 20 to 95%, and the resin composition having excellent hydrophobicity could be obtained by using polyallylphenol as the curing agent. Further, the epoxy resin composition having excellent curability could be obtained by adding the specific epoxy resin.

TABLE 45

|  |  | Example | | | | | Comparative Example | |
|---|---|---|---|---|---|---|---|---|
|  |  | 239 | 240 | 241 | 242 | 243 | 98 | 99 |
| Compo- | biphenyl type epoxy resin | 100 | 100 | 100 | 100 | 100 | 100 | 100 |
| sition | polyallylphenol | 117 | 117 | 117 | 117 | 117 | 117 | 117 |
| (parts) | specific epoxy resin | 40 | 40 | 40 | 40 | 40 | 40 | 40 |
|  | silica (wt %) | 30 | 40 | 60 | 80 | 95 | 10 | 97 |
|  | curing promoter | 2 | 2 | 2 | 2 | 2 | 2 | 2 |
| glass transition temp. (°C.) |  | 208 | 209 | 208 | 208 | 208 | 208 | 208 |
| flexural strength 25° C. |  | 16 | 16 | 18 | 19 | 19 | 9 | 17 |
| (kg/mm$^2$) 250° C. |  | 14 | 13 | 15 | 17 | 15 | 4 | 10 |
| flexural elastic modulus (kg/mm$^2$) |  | 980 | 1100 | 1400 | 1800 | 1960 | 700 | 2500 |
| water absorption ratio (%) |  | 0.28 | 0.25 | 0.23 | 0.19 | 0.15 | 0.35 | 0.23 |
| gel time (s) |  | 60 | 54 | 48 | 40 | 34 | 60 | 30 |
| package crack |  | o | o | o | o | o | x | x |
| viscosity (P) |  | 50 | 70 | 150 | 320 | 500 | 40 | 2000 |

According to the present invention, a resin composition having excellent heat-resistance, flexibility, toughness, crack resistance, hydrophobicity and curability can be obtained by using polyallylphenol as the curing agent for the epoxy resin as the base resin, by adding the specific epoxy resin, and further adding, whenever necessary, the specific flexibility imparting agent. Furthermore, a resin composition having excellent mechanical strength can be obtained by adding the inorganic filler.

INDUSTRIAL APPLICABILITY

This invention can be advantageously utilized for the production of a resin composition having an excellent heatproofing, toughness, flexibility, cracking resistance, mold releasability, and hydrophobicity.

We claim:

1. An epoxy resin composition comprising a biphenyl epoxy resin comprising structural units represented by the following general formula:

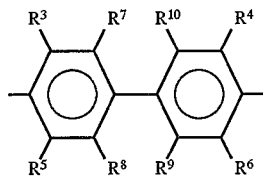

wherein $R^3$ to $R^{10}$ each stands for a hydrogen atom, a lower alkyl group of one to four carbon atoms, or a halogen atom, and, incorporated therein as a curing agent in an amount of 30 to 120 parts by weight based on 100 parts by weight of said biphenyl epoxy resin, at least one member selected from the group consisting of polyallyl phenols represented by the following formulae:

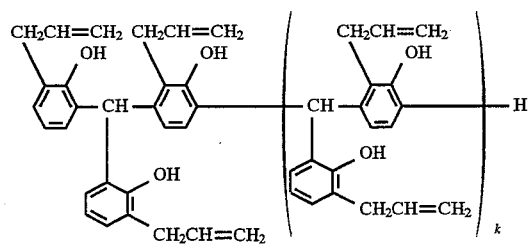

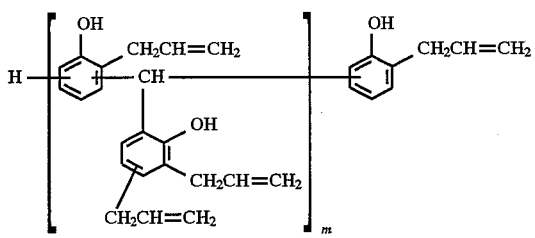

-continued

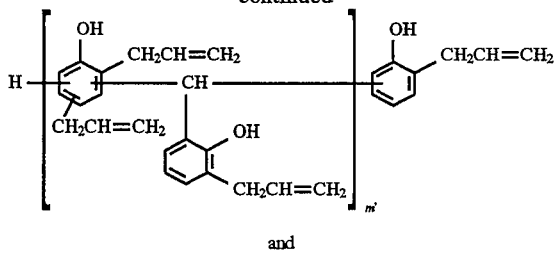

and

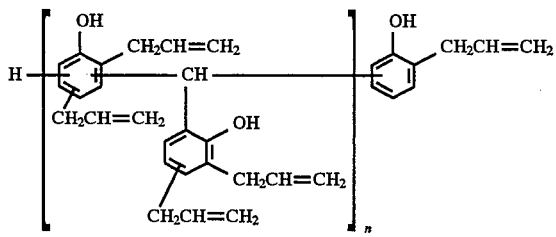

wherein k is 0 or an integer of 1 to 4 inclusive, and m, m' and n each is an integer of 1 to 4 inclusive.

2. A composition according to claim 1, wherein said biphenyl epoxy resin is selected from the group consisting of 4,4'-bis(2,3-epoxypropoxy)biphenyl; 4,4'-bis(2,3-epoxypropoxy)-3,3,5,5-tetramethylbiphenyl;4,4'-bis(2,3-epoxypropoxy)-3,3',5,5'-tetramethyl-2-chlorobiphenyl; 4,4'-bis(2,3-epoxypropoxy)-3,3',5,5'-tetramethyl-2-bromobiphenyl;4,4'-bis(2,3-epoxypropoxy)-3,3',5,5'-tetraethylbiphenyl; and 4,4'-bis(2,3-epoxypropoxy)-3,3',5,5'-tetrabutylbiphenyl.

3. A composition according to claim 1, wherein a flexibility-imparting agent selected from the group consisting of silicon-containing epoxy resin, butadiene/acrylonitrile copolymer, polystyrene/polybutadiene/polystrene terminal block copolymer, ethylene/propylene terpolymers, ethylene/α-olefin copolymers, and epoxy functional group-containing silicone rubber is incorporated in an amount of from 5 to 80 parts by weight, based on 100 parts by weight of said biphenyl epoxy resin.

4. A composition according to claim 1, wherein a flexibility-imparting agent is incorporated in an amount of from 5 to 80 parts by weight, based on 100 parts by weight of said biphenyl epoxy resin, said flexibility-imparting agent comprising a combination of a silicon-containing epoxy resin with at least one member selected from the group consisting of butadiene/acrylonitrile copolymers, polystyrene/polybutadiene/polystyrene terminal block copolymers, ethylene/propylene terpolymers, ethylene/α-olefin copolymers, and an epoxy functional group-containing silicone rubber.

5. A composition according to claim 1 which further contains as a filler an inorganic component in an amount of from 30 to 85% by weight, based on the total amount of the composition.

6. An epoxy resin composition comprising an epoxy resin, a polyallyl phenol represented by the following formula

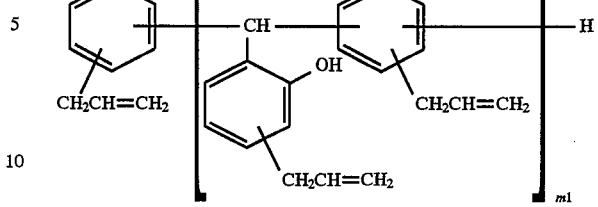

wherein m1 is an integer of 1 to 6, or the following formula

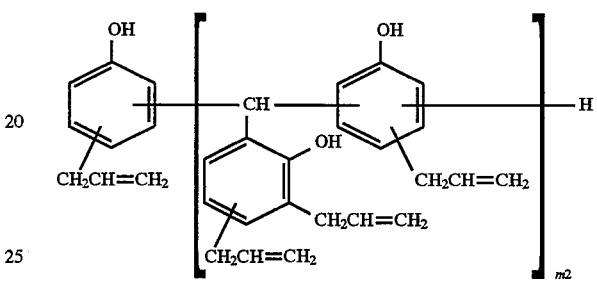

wherein m2 is an integer of 1 to 6, in an amount ranging from 5 to 200 parts by weight based on 100 parts by weight of the epoxy resin, and a polyphenol represented by the following formula

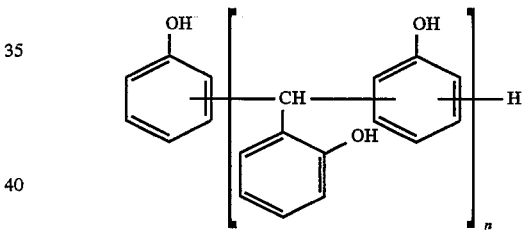

wherein n is an integer of 1 to 6, in an amount ranging from 5 to 200 parts by weight based on 100 parts by weight of the epoxy resin.

7. A composition according to claim 6, wherein the epoxy resin is a cresol novolak epoxy resin or a biphenyl epoxy resin.

8. A composition according to claim 6, further comprising as a flexibilizer at least one member selected from the group consisting of polystyrene/polybutadiene/polystyrene terminal block copolymers, ethylene/propylene copolymers, an epoxy functional group-containing silicone rubber, and silicon-containing epoxy resins, in an amount ranging from 5 to 80 parts by weight based on 100 parts by weight of the epoxy resin.

9. A composition according to claim 6, further comprising an inorganic filler in an amount ranging from 20 to 85% by weight based on the total weight of the composition.

10. A composition according to claim 7, wherein the biphenyl epoxy resin is represented by the following formula

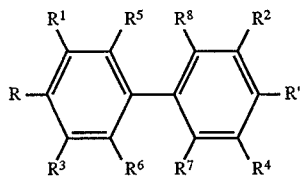

wherein R and R' each represents an epoxy functional group, and $R^1$ to $R^8$ each represents a lower alkyl group with 1 to 4 carbon atoms, or a halogen atom.

11. A composition according to claim 10, wherein said biphenyl epoxy resin is selected from the group consisting of 4,4'-bis(2,3-epoxypropoxy)biphenyl; 4,4'-bis(2,3-epoxypropoxy)-3,3',5,5'-tetramethylbiphenyl; 4,4'-bis(2,3-epoxypropoxy)-3,3',5,5'-tetramethyl-2-chlorobiphenyl; 4,4'-bis(2,3-epoxypropoxy)-3,3',5,5'-tetramethyl-2-bromobiphenyl; 4,4'-bis(2,3-epoxypropoxy)-3,3',5,5'-tetramethylbiphenyl; and 4,4'-bis(2,3-epoxypropoxy)-3,3',5,5'-tetrabutylbiphenyl.

12. An epoxy resin composition comprising 100 parts of an epoxy resin having a naphthalene skeleton and 30 to 120 parts of a polyallylphenol, based on 100 parts of said epoxy resin, having in its repeating unit a plurality of constitutive units represented by the following formula I:

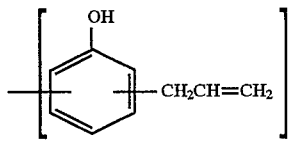

said polyallylphenol being represented by the following formula II:

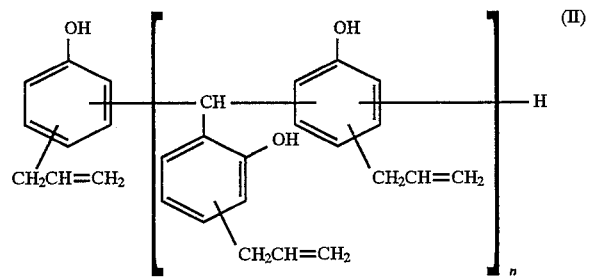

wherein n is an integer of 1 to 5, or by the following formula III:

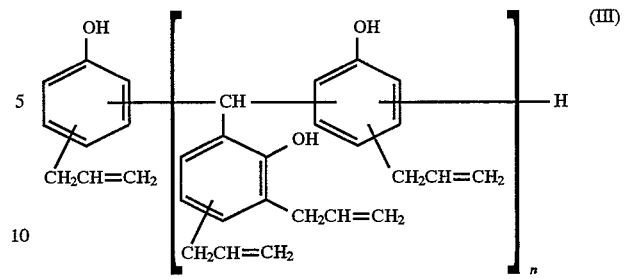

wherein n is an integer of 1 to 5, said epoxy resin having a naphthalene skeleton being an epoxy resin represented by the following formula IV:

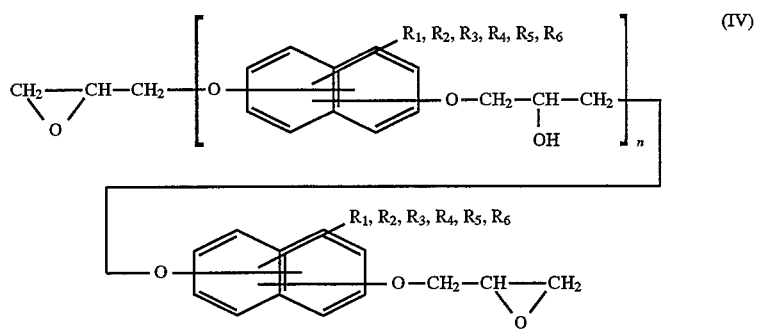

wherein $R_1$, $R_2$, $R_3$, $R_4$, $R_5$ and $R_6$ which may be the same or different each represents a hydrogen atom, a halogen atom or an alkyl group having 1 to 4 carbon atoms and n is 0 to 10, provided that at least one of $R_1$ to $R_6$ represents a halogen atom or an alkyl group having 1 to 4 carbon atoms, or an epoxy resin represented by the following formula V:

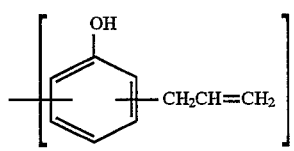

wherein n is 2 or 3.

13. An epoxy resin composition according to claim 12, which further comprises 30 to 95% by weight, based on the total weight of the epoxy resin composition, of an inorganic filler.

14. An epoxy resin composition comprising 100 parts by weight of an epoxy resin having a naphthalene skeleton, 30 to 120 parts by weight of a polyallylphenol, based on 100 parts of said epoxy resin, having in its repeating unit a plurality of constitutive units represented by the following formula I and 5 to 80 parts by weight of a flexibilizer, based on 100 parts of said epoxy resin:

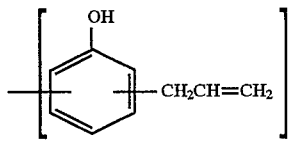

said polyallylphenol being represented by the following formula II:

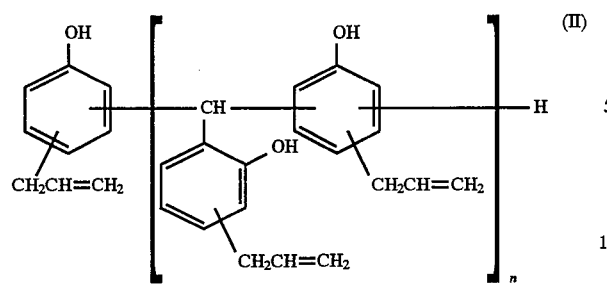

wherein n is an integer of 1 to 5, or by the following formula III:

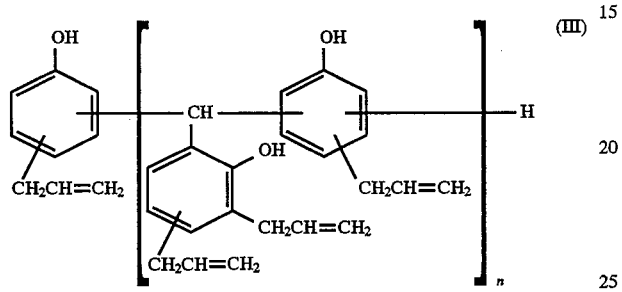

wherein n is an integer of 1 to 5, said epoxy resin having a naphthalene skeleton being an epoxy resin represented by the following formula IV:

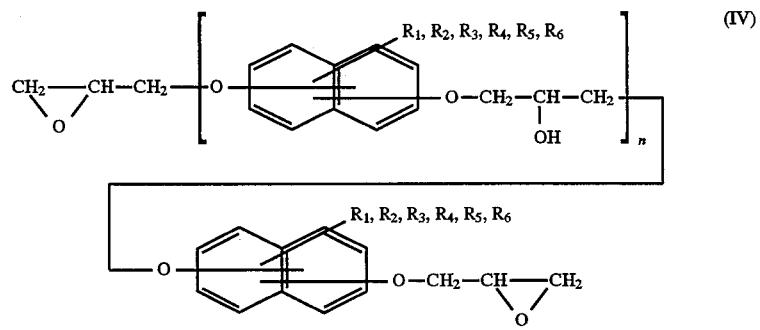

wherein $R_1$, $R_2$, $R_3$, $R_4$, $R_5$ and $R_6$ which may be the same or different each represents a hydrogen atom, a halogen atom or an alkyl group having 1 to 4 carbon atoms and n is 0 to 10, provided that at least one of $R_1$ to $R_6$ represents a halogen atom or an alkyl group having 1 to 4 carbon atoms, or an epoxy resin represented by the following formula (V):

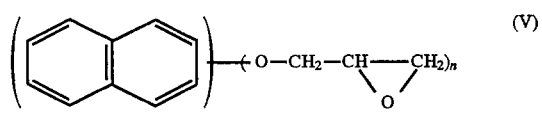

wherein n is 2 or 3.

15. An epoxy resin composition according to claim 14, which further comprises 30 to 95% by weight, based on the total weight of the epoxy resin composition, of an inorganic filler.

16. An epoxy resin composition according to claim 14, wherein said flexibilizer is a polystyrene/polybutadiene/polystyrene terminal block copolymer, ethylene/propylene-based terpolymer, ethylene/α-olefin copolymer, epoxy-group-containing silicone rubber, silicone-modified epoxy resin or butadiene/acrylonitrile copolymer.

17. An epoxy resin composition comprising a biphenyl epoxy resin comprising structural units represented by the following general formula:

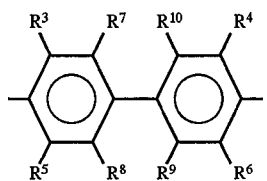

wherein $R^3$ to $R^{10}$ each stands for a hydrogen atom, a lower alkyl group of one to four carbon atoms, or a halogen atom as a base resin, 10 to 200 parts by weight per 100 parts by weight of the base resin of an epoxy resin represented by the following general formula 1, and a polyallyl phenol compound comprising a plurality of units represented by the following general formula 2 as a curing agent:

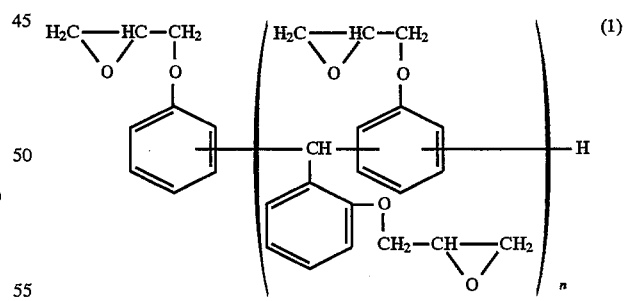

wherein n is an integer of 0 to 4;

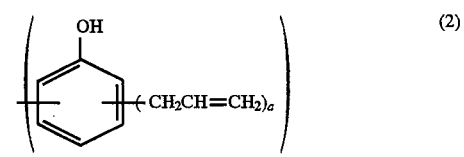

wherein a is an integer of 1 to 4.

18. An epoxy resin composition according to claim 17, wherein said polyallylphenol is represented by the following general formula 3

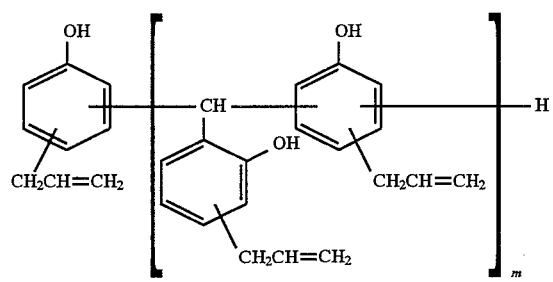
(3)
wherein m is an integer of 1 to 4.
19. An epoxy resin composition according to claim 17, wherein said polyallylphenol is represented by the following general formula 4
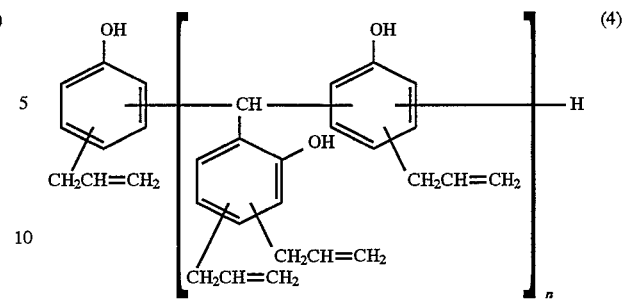
(4)
wherein n is an integer of 1 to 4.
* * * * *